US011527950B2

(12) United States Patent
Hall et al.

(10) Patent No.: US 11,527,950 B2
(45) Date of Patent: Dec. 13, 2022

(54) POWER SUPPLY SYSTEM FOR CONTROLLING LOAD DISTRIBUTION ACROSS MULTIPLE CONVERTERS FOR OPTIMIZING OVERALL EFFICIENCY

(71) Applicant: SEMICONDUCTOR COMPONENTS INDUSTRIES, LLC, Phoenix, AZ (US)

(72) Inventors: Jefferson W. Hall, Chandler, AZ (US); Ajay Karthik Hari, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 241 days.

(21) Appl. No.: 16/794,820

(22) Filed: Feb. 19, 2020

(65) Prior Publication Data
US 2020/0313539 A1 Oct. 1, 2020

Related U.S. Application Data

(63) Continuation-in-part of application No. 16/547,803, filed on Aug. 22, 2019, now Pat. No. 11,121,644.
(Continued)

(51) Int. Cl.
*H02M 1/10* (2006.01)
*H02M 1/42* (2007.01)
(Continued)

(52) U.S. Cl.
CPC ......... *H02M 1/4233* (2013.01); *H02M 1/083* (2013.01); *H02M 1/10* (2013.01);
(Continued)

(58) Field of Classification Search
CPC ............ H02M 1/0012; H02M 1/0035; H02M 1/0048; H02M 1/0058; H02M 1/007;
(Continued)

(56) References Cited

U.S. PATENT DOCUMENTS 6,304,473 B1  10/2001  Telefus et al.
6,611,130 B2   8/2003  Chang
(Continued)

FOREIGN PATENT DOCUMENTS

CN   103885392   *  6/2014   ............ Y02P 90/02
CN   110427262   * 11/2019   ............ G16B 30/00
(Continued)

OTHER PUBLICATIONS

Extended European Search Report for European Application No. 20161191.0, dated Jun. 8, 2020, 7 pages.
(Continued)

*Primary Examiner* — Matthew V Nguyen
(74) *Attorney, Agent, or Firm* — Brake Hughes Bellermann LLP

(57) ABSTRACT

According to an aspect, a power supply system includes a plurality of power converters configured to deliver a system load current to a load, where the system load current is a combination of individual load currents provided by the plurality of power converters, and a system performance controller configured to detect a value of the system load current. The system performance controller is configured to determine, using power loss information, values for the individual load currents such that a composite efficiency achieves a threshold condition. The system performance controller is configured to generate control signals to operate the plurality of power converters at the determined values.

21 Claims, 44 Drawing Sheets

Related U.S. Application Data

(60) Provisional application No. 62/854,527, filed on May 30, 2019, provisional application No. 62/823,441, filed on Mar. 25, 2019.

(51) Int. Cl.
  *H02M 1/08* (2006.01)
  *H03K 17/13* (2006.01)
  *H02M 1/00* (2006.01)
  *H02M 3/158* (2006.01)

(52) U.S. Cl.
  CPC ............ *H03K 17/13* (2013.01); *H02M 1/0012* (2021.05); *H02M 3/1584* (2013.01)

(58) Field of Classification Search
  CPC ...... H02M 1/083; H02M 1/10; H02M 1/4233; H02M 3/158; H02M 3/1584; H02M 3/335; H02M 7/4815; Y02B 70/10
  See application file for complete search history.

(56) References Cited

U.S. PATENT DOCUMENTS

| | | | |
|---|---|---|---|
| 7,002,265 B2 | 2/2006 | Potega | |
| 8,629,660 B2 | 1/2014 | Nalbant | |
| 9,118,260 B2 | 8/2015 | Gautier et al. | |
| 9,484,840 B2 | 11/2016 | Amirahmadi et al. | |
| 9,654,028 B1 | 5/2017 | Luo et al. | |
| 10,031,545 B1 | 7/2018 | Chae et al. | |
| 10,727,749 B1* | 7/2020 | Chen | H02M 3/1584 |
| 11,037,494 B1* | 6/2021 | Chang | G09G 3/3233 |
| 2002/0144164 A1 | 10/2002 | Chen | |
| 2008/0238380 A1 | 10/2008 | Jain | |
| 2009/0179619 A1 | 7/2009 | Houston | |
| 2010/0052426 A1 | 3/2010 | Carter et al. | |
| 2010/0149838 A1 | 6/2010 | Artusi et al. | |
| 2011/0160930 A1 | 6/2011 | Batten et al. | |
| 2013/0049712 A1* | 2/2013 | Ueno | H02M 3/1584 323/234 |
| 2013/0093251 A1 | 4/2013 | Kondo et al. | |
| 2013/0264969 A1 | 10/2013 | Hamond | |
| 2015/0069842 A1 | 3/2015 | Niu et al. | |
| 2015/0106638 A1 | 4/2015 | Sun et al. | |
| 2016/0233766 A1 | 8/2016 | Todorov et al. | |
| 2016/0239065 A1 | 8/2016 | Lee et al. | |
| 2016/0239074 A1 | 8/2016 | Lee et al. | |
| 2017/0077806 A1 | 3/2017 | Hong | |
| 2017/0117822 A1 | 4/2017 | Pahlevaninezhad et al. | |
| 2017/0217325 A1 | 8/2017 | Debaun et al. | |
| 2017/0222484 A1 | 8/2017 | Debaun et al. | |
| 2017/0302176 A1 | 10/2017 | Leong | |
| 2017/0338736 A1 | 11/2017 | Ofek | |
| 2019/0123255 A1 | 4/2019 | Chaput | |
| 2019/0207518 A1* | 7/2019 | Wu | H02M 1/08 |
| 2019/0252918 A1 | 8/2019 | Chen et al. | |
| 2019/0334442 A1* | 10/2019 | Iyasu | H02M 3/33507 |
| 2020/0391682 A1* | 12/2020 | Ganireddy | H02M 7/23 |

FOREIGN PATENT DOCUMENTS

| | | | | |
|---|---|---|---|---|
| EP | 1742322 A2 * | 1/2007 | | H02J 1/08 |
| WO | 2005101635 A1 | 10/2005 | | |
| WO | 2010149205 A1 | 12/2010 | | |
| WO | 2010151884 A2 | 12/2010 | | |
| WO | 2012007055 A1 | 1/2012 | | |

OTHER PUBLICATIONS

Extended European Search Report for European Application No. 20164796.3, dated Jul. 31, 2020, 10 pages.

NXP Semiconductors, "Totem-Pole Bridgeless PFC Design Using MC56F82748," Design Reference Manual, document No. DRM174, rev. 0, Nov. 2016.

Ajay Hari, et al., "High-Density Ac-Dc Power Supplies using Active-Clamp Flyback Topology," Aug. 2, 2018.

* cited by examiner

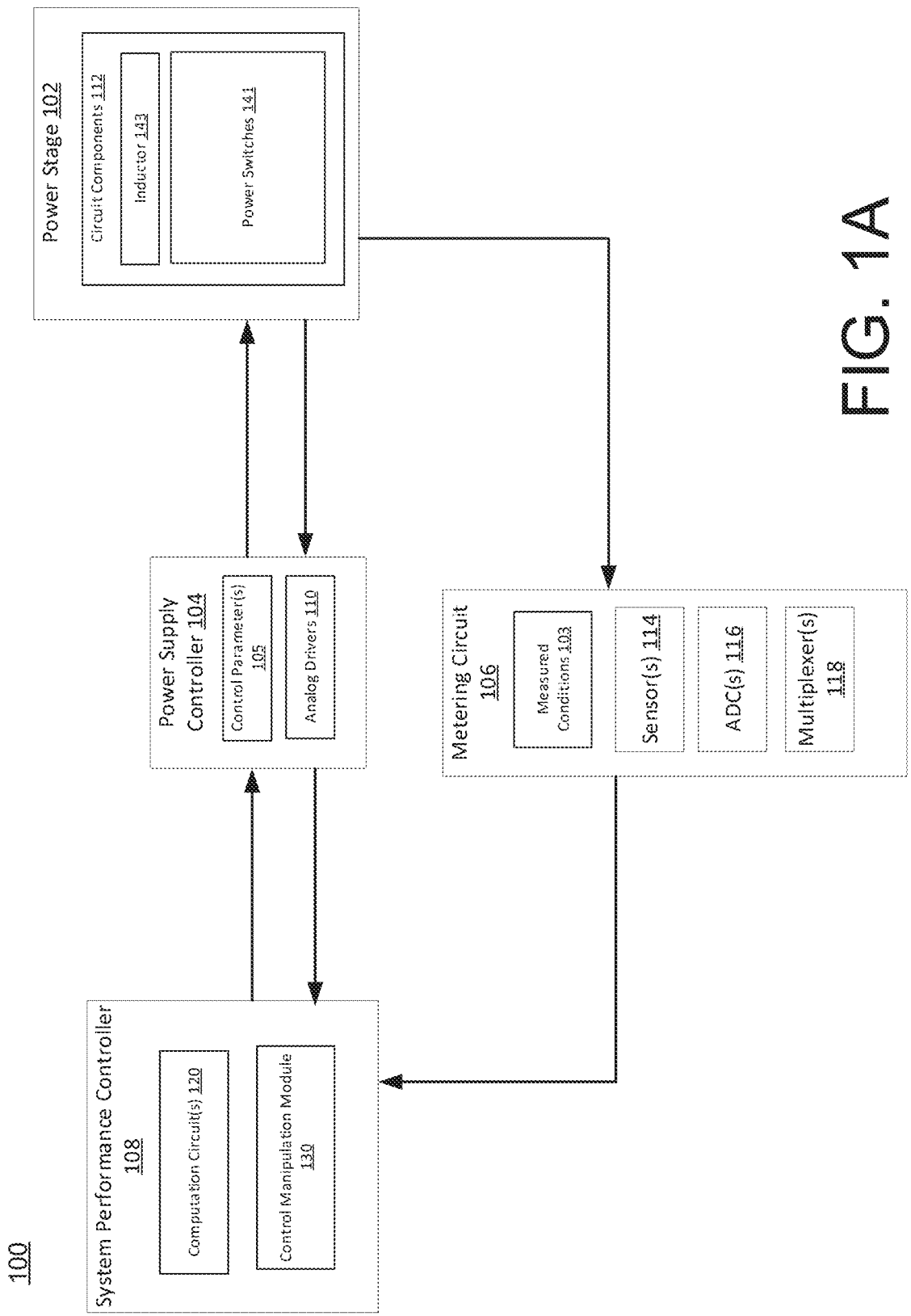

POWER SUPPLY SYSTEM FOR CONTROLLING LOAD DISTRIBUTION ACROSS MULTIPLE CONVERTERS FOR OPTIMIZING OVERALL EFFICIENCY

CROSS REFERENCE TO RELATED APPLICATIONS

This application is a continuation-in-part of and claims priority to U.S. Non-Provisional application Ser. No. 16/547,803, filed Aug. 22, 2019, which is incorporated by reference herein in its entirety. This application claims priority to U.S. Provisional Application No. 62/823,441, filed Mar. 25, 2019, and U.S. Provisional Application No. 62/854,527, filed May 30, 2019, each of which is incorporated by reference herein in its entirety.

This application is related to U.S. Non-Provisional application Ser. No. 16/547,777, filed on Aug. 22, 2019, U.S. Non-Provisional application Ser. No. 16/547,781, filed on Aug. 22, 2019, and U.S. Non-Provisional application Ser. No. 16/547,793, filed on Aug. 22, 2019, each of which is incorporated by reference herein in its entirety.

BACKGROUND

Power supply systems may be designed to achieve one or more performance targets (e.g., high efficiency, high speed, low noise, low emissions, etc.). However, manufacturing variations on the components of the systems and/or effects (e.g., thermal effects, component wear) on the systems during their use may affect achieving those targets.

SUMMARY

According to an aspect, a power supply system includes a power stage, a power supply controller configured to control operations of the power stage, a metering circuit configured to sense measured conditions of the power stage, and a system performance controller configured to be coupled to the power supply controller and the metering circuit. The system performance controller is configured to set or adjust a control parameter for the power stage based on energy conversion efficiency of the power stage. The system performance controller includes an efficiency computation circuit configured to compute the energy conversion efficiency of the power stage based on the measured conditions, and a control manipulation module configured to modify the control parameter until the energy conversion efficiency achieves a threshold condition.

According to various aspects, the power supply system may include one or more of the following features (or any combination thereof). The system performance controller may select a combination of control parameters that result in the energy conversion efficiency achieving the threshold condition. The system performance controller may determine a first value of the control parameter that results in the energy conversion efficiency achieving the threshold condition for a first environment condition and determine a second value of the control parameter that results in the energy conversion efficiency achieving the threshold condition for a second environment condition. The first environment condition may be a first input voltage, and the second environment condition may be a second input voltage, where the second input voltage is different than the first input voltage. The control manipulation module may iteratively modify the control parameter by selecting different values for the control parameter based on an artificial intelligence (AI) algorithm. The control manipulation module may apply historical data to a neutral network of the AI algorithm to predict a value for the control parameter that results in the energy conversion efficiency achieving the threshold condition. The control manipulation module may select a first value for the control parameter, send the first value to the power supply controller, compute the energy conversion efficiency of the power stage that operates according to the first value based on the measured conditions, modify the first value to obtain a second value in response to the energy conversion efficiency not achieving the threshold condition, send the second value to the power supply controller, and compute the energy conversion efficiency of the power stage that operates according to the second value based on the measured conditions. The system performance controller may update the control parameter in response to a triggering event. The triggering event may include detection of a change in one or more environment conditions of the power stage. The triggering event may include detection of the energy conversion efficiency not achieving the threshold condition. The triggering event may include activation of the power stage.

According to an aspect, a power supply system includes a power stage, a power supply controller storing a control parameter to control operations of the power stage, a metering circuit configured to sense measured conditions of the power stage, and a system performance controller connected to the power supply controller and the metering circuit. The system performance controller is configured to periodically monitor an energy conversion efficiency of the power stage during operation of the power stage and periodically update the control parameter. The system performance controller includes an efficiency computation circuit configured to compute the energy conversion efficiency of the power stage based on the measured conditions, and a control manipulation module configured to modify the control parameter until the energy conversion efficiency achieves a threshold condition. The system performance controller is configured to provide the updated control parameter to the power supply controller.

According to various aspects, the power supply system may include one or more of the above/below features (or any combination thereof). The measured conditions may include input voltage, input current, output voltage, and output current. The metering circuit may include one or more analog-to-digital converters configured to convert the measured conditions from an analog format to a digital format. The control parameter may include a zero-voltage switching (ZVS) control parameter, a switching frequency, a pulse width, a duty cycle, or a dead time. The power stage may be a first power stage, and the power supply may include a second power stage, where the control parameter includes a phase transition parameter relating to phase shedding or phase adding.

According to an aspect, a method for controlling a control parameter of a power stage using energy conversion efficiency includes detecting a triggering event, selecting a value for the control parameter based on the energy conversion efficiency, including receiving measured conditions of the power stage, computing the energy conversion efficiency of the power stage based on the measured conditions, and modifying the control parameter until the energy conversion efficiency achieves a threshold condition. The method includes providing the selected value to a power supply controller to control the power stage with the selected value.

According to various aspects, the method may include one or more of the above/below features (or any combination thereof). The modifying may include applying historical data to a neural network of an artificial intelligence (AI) algorithm to predict a combination of control parameters that result in the energy conversion efficiency achieving the threshold condition. The control parameter may include at least one of a zero-voltage switching (ZVS) control parameter, switching frequency, pulse width, duty cycle, or dead time. The triggering event may include activation of the power stage, detection of a change in one or more environment conditions of the power stage, expiration of a timer, or detection of the energy conversion efficiency of the power stage not achieving the threshold condition.

According to an aspect, a system performance controller for controlling a power stage of a power supply system includes a computation circuit configured to monitor a performance metric of a power stage by receiving measured conditions of the power stage and computing a performance metric based on the measure conditions, and a control manipulation module configured to execute, in response to a triggering event, an artificial intelligence (AI) algorithm to identify a value for a control parameter of the power stage that results in the performance metric achieving a threshold condition. In some examples, the triggering event includes activation of the power stage, detection of a change in one or more environment conditions of the power stage, detection of the performance metric not achieving the threshold condition, or detection of an expiration of a timer. In some examples, the AI algorithm is a targeted search algorithm. In some examples, the AI algorithm is an applied learning algorithm.

According to an aspect, a power supply system includes a power stage including a power switch and an inductor, a power supply controller connected to the power stage, a metering circuit configured to sense measured conditions of the power stage, and a system performance controller configured to be coupled to the power supply controller and the metering circuit. The system performance controller is configured to compute an energy conversion efficiency based on the measured conditions and select a value for a zero voltage switching (ZVS) control parameter that results in the energy conversion efficiency achieving a threshold condition. The ZVS control parameter indicates a magnitude of a reverse current through the inductor to discharge a parasitic capacitance of the power switch.

According to various aspects, the power supply system may include one or more of the above/below features (or any combination thereof). The ZVS control parameter may be a current sense voltage threshold indicative of the magnitude of the reverse current. The ZVS control parameter may include a time value to delay activation of the power switch such that the magnitude of the reverse current causes the parasitic capacitance of the power switch to discharge. The ZVS control parameter may be a first ZVS control parameter, and the system performance configured to select a combination of values of the first ZVS control parameter and a second ZVS control parameter that results in the energy conversion efficiency achieving the threshold condition. The second ZVS control parameter may include a time delay. The power switch may be a pulse switch modulation (PWM) field-effect transistor (FET). The system performance controller may include an efficiency computation circuit configured to compute the energy conversion efficiency of the power stage based on the measured conditions, and a control manipulation module configured to execute an artificial intelligence (AI) algorithm to iteratively modify the ZVS control parameter until the energy conversion efficiency achieves the threshold condition. The metering circuit may include one or more voltage sensors configured to sense input and output voltages of the power stage, and one or more current sensors configured to sense input and output currents of the power stage. The metering circuit may include one or more analog-to-digital converters (ADC) configured to convert the measured conditions to a digital format. The system performance controller may update the ZVS control parameter in response to a triggering event during an operation of the power stage, where the triggering event may include at least one of detection of a change in one or more environment conditions of the power stage or detection of the energy conversion efficiency not achieving the threshold condition. The system performance controller may update the ZVS control parameter in response to an activation of the power stage.

According to an aspect, a power supply system includes a power stage including a first power switch, a second power switch, and an inductor. The power supply system includes a power supply controller storing a zero-voltage switching (ZVS) control parameter, where the ZVS control parameter indicates a magnitude of a reverse current through the inductor to discharge a parasitic capacitance of the second power switch. The power supply system includes a metering circuit configured to sense measured conditions of the power stage, and a system performance controller configured to update the ZVS control parameter in response to a triggering event. The system performance controller includes an efficiency computation circuit configured to compute an energy conversion efficiency of the power stage based on the measured conditions, and a control manipulation module configured to modify the ZVS control parameter until the energy conversion efficiency achieves a threshold condition.

According to various aspects, the power supply system may include one or more of the above/below features (or any combination thereof). The triggering event may include detection of a change in environment conditions of the power stage, where the environment conditions includes an input voltage of the power stage. The triggering event may include detection of the energy conversion efficiency not achieving the threshold condition. The metering circuit may include a multiplexer configured to receive a plurality of analog signals representing at least a portion of the measured conditions and generate a multiplexed analog signal, and an analog-to-digital converters (ADC) configured to convert the multiplexed analog signal to a digital signal. The ZVS control parameter may include a time value to delay activation of the second power switch causing the reverse current to have the magnitude to discharge the parasitic capacitance of the second power switch. The ZVS control parameter may cause the first power switch to activate longer than the second power switch to discharge the parasitic capacitance of the second switch during switching operations of the first power switch and the second power switch.

According to an aspect, a method of controlling a zero-voltage switching (ZVS) control parameter of a power stage using energy conversion efficiency includes detecting a triggering event of the power stage, where the power stage includes a power switch and an inductor, and updating a value for the ZVS control parameter based on the energy conversion efficiency, where the ZVS control parameter indicates a magnitude of a reverse current through the inductor to discharge a parasitic capacitance of the power switch. The updating step includes receiving measured conditions of the power stage, computing the energy conversion efficiency of the power stage based on the measured conditions, and modifying the ZVS control parameter until the energy conversion efficiency achieves a threshold condition.

According to various aspects, the method may include one or more of the above/below features (or any combination thereof). The triggering event may include activation of the power stage, detection of a change in one or more environment conditions of the power stage, or detection of the energy conversion efficiency of the power stage not achieving the threshold condition. The ZVS control parameter may be a first ZVS control parameter, and the updating further includes selecting a combination of values of the first ZVS control parameter and a second ZVS control parameter that results in the energy conversion efficiency achieving the threshold condition, where the second ZVS control parameter includes time delay.

According to an aspect, a power supply system includes a plurality of power stages configured to receive an input voltage and generate an output voltage, and a system host device connected to the plurality of power stages. The system host device includes a system performance controller configured to set or update one or more control parameters for controlling the plurality of power stages using overall energy conversion efficiency. The system host device includes an efficiency computation circuit configured to compute the overall energy conversion efficiency based on measured conditions, and a control manipulation module configured to modify the one or more control parameters until the overall energy conversion efficiency achieves a threshold condition.

According to various aspects, the power supply system may include one or more of the above/below features (or any combination thereof). The one or more control parameters may include phase transition parameters defining one or more efficiency transition points that indicate a timing of when to deactivate or activate one or more of the plurality of stages. The one or more control parameters may include an intermediate bus voltage indicating a voltage on a power bus between two adjacent power stages. The one or more control parameters may include at least one of input conditions or output conditions. The plurality of power stages may be connected in series. The plurality of power states may be connected in parallel. The efficiency computation circuit may compute the overall energy conversion efficiency based on the input voltage, an input current, the output voltage, and an output current. The system performance controller may update the one or more control parameters in response to a triggering event. The triggering event may include activation of the plurality of power stages, detection of a change in the measured conditions of the plurality of power stages, or detection of the overall energy conversion efficiency not achieving the threshold condition. The plurality of power stages may include a first power stage and a second power stage. The system host device may be connected to the first power stage via a first power communication bus, and the system host device may be connected to the second power stage via a second power communication bus. The control manipulation module may execute an artificial intelligence (AI) algorithm defining a neutral network, where the control manipulation module may apply training data to the neutral network to predict one or more values for the one or more control parameters that result in the overall energy conversion efficiency achieving the threshold condition.

According to an aspect, a power supply system includes a plurality of power stages configured to receive an input voltage and generate an output voltage, where the plurality of power stages includes a first power stage and a second power stage. The power supply system may include a system host device connected to the plurality of power stages, where the system host device stores a control parameter for controlling the plurality of power stages. The system host device may include a system performance controller configured to receive measured conditions from the plurality of power stages, and, in response to a triggering event, update the control parameter based on the measured conditions. The system performance controller includes an efficiency computation circuit configured to compute the overall energy conversion efficiency based on the measured conditions, and a control manipulation module configured to modify the control parameter until the overall energy conversion efficiency achieves a threshold condition.

According to various aspects, the power supply system may include one or more of the above/below features (or any combination thereof). The control parameter may include a phase transition point to deactivate the first power stage. The control parameter may include a phase transition point to activate the first power state. The control parameter may include an intermediate bus voltage, where the intermediate bus voltage is a voltage between the first power stage and the second power stage. The control parameter may include an input voltage or output voltage of the first power stage. The triggering event may include includes activation of the plurality of power stages, detection of a change in the measured conditions, or detection of the overall energy conversion efficiency not achieving the threshold condition.

According to an aspect, a method of controlling a plurality of power stages using overall energy conversion efficiency includes detecting a triggering event of the plurality of power stages, where the plurality of power stages includes a first power stage and a second power stage connected in series or in parallel with the first power stage, updating a value for a control parameter that controls the plurality of power stages based on the overall energy conversion efficiency, where the control parameter includes a phase transition parameter, an intermediate bus voltage, or an input or output condition of an individual power stage, and the updating includes receiving measured conditions of the plurality of power stages, computing the overall energy conversion efficiency based on the measured conditions, and modifying the control parameter until the overall energy conversion efficiency achieves a threshold condition. In some examples, the triggering event may include activation of the plurality of power stages, detection of a change in the measured conditions, or detection of the overall energy conversion efficiency not achieving the threshold condition. The overall energy conversion efficiency may be computed based on input voltage, input current, output voltage, and output current.

According to an aspect, a power supply system includes a power stage, a power supply controller configured to control operations of the power stage, a metering circuit configured to sense measured conditions of the power stage, and a system performance controller configured to be coupled to the power supply controller and the metering circuit. The system performance controller is configured to set or adjust a control parameter for the power stage based on standby power of the power stage. The system performance controller includes a standby power computation circuit configured to compute the standby power of the power stage based on the measured conditions, and a control manipulation module configured to modify the control parameter until the standby power achieves a threshold condition.

According to various aspects, the power supply system may include one or more of the above/below features (or any combination thereof). The standby power computation circuit may compute the standby power based on an input voltage and an input current of the power stage. The control parameter may include a skip cycle parameter. The system performance controller may update the control parameter in response to a triggering event during an operation of the power stage. The control parameter may be a first control parameter, and the system performance controller may select a combination of values of the first control parameter and a second control parameter that result in the standby power achieving the threshold condition. The control manipulation module may iteratively modify the control parameter by selecting different values for the control parameter based on an artificial intelligence (AI) algorithm. The control manipulation module may apply training data to a neutral network of an artificial intelligence (AI) algorithm to predict a value for the control parameter that results in the standby power achieving the threshold condition. The control manipulation module may select a first value for the control parameter, send the first value to the power supply controller, compute the standby power of the power stage with the first value based on the measured conditions, modify the first value to obtain a second value in response to the standby power not achieving the threshold condition, send the second value to the power supply controller, and compute the standby power with the second value based on the measured conditions. The metering circuit may include a voltage sensor configured to sense an input voltage and a current sensor configured to sense an input current. The metering circuit may include an analog-to-digital converter (ADC) configured to convert the monitored conditions to a digital format.

According to an aspect, a power supply system includes a power stage, a power supply controller storing a control parameter for controlling operations of the power stage, and a metering circuit configured to sense measured conditions of the power stage, where the measured conditions includes an input voltage of the power stage and an input current of the power stage. The power supply system may include a system performance controller configured to be coupled to the power supply controller and the metering circuit, where the system performance controller is configured to update the control parameter to minimize standby power of the power stage. The system performance controller includes a standby power computation circuit configured to compute the standby power of the power stage based on the input voltage and the input current, and a control manipulation module configured to modify the control parameter until the standby power achieves a threshold condition.

According to various aspects, the power supply system may include one or more of the above/below features (or any combination thereof). The control parameter may include a skip cycle parameter. The system performance controller may update the control parameter in response to a triggering event. The control parameter may be a first control parameter, and the system performance controller may select a combination of values of the first control parameter and a second control parameter that result in the standby power achieving the threshold condition. The control manipulation module may iteratively modify the control parameter by selecting different values for the control parameter based on an artificial intelligence (AI) algorithm. The control manipulation module may apply training data to a neutral network of an artificial intelligence (AI) algorithm to predict a value for the control parameter that results in the standby power achieving the threshold condition. The metering circuit may include a voltage sensor configured to sense an input voltage and a current sensor configured to sense an input current, and an analog-to-digital converter (ADC) configured to convert the input voltage and the input current to a digital format.

According to an aspect, a method of controlling a control parameter of a power stage to minimize standby power includes detecting a triggering event of the power stage and updating a value for a control parameter that controls the power stage to minimize standby power of the power stage, where the control parameter includes a skip cycle parameter. The updating may include receiving measured conditions of the power stage, computing the standby power based on the measured conditions, and modifying the control parameter until the standby power achieves a threshold condition. In some examples, the standby power is computed based on input voltage and input current. In some examples, the method includes measuring input voltage and input current of the power stage and converting the input voltage and the input current to a digital format.

According to an aspect, a power supply system includes a plurality of power converters configured to deliver a system load current to a load, where the system load current is a combination of individual load currents provided by the plurality of power converters, and a system performance controller configured to detect a value of the system load current. The system performance controller is configured to determine, using power loss information, values for the individual load currents such that a composite efficiency achieves a threshold condition. The system performance controller is configured to generate control signals to operate the plurality of power converters at the determined values.

According to various aspects, the power supply system may include one or more of the following features (or any combination thereof). The system performance controller is configured to periodically update the power loss information by monitoring input and output conditions of the plurality of power converters and computing the composite efficiency based on the input and output conditions. The power loss information includes a plurality of load current combinations over a range of system load current values, where each load current combination is associated with a corresponding composite efficiency, and each load current combination providing a separate combination of values for the individual load currents. The system performance controller is configured to select a load current combination from the plurality of load current combinations that provides a highest composite efficiency. In response to a triggering event, the system performance controller is configured to determine, using the power loss information, new values for the individual load currents such that the composite efficiency achieves the threshold condition. The system performance controller is configured to determine a most efficient power converter among the plurality of power converters based on the power loss information. The system performance controller is configured to set a value for an individual load current of the most efficient power converter up to a maximum individual value provided by the most efficient power converter and allocate any remaining amount to a next most efficient converter. The system performance controller is configured to generate or update the power loss information in response to a triggering event. The system performance controller includes a control manipulation module configured to iteratively modify at least one of the values of the individual load currents, and an efficiency computation circuit configured to compute, at each iteration, the composite efficiency based on measured input and output conditions. The control manipulation module is configured to store, at each iteration, the values of the individual load currents and a corresponding composite efficiency. The control manipulation module is configured to execute an artificial intelligence (AI) algorithm using a neural network, where the control manipulation module is configured to apply the power loss information to the neural network to predict at least one of the values of the individual load currents for a next iteration.

According to an aspect, a power supply system includes a plurality of power converters including at least a first power converter and a second power converter, where the plurality of power converters, collectively, is configured to deliver a system load current to a load. The system load current is a combination of at least a first load current provided by the first power converter and a second load current provided by the second power converter. The power supply system includes a system performance controller configured to detect a value of the system load current and determine, using power loss information, a first value for at least the first load current and a second value for the second load current such that a composite efficiency achieves a threshold condition. The system performance controller is configured to generate a first control signal to operate at least the first power converter at the first value and a second control signal to operate the second power converter at the second value. The system performance controller is configured to set the first value at the detected value of the system load current and control the second power converter to operate in a standby mode. The power loss information includes a plurality of load current combinations over a range of system load current values, where each load current combination is associated with a corresponding composite efficiency, and each load current combination providing a separate combination of a value for at least the first load current and a value for the second load current. The system performance controller is configured to select a load current combination from the plurality of load current combination that provides a highest composite efficiency. In response to a triggering event, the system performance controller is configured to determine, using the power loss information, at least a new first value for the first load current and a new second value for the second load current such that the composite efficiency is maximized. The system performance controller is configured to determine the first value and the second value according to a most efficient converter (MEC) approach in response to the system load current being detected as equal to or less than a maximum load current of either the first power converter or the second power converter. The system performance controller is configured to determine the first value and the second value according to an equal sharing approach in response to the system load current being detected as greater than the maximum load current of either the first power converter or the second power converter. The system performance controller is configured to re-compute or update the power loss information in response to a triggering event, where the triggering event includes activation of one or more of the plurality of power converters, detection of a change in one or more measured conditions, detection of the composite efficiency not being maximized, and/or expiration of a timer. The system performance controller includes a control manipulation module configured to, in response to the triggering event, iteratively modify at least one of a value of the first load current or a value of the second load current, and an efficiency computation circuit configured to compute, at each iteration, the composite efficiency based on measured input and output conditions. The control manipulation module is configured to store, at each iteration, the value of the first load current,
the value of the second load current, and a corresponding composite efficiency. The power supply system includes a power supply device includes the plurality of power converters, the system performance controller, a power supply controller, and a metering circuit.

According to an aspect, a method of controlling a plurality of power converters using composite efficiency includes delivering, by a power supply system, a system load current to a load, where the system load current is a combination of individual load currents provided by a plurality of power converters, detecting, by a system performance controller, a value of the system load current, determining, using power loss information, values for the individual load currents such that a composite efficiency achieves a threshold condition, and generating control signals to operate the plurality of power converters at the determined values. The power loss information includes a plurality of load current combinations over a range of system load current values, where each load current combination is associated with a corresponding composite efficiency, and each load current combination provides a separate combination of values for the individual load currents. The method includes selecting a load current combination from the plurality of load current combination that provides a highest composite efficiency. The method includes detecting a change to the value of the system load current, and determining, using the power loss information, new values for the individual load currents such that the composite efficiency achieves the threshold condition. The method includes updating the power loss information in response to a triggering event, where the triggering event includes activation of one or more of the plurality of power converters, detection of a change in one or more measured input or output conditions, detection of the composite efficiency not achieving the threshold condition, or expiration of a timer. The updating may include iteratively modifying at least one of the values of the individual load currents, computing, at each iteration, the composite efficiency based on the measured input and output conditions, and storing, at each iteration, the values of the individual load currents and a corresponding composite efficiency.

According to an aspect, a method of controlling a plurality of power converters using composite efficiency includes delivering, by a power supply system, a system load current to a load, where the system load current is a combination of at least a first load current provided by a first power converter and a second load current provided by a second power converter, calculating a first integral value of a composite efficiency curve over a load range for the first power converter, calculating a second integral value of a composite efficiency curve over a load range for the second power converter, determining values for the first load current and the second load current based on the first integral value and the second integral value, and generating control signals to operate the first power converter and the second power converter at the determined values.

In some aspects, the method includes determining that the first integral value provides a composite efficiency greater than the second integral value, and selecting the first power converter to provide power up to a maximum current threshold provided by the first power converter. The method may include determining that the system load current is greater than the maximum current threshold provided by the first power converter and selecting the second power converter to provide power up to a maximum current threshold provided by the second power converter.

BRIEF DESCRIPTION OF THE DRAWINGS

FIG. 1A illustrates a power supply system having a system performance controller according to an aspect.

DETAILED DESCRIPTION

Figure 1B:
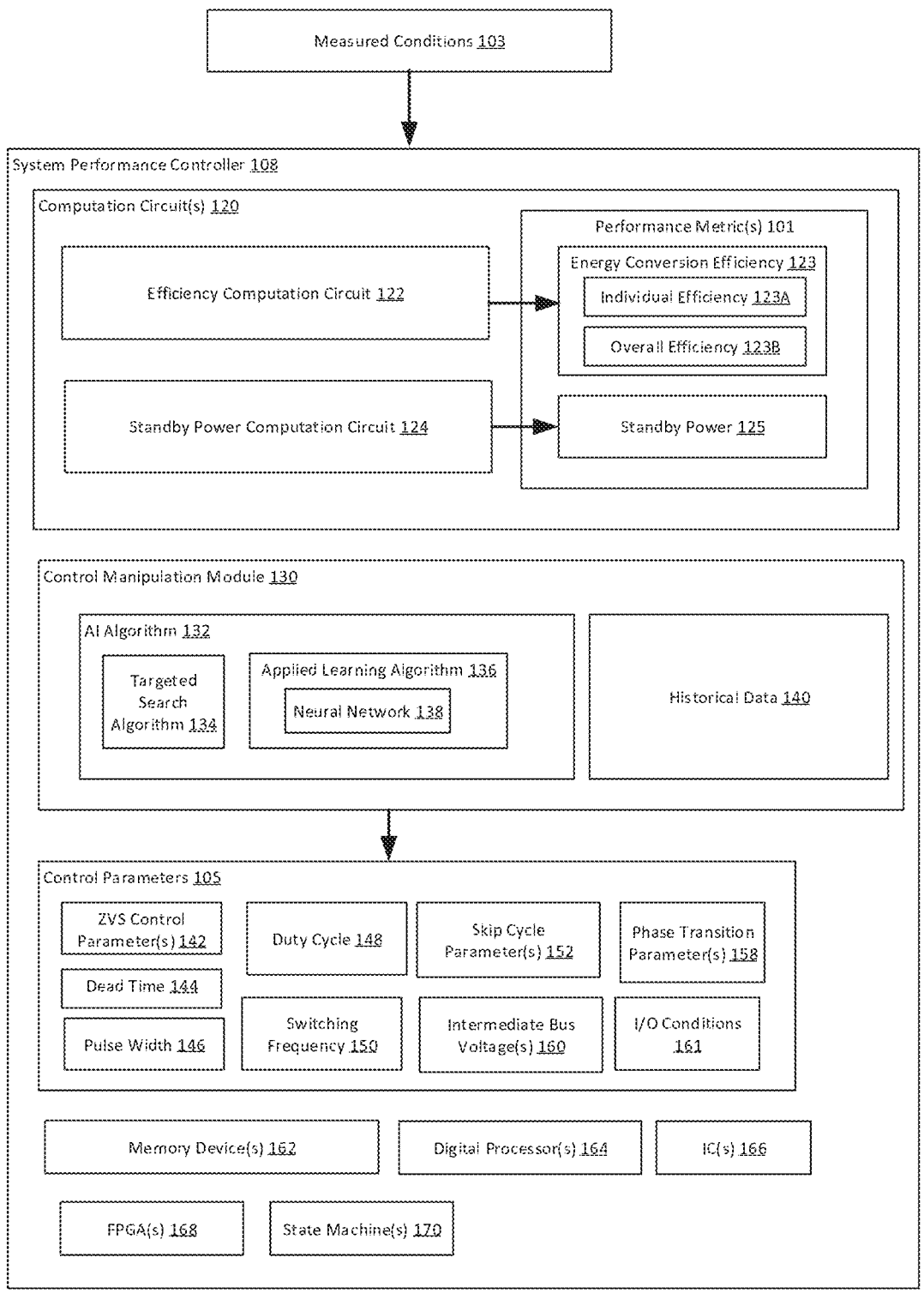
FIG. 1B illustrates the system performance controller of FIG. 1A according to an aspect.

This description relates to a power supply system with or using a system performance controller that computes the energy conversion efficiency (e.g., $\eta=(V_{Out}*I_{Out})/(V_{in}*I_{in})$)

of one or more power stages, and sets or adjusts one or more control parameters for the power stage by adjusting the value(s) of the control parameter(s) until the energy conversion efficiency achieves a threshold condition (e.g., is maximized and/or achieves a targeted threshold). The system performance controller may execute an artificial intelligence (AI) algorithm to step through (or loop through) values for one or more control parameters until the efficiency is maximized and/or is equal to or greater than a threshold level. The system performance controller may set or update the control parameter(s) in view of the energy conversion efficiency during production or during the system's lifetime, which may cause the power stage(s) to continue to meet the targeted or optimal energy conversion efficiency despite a change in the environment conditions, the aging of circuit components of the power stage(s), the manufacturing variants of the circuit components of the power stage, and/or the thermal effects on the power stage(s).

For example, the power stage may incur switching losses in response to a drain-source voltage of a power switch being non-zero when the power switch is activated, thereby decreasing the energy conversion efficiency. In some examples, the control parameters may include zero-voltage switching (ZVS) control parameters that enable the power switch (or multiple power switch) to switch at ZVS (or substantially ZVS). The energy conversion efficiency may be negatively affected by the environment (e.g., the external stimulus) of the power system, as well as the manufacturing variations of the components of the power system.

However, the system performance controller computes the energy conversion efficiency and then sets or adjusts one or more control parameters that would result in the energy conversion efficiency achieving a threshold condition. Furthermore, in some examples, the system performance controller monitors and computes the energy conversion efficiency during the power stage's lifetime and can programmatically re-evaluate and potentially select a new value for the ZVS control parameter that optimizes or maintains the energy conversion efficiency at the threshold level despite changes in the environment, the aging of components, and/or the thermal effects on the power stage.

In some examples, the power supply system includes a plurality of power stages (e.g., connected in series or in parallel), and the system performance controller is configured to control the power stages in a manner that maximizes or causes an overall energy conversion efficiency to be greater than a threshold level during production or during the power stages' lifetime. The overall energy conversion efficiency may be the end-to-end energy conversion efficiency. In some examples, the system performance controller may set or adjust phase shedding/adding parameters that control when the power stages may be deactivated (or activated) to maximize the overall energy conversion efficiency. In some examples, the system performance controller may set or adjust one or more intermediate bus voltages to cause the overall energy conversion efficiency to be maximized or greater than a threshold level.

In some examples, the system performance controller directly computes standby power (e.g., $(V_{IN}*I_{IN})$) of one or more power stages and sets or adjusts one or more control parameters for the power stage by adjusting the value(s) of the control parameter(s) until the standby power is minimized or less than a threshold level. The standby power may be the electrical energy that is used by a deactivated device (e.g., the device is coupled to the power stage, but switched off). For example, the system performance controller directly computes the standby power (e.g., $(V_{IN}*I_{IN})$) of the power stage based on measured conditions and selects values for the control parameters such that the standby power is minimized and/or is less than a standby power threshold level. In some examples, the skip cycle parameters may affect the standby power. For example, when the deactivated device is coupled to the power stage, a power supply controller may control the power stage in a skip-cycle mode. In the skip-cycle mode, the power supply controller generates a set of pulses to switch the power switches during a burst period, followed by a skip cycle period, and then generates another set of pulses during the burst period, which is then followed by the skip cycle period. The skip cycle parameters may include the frequency of the pulses during the burst period, the duty cycle during the burst period, the time between burst periods, and/or the length of the skip cycle period.

In some examples, the system performance controller monitors and computes other performance metrics such as noise (e.g., total harmonic distortion), emissions, ripple, and/or transient response, and sets or adjusts one or more control parameters for the power stage(s) by adjusting the value(s) of the control parameter(s) until the monitored performance metric(s) is maximized (or minimized) and/or achieves a targeted threshold.

FIG. 1 illustrates a power supply system 100 having one or more power stages 102, a power supply controller 104, a metering circuit 106, and a system performance controller 108 configured to compute a performance metric 101 (or a set of performance metrics 101) based on measured conditions 103 and set or adjust one or more control parameters 105 such that the performance metric 101 (or the set of performance metrics 101) achieves threshold condition(s) (e.g., below/above targeted level(s), maximized or minimized, or falls within acceptable ranges). In some examples, the system performance controller 108 is configured to set or adjust one or more control parameters such that the performance metric 101 is maximized (or minimized). The control parameters 105 determined by the system performance controller 108 may be stored at the power supply controller 104. FIG. 1B illustrates a schematic diagram of an example of the system performance controller 108 according to an aspect.

The performance metric(s) 101 may be negatively affected by the environment (e.g., the external stimulus) of the power stage 102, as well as the manufacturing variations of the components of the power stage 102. However, the system performance controller 108 may set or update the control parameter(s) 105 in view of the performance metric(s) 101 during production or during the system's lifetime, which may cause the power stage 102 to continue to meet the performance metric(s) 101 despite a change in the environment conditions, the aging of circuit components 112 of the power stage 102, the manufacturing variants of the circuit components 112 of the power stage 102, and/or the thermal effects on the power stage 102.

The control parameters 105 may be any type of control parameter for the power stage 102 that may affect one or more of the performance metrics 101. In some examples, the control parameters 105 may include zero-voltage switching (ZVS) parameter(s) 142, dead time 144, pulse width 146, duty cycle 148, switching frequency 150, skip cycle parameter(s) 152, phase transition parameter(s) 158 (e.g., phase shedding/phase adding), intermediate bus voltage parameter(s) 160 and/or input/output (I/O) conditions 161. In some examples, the control parameters 105 may include zero-current switching (ZCS). In some examples, the control parameters 105 may include synchronous/asynchronous rectification, line voltage doubling, energy recycling, snubbing, and/or safe operation area (SOA). In some examples, the control parameters 105 may include modes and transitions such as continuous, discontinuous, critical, fixed frequency, variable frequency, on-time, off-time, resonant transitions, switching frequency center/modulation, current limit, and/or power stage-drive (e.g., strength, waveform).

In some examples, the performance metric 101 is energy conversion efficiency 123. The energy conversion efficiency 123 is a ratio of output power to input power. In some examples, the energy conversion efficiency 123 is an individual efficiency 123A. The individual efficiency 123A refers to the energy conversion efficiency of an individual power stage 102. In some examples (such as in the case of multiple power stages), the energy conversion efficiency 123 may refer to an overall efficiency 123B. The overall efficiency 123B refers to the end-to-end energy conversion efficiency of the power stages 102. In some examples, instead of using indirect parameters as a function of energy conversion efficiency, the system performance controller 108 directly computes the energy conversion efficiency 123 (e.g., $\eta=(V_{OUT}*I_{OUT})/(V_{IN}*I_{IN})$) of the power stage 102 based on the measured conditions 103 (e.g., input voltage, input current, output voltage, output current) and selects values for the control parameters 105 such that the energy conversion efficiency 123 is maximized and/or is equal to or exceeds an efficiency threshold level. For example, the system performance controller 108 may adjust one or more control parameters 105 until the energy conversion efficiency 123 is maximized and/or is equal to or exceeds the efficiency threshold level.

In some examples, the system performance controller 108 may adjust a ZVS control parameter 142 (or multiple ZVS control parameters 142) until the energy conversion efficiency 123 is maximized and/or equal to or exceeds the efficiency threshold level. For example, if a power switch 141 activates when its drain-source voltage is non-zero, switching losses may occur. The ZVS control parameter 142 may be a control parameter that results in the power switch activating at zero voltage (or substantially zero voltage) to reduce or eliminate the switching losses, thereby improving the energy conversion efficiency 123. In some examples, the ZVS control parameter 142 indicates a magnitude of a reverse current through an inductor to discharge a parasitic capacitance of a power switch. In some examples, the ZVS control parameter 142 is a current sense voltage threshold indicative of the magnitude of the reverse current. In some examples, the ZVS control parameter 142 includes a time value to delay activation of the power switch such that the magnitude of the reverse current causes the parasitic capacitance of the power switch to discharge. In some examples, the ZVS control parameter 142 include the dead time 144.

Other control parameters 105 may affect the energy conversion efficiency 123 of the power stage 102. For example, the system performance controller 108 may set or adjust a value for the pulse width 146 by modifying the pulse width 146 until the energy conversion efficiency 123 achieves a threshold condition. In some examples, the threshold condition is the energy conversion efficiency 123 being equal to or greater than a threshold level. In some examples, the threshold condition is the energy conversion efficiency 123 being maximized. In some examples, the system performance controller 108 may set or adjust a value for the duty cycle 148 by modifying the duty cycle 148 until the energy conversion efficiency 123 achieves the threshold condition. In some examples, the system performance controller 108 may set or adjust a value for the switching frequency 150 by modifying the switching frequency 150 until the energy conversion efficiency 123 achieves the threshold condition.

In some examples, the system performance controller 108 may set or adjust a value for the dead time 144 by modifying the dead time 144 until the energy conversion efficiency 123 achieves the threshold condition. The dead time 144 may relate to a period of time of when a first power switch and a second power switch are deactivated. When the dead time is too long, the power stage 102 may incur losses due to conduction and reverse recovery of the body diodes of the first and second power switches, thereby decreasing the energy conversion efficiency 123 of the power stage 102. When the dead time 144 is too short, the power stage 102 may occur losses due to the simultaneous conduction of the first and second power switches, resulting in relatively large current spikes, thereby decreasing the energy conversion efficiency 123 of the power stage 102.

In some examples, the performance metric 101 is standby power 125. The standby power 125 may be the electrical energy that is used by a deactivated device (e.g., the device is coupled to the power stage 102, but switched off). For example, the system performance controller 108 may directly compute the standby power 125 (e.g., $(V_{IN}*I_{IN})$) of the power stage 102 based on the measured conditions 103 (e.g., the input voltage and input current), and selects values for the control parameters 105 such that the standby power 125 achieves a threshold condition (e.g., is minimized and/or is less than a standby power threshold level). For example, the system performance controller 108 may adjust one or more control parameters 105 until the standby power 125 is minimized and/or less than the standby power threshold level. In some examples, the skip cycle parameters 152 may affect the standby power 125. For example, when the deactivated device is coupled to the power stage 102, the power supply controller 104 may control the power stage 102 in a skip-cycle mode (e.g., skip mode, skip-cycle modulation, etc.). In the skip-cycle mode, the power supply controller 104 generates a set of pulses to switch the power switches 141 during a burst period, followed by a skip cycle period, and then generates another set of pulses during the burst period, which is then followed by the skip cycle period. The skip cycle parameters 152 may include the frequency of the pulses during the burst period, the duty cycle during the burst period, the frequency between burst periods, and/or the length of the skip cycle period.

In some examples, the performance metric 101 is transient response. For example, the system performance controller 108 directly computes a transient response metric of the power stage 102 based on the measured conditions 103 and selects values for the control parameters 105 such that the transient response metric achieves a threshold condition (e.g., is minimized and/or is less than a transient response threshold level). For example, the system performance controller 108 may adjust one or more control parameters 105 until the transient response metric is minimized and/or is less than the transient response threshold level.

In some examples, the performance metric 101 is total harmonic distortion (THD). For example, the system performance controller 108 may directly compute a THD metric (e.g., indicating a level of THD within the power stage 102) based on the measured conditions 103, and selects values for the control parameters 105 such that the THD metric achieves a threshold condition (e.g., is minimized and/or is less than a THD threshold level). For example, the system performance controller 108 may adjust one or more control parameters 105 until the THD metric is minimized and/or less than the THD threshold level.

In some examples, the performance metric 101 is emissions (e.g., electromagnetic radiation). For example, the system performance controller 108 may directly compute an emission metric (e.g., indicating a level of emissions within the power stage 102) based on the measured conditions 103, and selects values for the control parameters 105 such that the emission metric achieves a threshold condition (e.g., is minimized and/or is less than an emission threshold level). For example, the system performance controller 108 may adjust one or more control parameters 105 until the emission metric is minimized and/or less than the emission threshold level.

In some examples, the performance metric 101 is ripple. For example, the system performance controller 108 may directly compute a ripple metric (e.g., indicating a level of ripple within the power stage 102) based on the measured conditions 103, and selects values for the control parameters 105 such that the ripple metric achieves a threshold condition (e.g., is minimized and/or is less than a ripple threshold level). For example, the system performance controller 108 may adjust one or more control parameters 105 until the ripple metric is minimized and/or less than the ripple threshold level. However, the performance metric 101 may include other FOMs such as output voltage, power factor, etc.

The system performance controller 108 is connected to the power supply controller 104. In some examples, the system performance controller 108 is configured to provide the control parameters 105 to the power supply controller 104 such that the power supply controller 104 can control the power stage 102 according to the set or updated values determined by the system performance controller 108. In some examples, the system performance controller 108 is configured to receive environment and/or control conditions from the power supply controller 104. The environment and/or control conditions may include input voltage, input current, current sense, switching frequency, duty cycle, temperature, operation mode parameters, etc.

In some examples, the system performance controller 108 is wire-connected to the power supply controller 104. In some examples, the system performance controller 108 is wirelessly connected (e.g., a network-based connection such a private network or Internet) to the power supply controller 104. In some examples, the power supply controller 104 and the power stage 102 are include in an integrated product (e.g., a semiconductor package). In some examples, the system performance controller 108 is external to the integrated product. In some examples, the system performance controller 108 is associated with a display device providing an external input/output interface to view the results, set the environment conditions, and/or modify the control. In some examples, the integrated product includes the system performance controller 108 and the metering circuit 106. In some examples, the system performance controller 108 is located on a server remote from the power supply controller 104 and the power stage 102. In some examples, the system performance controller 108 is removably connected to the power supply controller 104. For example, the system performance controller 108 may be connected to the power supply controller 104 during the testing and/or production of the power stage 102 to determine the control parameters 105 (which are then stored at the power supply controller 104), but the system performance controller 108 is not included in the integrated product.

The system performance controller 108 is connected to the metering circuit 106. In some examples, the system performance controller 108 is wire-connected to the metering circuit 106. In some examples, the system performance controller 108 is wirelessly connected to the metering circuit 106. The system performance controller 108 may receive the measured conditions 103 about the power stage 102 to compute one or more of the performance metrics 101.

The power supply controller 104 is connected to the power stage 102. The power supply controller 104 may be any type of controller that is configured to control the operations of the power stage 102. Generally, the type of power supply controller 104 may be dependent upon the type of power stage 102. In some examples, the power supply controller 104 is a PWM controller. The power supply controller 104 is configured to generate control signals according to the control parameters 105 to control the power stage 102, and the control signals are provided to the power stage 102. The power supply controller 104 may include analog drivers 110 configured to generate the control signals for one or more of the circuit components 112 of the power stage 102. In some examples, the power supply controller 104 receives environment conditions (e.g., input voltage, input current, current sense, switching frequency, duty cycle, operation mode parameters, temperature, etc.) from the power stage 102.

In some examples, the power supply controller 104 may include a combination of digital and analog components. In some examples, the power supply controller 104 may include logic circuits, comparators, memory devices, etc. The control parameters 105 are stored at a program memory of the power supply controller 104, which can be determined by the system performance controller 108 such that one or more performance metrics 101 are optimized. In some examples, the control parameters 105 stored at the program memory of the power supply controller 104 are updated (e.g., automatically updated) by the system performance controller 108 to account for changing environment conditions, aging of components, and/or thermal effects on the system.

Although one power stage 102 is illustrated in FIG. 1A, the power supply systems discussed herein may include multiple power stages 102 as further discussed later in the disclosure. For example, the power supply system 100 may include a single power stage 102 or combinations of parallel and/or series power stages 102. The power stage 102 may include a power converting circuit that converts electrical power such as converting between alternating current (AC) and direct current (DC), DC to DC, DC to AC or changing the voltage or frequency for any combination thereof.

Generally, the power stage 102 may encompass one of a wide variety of topologies such as a buck converter, boost converter, inverting buck-boost converter, fly-back converter, active clamp forward converter, single switch forward converter, two switch forward converter, push-pull converter, half-bridge converter, full-bridge converter, phase-shafted full-bridge converter, etc. In some examples, the power stage 102 includes a switching resonant converter.

The power stage 102 includes the circuit components 112. The circuit components 112 may include diodes, switches (e.g., transistors, field-effect transistors (FETs), metal-oxide-semiconductor field effector transistors (MOSFETs)), capacitors, inductors, and/or transformers, etc. In some examples, the circuit components 112 include an inductor 143. In some examples, the inductor 143 is a boost inductor. In some examples, the circuit components 112 include one or more power switches 141. In some examples, the power switches 141 include FETs. In some examples, the power switches 141 include a first power switch and a second power switch. In some examples, the first power switch is a pulse width modulation (PWM) switch (e.g., FET). In some examples, the first power switch is a high-side PWM FET. In some examples, the second power switch is a PWM switch (e.g., FET). In some examples, the second power switch is a low-side PWM FET.

The metering circuit 106 is connected to the power stage 102. In some examples, the power stage 102 includes the metering circuit 106. The metering circuit 106 is configured to sense the measured conditions 103 of the power stage 102. For example, the metering circuit 106 may monitor and obtain the measured conditions 103 of the power stage 102. In some examples, the metering circuit 106 is configured to obtain information about the measured conditions 103 from the power stage 102 in an analog format and convert the information about the measured conditions 103 to a digital format.

In some examples, the measured conditions 103 include input voltage, input current, output voltage, and output current. In some examples, the measured conditions 103 include temperature of the power stage 102. In some examples, the measured conditions 103 include measured noise of the power stage 102 such as detected total harmonic distortion (THD) of the power stage 102. In some examples, the measured conditions 103 include detected emissions of the power stage 102 (e.g., electromagnetic interference (EMI), electromagnetic compatibility (EMC)). In some examples, the measured conditions 103 include intermediate conditions such as branch currents, node voltages (e.g., zero current, voltage conditions), slew rates, and waveforms of the power stage 102. In some example, the measured conditions 103 include parametric changes or a level of aging of one or more components of the power stage 102. In some examples, the measured conditions 103 include inferred conditions such as boost inductance which may vary over time due to aging. Inductance can be inferred by measuring differential voltage and differential current over a switching time period (e.g., $L=(V*dt)/dI$). Similarly, capacitance may be inferred by measuring differential voltage and different current over a switching time period (e.g., $C=(I*dt)/dV$, etc.).

In some examples, the metering circuit 106 includes one or more sensors 114 coupled to the power stage 102 and configured to measure and obtain one or more of the above-described measured conditions 103. In some examples, the sensors 114 include one or more current sensors such as a first current sensor that obtains the input current of the power stage 102, and a second current sensor that obtains the output current of the power stage 102 (or any other current sensors that obtains one or more intermediate currents within the power stage 102). In some examples, the sensors 114 include one or more voltage sensors such as a first voltage sensor that obtains the input voltage of the power stage 102 and a second voltage sensor that obtains the output voltage of the power stage 102 (or any other voltage sensors that obtains one or more intermediate voltages within the power stage 102). In some examples, the sensors 114 include a temperate sensor configured to obtain the temperature of the power stage 102 (or individual components of the power stage 102). In some examples, the sensors 114 include one or more noise detection sensors configured to obtain the level of noise of the power stage 102. In some examples, the sensors 114 include emission detection sensors configured to detect one or more types of emissions.

In some examples, the metering circuit 106 includes one or more analog-to-digital converters (ADCs) 116 configured to convert the sensed information from the sensors 114 to a digital format. In some examples, the metering circuit 106 includes one or more multiplexers 118. For example, a particular multiplexer 118 is configured to receive signals (e.g., each signal corresponds to a different measured condition 103) and then multiplex the signals into a single signal, which is then converted into a digital signal by the ADC 116. In some examples, the multiplexers 118 include a first multiplexer configured to receive the input voltage and the input current (from the respective sensors 114), and generate a single signal representing the input voltage and current, and a second multiplexer configured to receive the output voltage and the output current (from the respective sensors 114), and generate a single signal representing the output voltage and the output current. In some examples, the ADCs 116 includes a first ADC configured to receive the signal from the first multiplexer and generate a digital signal, and a second ADC configured to receive the signal from the second multiplexer and generate a digital signal.

The system performance controller 108 may include one or more computation circuits 120 configured to compute a respective performance metric 101, and a control manipulation module 130 configured to modify one or more control parameters 105 until the performance metric(s) 101 achieve threshold condition(s) (e.g., maximized, minimized, or being above/below threshold level(s)). In some examples, the system performance controller 108 includes one computation circuit 120. In some examples, the system performance controller 108 includes more than one computation circuit 120.

In some examples, the system performance controller 108 is a computing device having one or more memory devices 162 and one or more digital processors 164. The memory device(s) 162 include executable instructions that cause the digital processor(s) 164 to execute the operations of the system performance controller 108. In some examples, the system performance controller 108 includes one or more integrated circuits 166. In some examples, the system performance controller 108 includes one or more field-programmable gate arrays (FPGAs) 168. In some examples, the system performance controller 108 includes one or more state machines 170. In some examples, a computation circuit 120 (or multiple computation circuits 120) and the control manipulation module 130 are included on the same device (which may be included as part of an integrated product that includes the power supply controller 104 and the power stage 102, or external to an integrated product that includes the power supply controller 104 and the power stage 102). In some examples, a computation circuit 120 (or multiple computation circuits 120) are included on a first computing device, and the control manipulation module 130 are included in a second computing device. In some examples, the first computing device may be included in an integrated product (along with the power supply controller 104 and the power stage 102), and the second computing device may be external to the integrated product.

The system performance controller 108 may include an efficiency computation circuit 122 configured to compute the energy conversion efficiency 123 of the power stage 102 based on the measured conditions 103. In some examples, the efficiency computation circuit 122 continuously (e.g., periodically) computes the energy conversion efficiency 123 of the power stage 102 based on the measured conditions 103. For example, the system performance controller 108 receives the measured conditions 103 (e.g., in a digital format) from the metering circuit 106. The measured conditions 103 may include the input voltage, the input current, the output voltage, and the output current (e.g., transient or level). The efficiency computation circuit 122 computes the energy conversion efficiency 123 of the power stage 102 based on the input voltage, the input current, the output voltage, and the output current (e.g., $\eta=(V_{Out}*I_{Out})/(V_{in}*I_{in})$). In some examples, as explained later in the disclosure with respect to a power supply system having multiple power stages, the energy conversion efficiency 123 may be the overall efficiency 123B.

The control manipulation module 130 is configured to repeatedly modify, a control parameter 105 (or a set of control parameters 105) until the energy conversion efficiency 123 achieves a threshold condition (e.g., is maximized or equal to or greater than the threshold level). For example, in a first iteration, the control manipulation module 130 is configured to select a first value for the control parameter 105, and the control manipulation module 130 is configured to provide the first value to the power supply controller 104 such that the power stage 102 operates at the first value. The metering circuit 106 senses the measured conditions 103 (e.g., the input voltage, input current, output voltage, output current) of the power stage 102. The efficiency computation circuit 122 computes the energy conversion efficiency 123 of the power stage 102 that operates according to the first value.

If the energy conversion efficiency 123 is less than the threshold level, the control manipulation module 130 selects a second value for the control parameter 105, and the control manipulation module 130 provides the second value to the power supply controller 104 such that the power stage 102 operates according to the second value. Then, the metering circuit 106 senses the measured conditions 103 (e.g., input current, input voltage, output current, output voltage) of the power stage 102. The efficiency computation circuit 122 computes the energy conversion efficiency 123 of the power stage 102 operating at the second value. If the energy conversion efficiency 123 does not achieve the threshold condition, the control manipulation module 130 selects another value, and the process repeats until the energy conversion efficiency 123 achieves the threshold condition.

The system performance controller 108 may include a standby power computation circuit 124 configured to compute the standby power 125 based on the measured conditions 103. In some examples, the efficiency computation circuit 122 continuously (e.g., periodically) computes the standby power 125 of the power stage 102 based on the measured conditions 103. For example, the system performance controller 108 receives the measured conditions 103 (e.g., in a digital format) from the metering circuit 106. The measured conditions 103 may include the input voltage and the input current. The standby power computation circuit 124 computes the standby power 125 based on the input voltage and the input current (e.g., $V_{in}*I_{in}$). Then, the control manipulation module 130 is configured to repeatedly modify, a control parameter 105 (or a set of control parameters 105) until the standby power 125 is minimized or less than the threshold level.

In some examples, the computation circuit 120 may include one or more other computation circuits 120 such as a transient response computation circuit configured to compute the transient response metric, a THD computation circuit configured to compute the THD metric, an emission computation circuit configured to compute the emission metric, and/or a ripple communication circuit configured to compute the ripple metric. These other computation circuits 120 may execute in conjunction with the control manipulation module 130 to adjust one or more control parameters 105 to minimize or maximize a respective performance metric 101 in the same manner described above.

In some examples, the control manipulation module 130 iteratively modify the control parameter(s) 105 by selecting different values for the control parameter(s) 105 based on an artificial intelligence (AI) algorithm 132. For example, the control manipulation module 130 may execute the AI algorithm 132 (inputted with the historical data 140) to identify which value(s) of one or more control parameters 105 to select next. The historical data 140 may include data derived from the power supply system 100. For example, the historical data 140 may include information previously computed and/or derived by the system performance controller 108. In some examples, the historical data 140 may include the measured conditions 103, the control parameter(s) 105, and the computed performance metric(s) 101 for previous iterations performed by the system performance controller 108. In some examples, the historical data 140 may include data derived from other power supply systems (e.g., power supply system(s) that are similar to the power supply system 100).

The AI algorithm 132 may obtain a maximum weighted combination of the computed metrics (e.g., the efficiencies) for combinations of the environment conditions and the control parameters 105, and then selects the value(s) for the control parameter(s) 105 that correspond to the maximum weighted combination. In some examples, the AI algorithm 132 obtains the maximum weighted combination based on a predetermined minimization, targeting or maximizing each of the computed metrics.

In some examples, the AI algorithm 132 includes a targeted search algorithm 134. The targeted search algorithm 134 may be a search algorithm that selects a value for a control parameter 105 in a manner than obtains a targeted performance metric. In some examples, the AI algorithm 132 includes an applied learning algorithm 136 that defines a neural network 138 (inputted with the historical data 140) to predict value(s) for one or more control parameters 105. For example, according to the applied learning algorithm 136, the control manipulation module 130 is configured to apply the historical data 140 (e.g., also referred to as training data) to the neural network 138 to predict value(s) for one or more control parameters 105 that result in the performance metric 101 achieving the threshold condition.

The neural network 138 may be an interconnected group of nodes, each node representing an artificial neuron. The nodes are connected to each other in layers, with the output of one layer becoming the input of a next layer. Neural networks 138 transform an input, received by the input layer, transform it through a series of hidden layers, and produce an output via the output layer. Each layer is made up of a subset of the set of nodes. The nodes in hidden layers are fully connected to all nodes in the previous layer and provide their output to all nodes in the next layer. The nodes in a single layer function independently of each other (i.e., do not share connections). Nodes in the output provide the transformed input to the requesting process. In some examples, the neural network 138 is a convolutional neural network, which is a neural network that is not fully connected. Convolutional neural networks therefore have less complexity than fully connected neural networks. Convolutional neural networks can also make use of pooling or maxpooling to reduce the dimensionality (and hence complexity) of the data that flows through the neural network and thus this can reduce the level of computation required. This makes computation of the output in a convolutional neural network faster than in neural networks.

In some examples, the system performance controller 108 is used during the testing (or production) of the power stage 102 to select one or more control parameters 105 for a range of environment conditions that achieves a targeted performance metric 101 (or a set of performance metrics 101). For example, the system performance controller 108 may values for a control parameter 105 (or multiple control parameters 105) for an operating range (e.g., input voltage, supply voltage, temperature, output current, etc.) of the power stage 102 such that a monitored performance metric 101 (or multiple monitored performance metrics 101) can achieve a threshold condition.

With respect to a first environment condition (e.g., the input voltage having a value A), the system performance controller 108 may determine a certain first value for the control parameter 105 that results in the performance metric 101 achieving the threshold condition. With respect to a second environment condition (e.g., the input voltage having a value B), the system performance controller 108 may determine a certain second value for the control parameter 105 that results in the performance metric 101 achieving the threshold condition. In some examples, the system performance controller 108 determines the values for the control parameter 105 that result in the performance metric 101 achieving the threshold condition for the entire operating range of the power stage 102 (e.g., the range of input voltages operable with the power stage 102).

In some examples, the control parameters 105, the corresponding environment conditions, and the computed performance metrics 101 are stored at the power supply controller 104. For example, the power supply controller 104 may store the first value for control parameter 105 in conjunction with its corresponding environment condition (e.g., the input voltage A) and the corresponding computed performance metric 101. The power supply controller 104 may store the second value for the control parameter 105 in conjunction with its corresponding environment condition (e.g., the input voltage B) and the corresponding computed performance metric 101.

In some examples, in response to the power stage 102 being activated (e.g., turned-on) or while the power stage 102 is operating, the power supply controller 104 may detect the environment conditions (e.g., the input voltage) and apply the appropriate values for the control parameters 105. For example, the power supply controller 104 may receive one or more environment conditions such as input voltage, current sense, temperature, etc. If the power supply controller 104 detects an environment change, the power supply controller 104 may control the power stage 102 using the appropriate value for the control parameter 105.

In some examples, upon activation of the power stage 102 (e.g., the power stage 102 being turned-on), the power supply controller 104 may determine that the environment condition is the input voltage B. In this example, the power supply controller 104 may use the second value of the control parameter 105. Upon a subsequent activation, the power supply controller 104 may determine that the environment condition is the input voltage A. In this example, the power supply controller 104 may select the first value of the control parameter 105.

In some examples, the system performance controller 108 is configured to continuously (e.g., periodically) monitor the performance metric(s) 101 during the system's lifetime and update one or more control parameters 105 such that the performance metric(s) 101 continue to achieve their threshold conditions. In some examples, the system performance controller 108 is configured to execute the control manipulation module 130 to update one or more control parameters 105 in response to a trigger event. In some examples, the triggering event includes activation of the power stage 102. In some examples, the triggering event includes detection of an expiration of a timer. In some examples, the triggering event includes detection of a change to one or more environment conditions. In some examples, the trigger event includes the detection of the performance metric 101 not achieving the threshold condition.

For example, the system performance controller 108 is configured to execute periodically at fixed time intervals or based on predefined events such as changes to the environment conditions, activations, low performance metric(s), etc. For example, during the operations of the power stage 102, the system performance controller 108 monitors the environment conditions, and if one or more of the environment conditions changes by more than a threshold amount, the system performance controller 108 is configured to execute to re-evaluate the control parameters 105 in view of the monitored performance metric 101, and then provide the update value(s) to the power supply controller 104.

Figure 2:
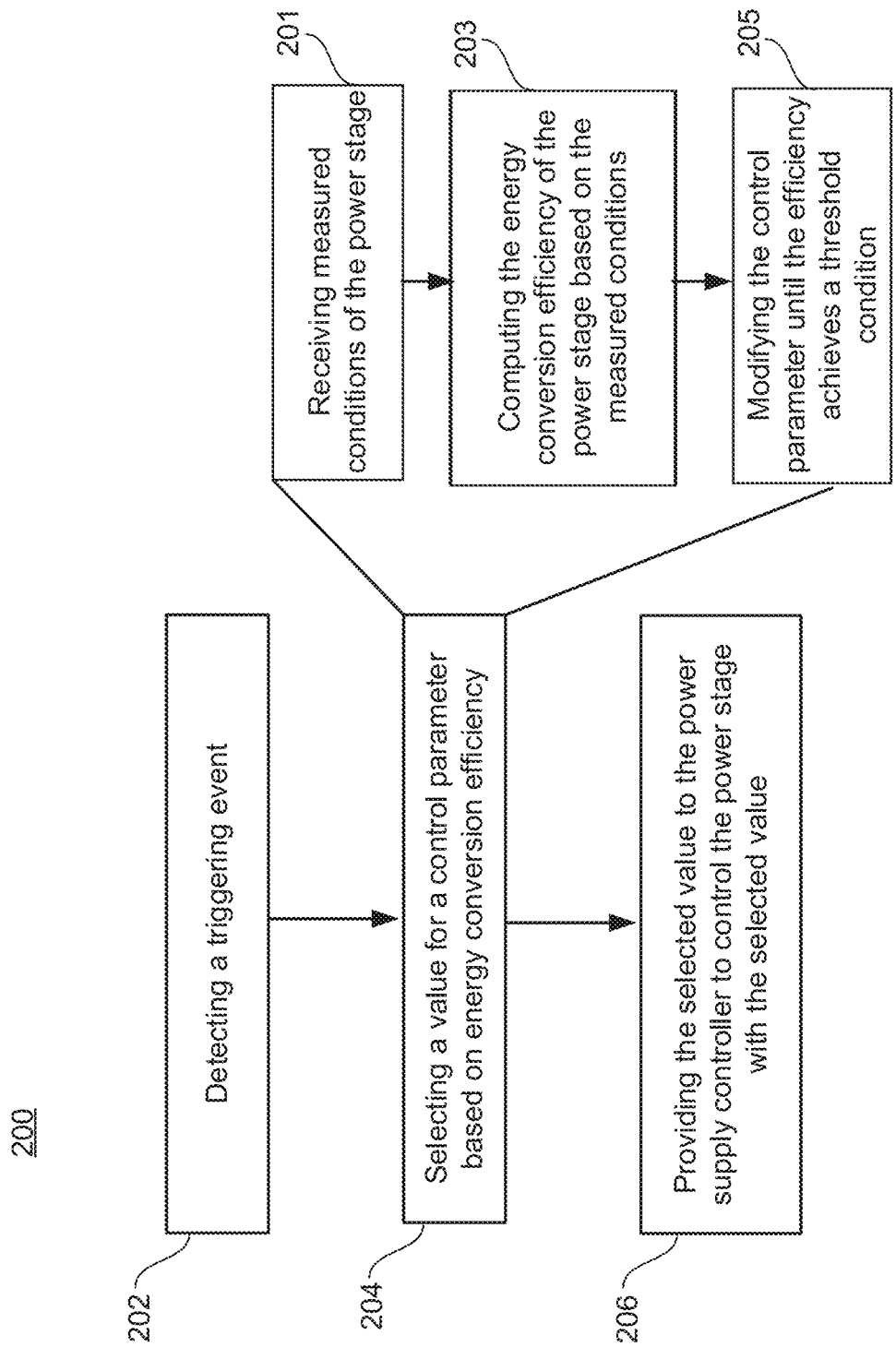
FIG. 2 illustrates a flowchart depicting example operations of a system performance controller according to an aspect.

FIG. 2 illustrates a flowchart 200 depicting example operations of the system performance controller 108 according to an aspect. In the example of FIG. 2, the system performance controller 108 includes the efficiency computation circuit 122 configured to monitor and compute the energy conversion efficiency 123, and the control manipulation module 130 configured to manipulate one or more control parameters 105 according to the AI algorithm 132. In some examples, the system performance controller 108 is configured to monitor the energy conversion efficiency 123 and update one or more control parameters 105 in response to a triggering event such that the energy conversion efficiency 123 is optimized or maintains or improves over time.

In operation 202, the system performance controller 108 detects a triggering event. In some examples, the triggering event include activation of the power stage 102. In some examples, the triggering event includes detection of an expiration of a timer. In some examples, the triggering event includes detection of a change to one or more environment conditions (e.g., a change to the input voltage). In some examples, the triggering event includes detection of the energy conversion efficiency 123 not achieving the threshold condition.

In operation 204, the system performance controller 108 selects a value for the control parameter 105 based on the energy conversion efficiency 123 (e.g., such that the energy conversion efficiency 123 is maximized). In some examples, the control parameter 105 is a ZVS control parameter 142 that controls ZVS. In some examples, the control parameter 105 is dead time 144 such that the energy conversion efficiency 123 is maximized while not cross-conducting. In some examples, the control parameter 105 is pulse width 146, duty cycle 148, switching frequency 150, a skip cycle parameter 152, or an I/O condition 161.

For example, in operation 201, the system performance controller 108 receives measured conditions 103 of the power stage 102. The measured conditions 103 include the input voltage, the input current, the output voltage, and the output current. In some examples, the system performance controller 108 receives the measured conditions 103 from a metering circuit 106. In some examples, the metering circuit 106 converts the input voltage, the input current, the output voltage, and the output current to a DC format. In some examples, the metering circuit 106 includes one or more ADCs 116. In some examples, the metering circuit 106 includes one or more multiplexers 118.

In operation 203, the efficiency computation circuit 122 computes the energy conversion efficiency 123 of the power stage 102 based on the measured conditions 103 (e.g., $(V_{OUT}*I_{OUT})/(V_{IN}*I_{IN})$. In operation 205, the control manipulation module 130 modifies the control parameter 105 until the energy conversion efficiency 123 achieves the threshold condition (e.g., is maximized or is equal to or greater than the threshold level). In some examples, the control manipulation module 130 selects a first value for the control parameter 105 and sends the first value to the power supply controller 104. Then, the efficiency computation circuit 122 computes the energy conversion efficiency 123 of the power stage 102 that operates according to the first value based on the measured conditions 103. Then, the control manipulation module 130 modifies the first value to obtain a second value in response to the energy conversion efficiency 123 not achieving the threshold condition, and sends the second value to the power supply controller 104. Then, the efficiency computation circuit 122 computes the energy conversion efficiency 123 of the power stage 102 that operates according to the second value based on the measured conditions 103.

In some examples, the control manipulation module 130 modifies the control parameter 105 using the AI algorithm 132. In some examples, the AI algorithm 132 is the targeted search algorithm 134. In some examples, the AI algorithm is the applied learning algorithm 136. In some examples, the control manipulation module 130 applies historical data 140 to the neural network 138 to predict a value for the control parameter 105 that results in the energy conversion efficiency 123 achieving the threshold condition. In some examples, the system performance controller 108 determines a first value of the control parameter 105 that results in the energy conversion efficiency 123 achieving the threshold condition for a first environment condition, and determine a second value of the control parameter 105 that results in the energy conversion efficiency 123 achieving the threshold condition for a second environment condition. In some examples, the first and second environment conditions are different voltages.

In operation 206, the system performance controller 108 provides the selected value to the power supply controller 104 to control the power stage 102 with the selected value. In some examples, the selected value is stored in a program memory at the power supply controller 104. In some examples, the system performance controller 108 updates the program memory with the selected value.

Figure 3:
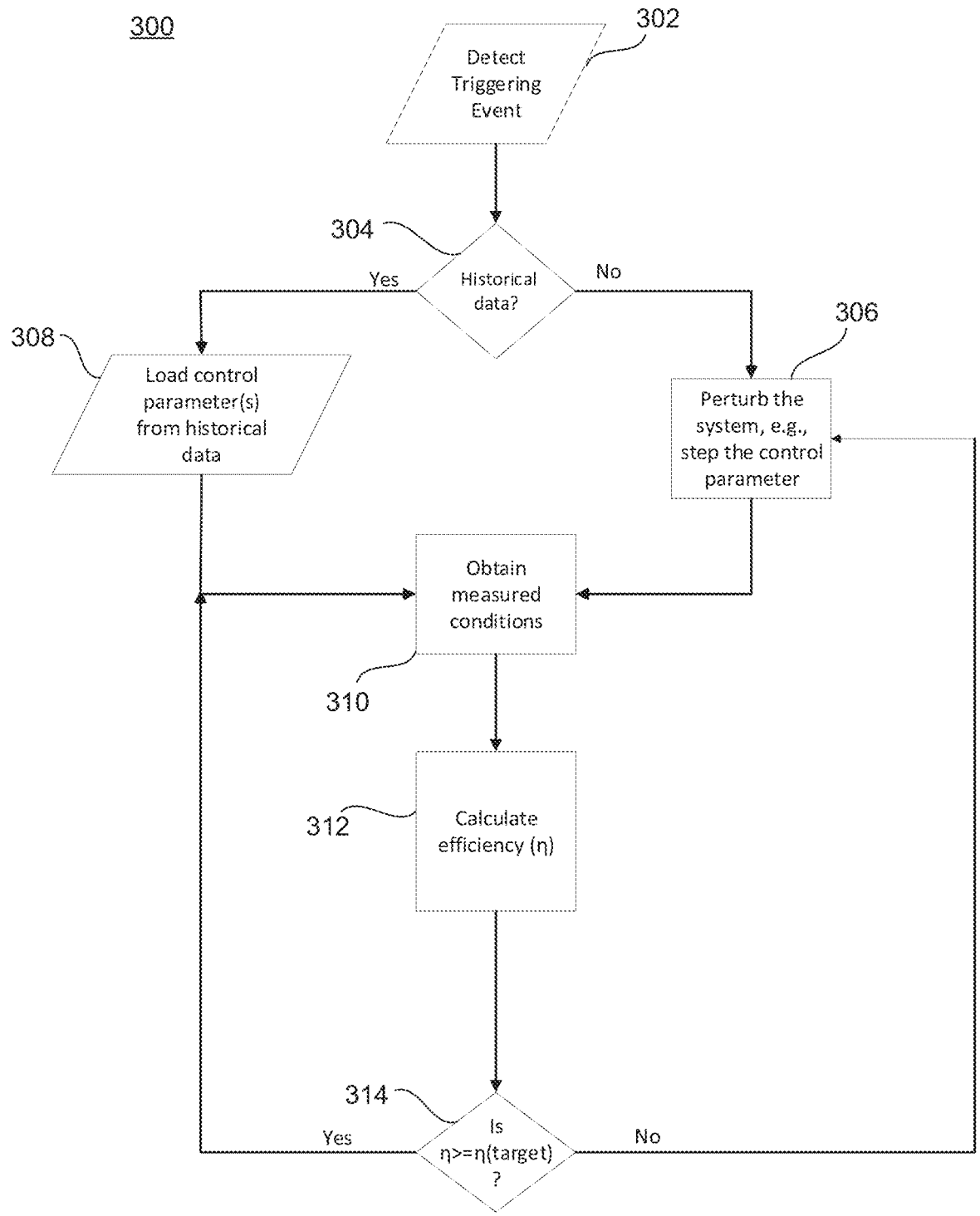
FIG. 3 illustrates a flowchart depicting example operations of a power supply system according to an aspect.

FIG. 3 illustrates a flowchart 300 depicting example operations of the system performance controller 108 according to an aspect. Although the flowchart 300 illustrates the operations of the system performance controller 108 using the energy conversion efficiency 123 as the monitored performance metric 101, the operations of FIG. 3 may be applied to any performance metric 101. As shown in FIG. 3, the system performance controller 108 may continuously monitor the energy conversion efficiency 123 of the power stage 102, and if the energy conversion efficiency 123 of the power stage 102 does not meet a threshold condition (e.g., is not maximized or falls below a threshold condition), the system performance controller 108 may perturb the power supply system 100 to step through values of a control parameter 105 to set or adjust the value of the control parameter 105 that results in the energy conversion efficiency 123 achieving the threshold condition.

In operation 302, the system performance controller 108 may detect a triggering event. In some examples, the triggering event includes detection of the activation of the power stage 102. In some examples, the triggering event includes the detection of a change to one or more environment conditions. In some examples, the triggering event includes the detection of the energy conversion efficiency 123 not achieving the threshold condition.

In operation 304, the system performance controller 108 may determine whether the system performance controller 108 includes historical data 140. In some examples, the historical data 140 include value(s) for the control parameter(s) 105. In some examples, during a previous execution of the system performance controller 108, the system performance controller 108 may have already determined the values that result in the energy conversion efficiency 123 achieving the threshold condition using the efficiency computation circuit 122 and the control manipulation module 130, and these already optimized control parameter(s) 105 are stored in the historical data 140. Also, it is noted that the historical data 140 may include already optimized control parameter(s) 105 from AI learning.

If the system performance controller 108 includes the historical data 140 (Yes), in operation 308, the system performance controller 108 loads the control parameter(s) 105 from the historical data 140. For example, the system performance controller 108 may provide the control parameter(s) 105 to the power supply controller 104. If the system performance controller 108 does not include the historical data 140 (No), in operation 306, the control manipulation module 130 is configured to perturb the system, e.g., step through values of a control parameter 105. Alternatively, if the system performance controller 108 includes the historical data 140, and after the system performance controller 108 loads the control parameter(s) 105 from the historical data 140, the process proceeds to operation 306. In operation 306, the control manipulation module 130 selects a first value (e.g., using the AI algorithm 132) and provides the first value to the power supply controller 104 to operate the power stage 102 according to the first value. The system performance controller 108 obtains the measured conditions 103 from the metering circuit 106. For example, the measured conditions 103 include the input voltage, input current, output voltage, and output current.

In operation 312, the efficiency computation circuit 122 computes the energy conversion efficiency 123. For example, the efficiency computation circuit 122 computes the energy conversion efficiency 123 of the power stage 102 based on the measured conditions 103 (e.g., $(V_{OUT}*I_{OUT})/(V_{IN}*I_{IN})$). In operation 314, the system performance controller 108 determines whether the energy conversion efficiency 123 achieves the threshold condition. In some examples, the system performance controller 108 determines whether the energy conversion efficiency 123 is maximized using the AI algorithm 132. In some examples, the system performance controller 108 determines whether the energy conversion efficiency 123 is greater than or equal to a targeted level. If no, the process returns to operation 306 to select another value for the control parameter 105 using the AI algorithm 132.

Figure 4:
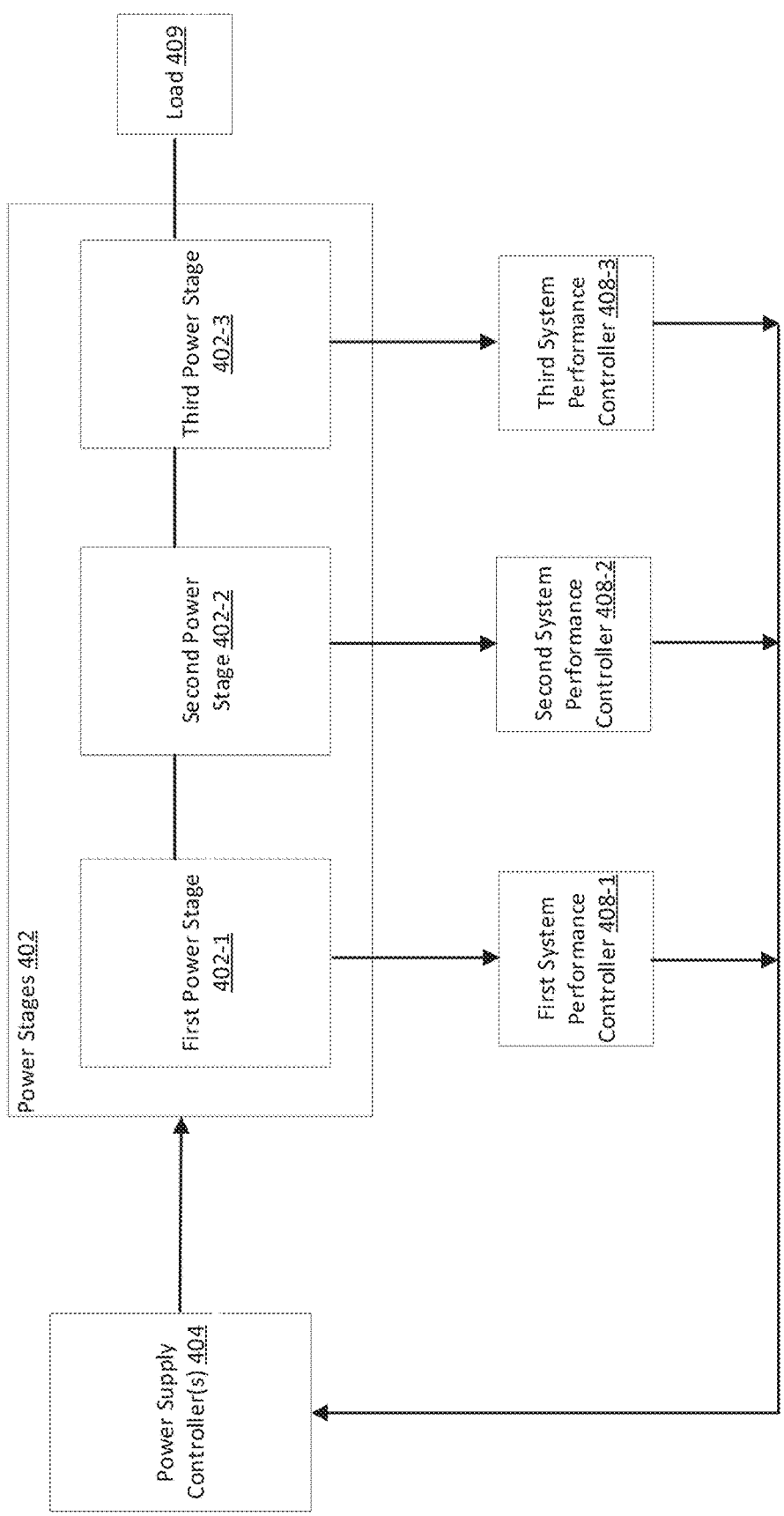
FIG. 4 illustrates a power supply system having a plurality of system performance controllers and a plurality of power stages connected in series according to an aspect.

FIG. 4 illustrates a power supply system 400 having multiple power stages 402 connected in series with each other. For example, the power stages 402 include a first power stage 402-1, a second power stage 402-2, and a third power stage 402-3 coupled to a load 409. Although FIG. 4 illustrates three power stages 402, the power supply system 400 may include any number of power stages 402 such as two power stages 402 or more than three power stages 402. In some examples, the power supply system 400 includes a power supply controller 404 configured to control each of the power stages 402. In some examples, the power supply system 400 includes a separate power supply controller 404 for each of the power stages 402.

Each of the power stage 402 is associated with a separate system performance controller. For example, the power supply system 400 includes a first system performance controller 408-1 configured to optimize the first power stage 402-1, a second system performance controller 408-2 configured to optimize the second power stage 402-2, and a third system performance controller 408-3 configured to optimize the third power stage 402-3. A separate metering circuit may be included within (or coupled to) each power stage 402.

Figure 5:
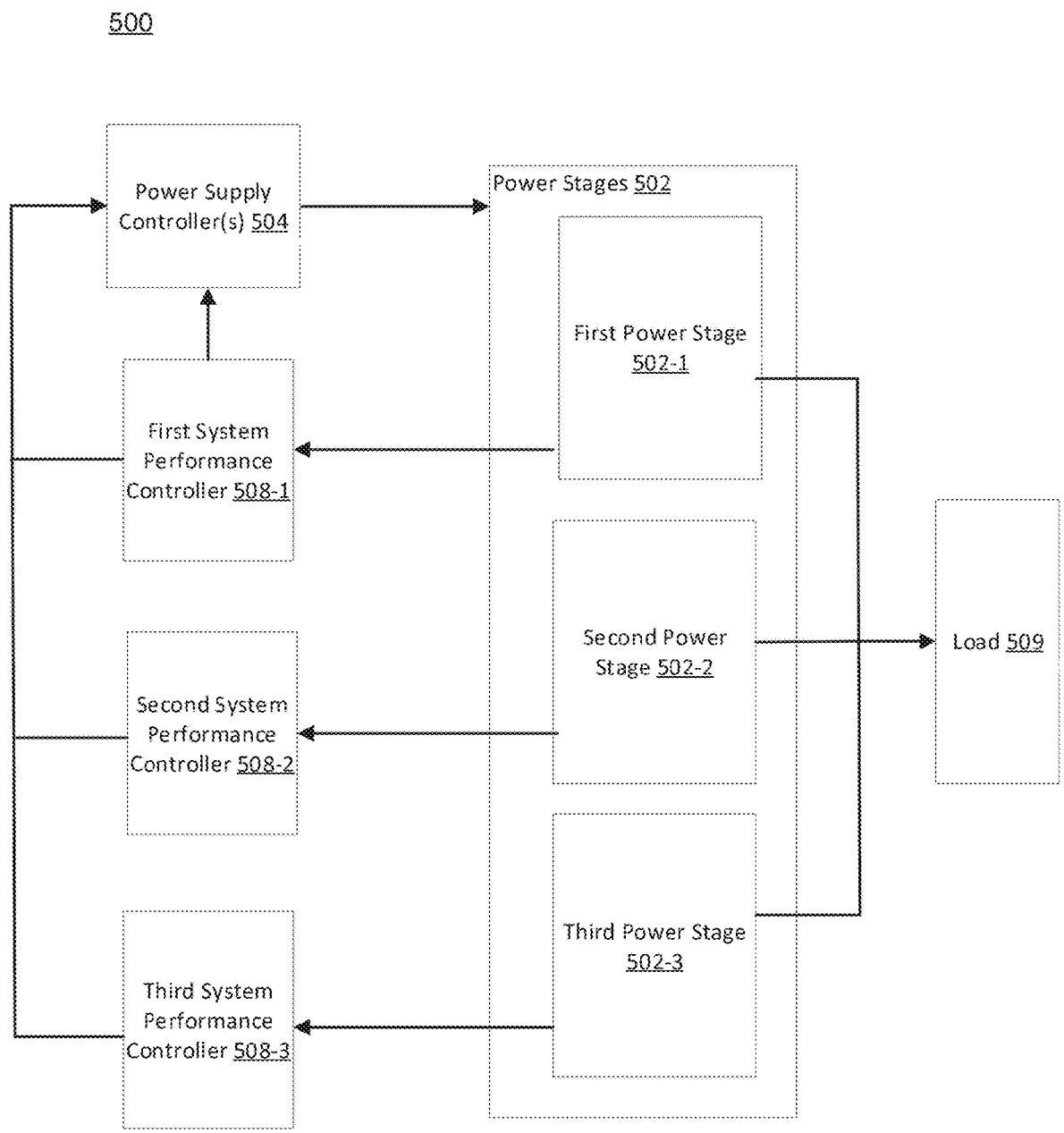
FIG. 5 illustrates a power supply system having a plurality of system performance controllers and a plurality of power stages connected in parallel according to an aspect.

FIG. 5 illustrates a power supply system 500 having multiple power stages 502 connected in parallel with each other. For example, the power stages 502 include a first power stage 502-1, a second power stage 502-2, and a third power stage 502-3 coupled to a load 509. Although FIG. 5 illustrates three power stages 502, the power supply system 500 may include any number of power stages 502 such as two power stages 502 or more than three power stages 502. In some examples, the power supply system 500 includes a power supply controller 504 configured to control each of the power stages 502. In some examples, the power supply system 500 includes a separate power supply controller 504 for each of the power stages 502.

Each of the power stage 502 is associated with a separate system performance controller. For example, the power supply system 500 includes a first system performance controller 508-1 configured to optimize the first power stage 502-1, a second system performance controller 508-2 configured to optimize the second power stage 502-2, and a third system performance controller 508-3 configured to optimize the third power stage 502-3. A separate metering circuit may be included within (or coupled to) each power stage 502.

Figure 6:
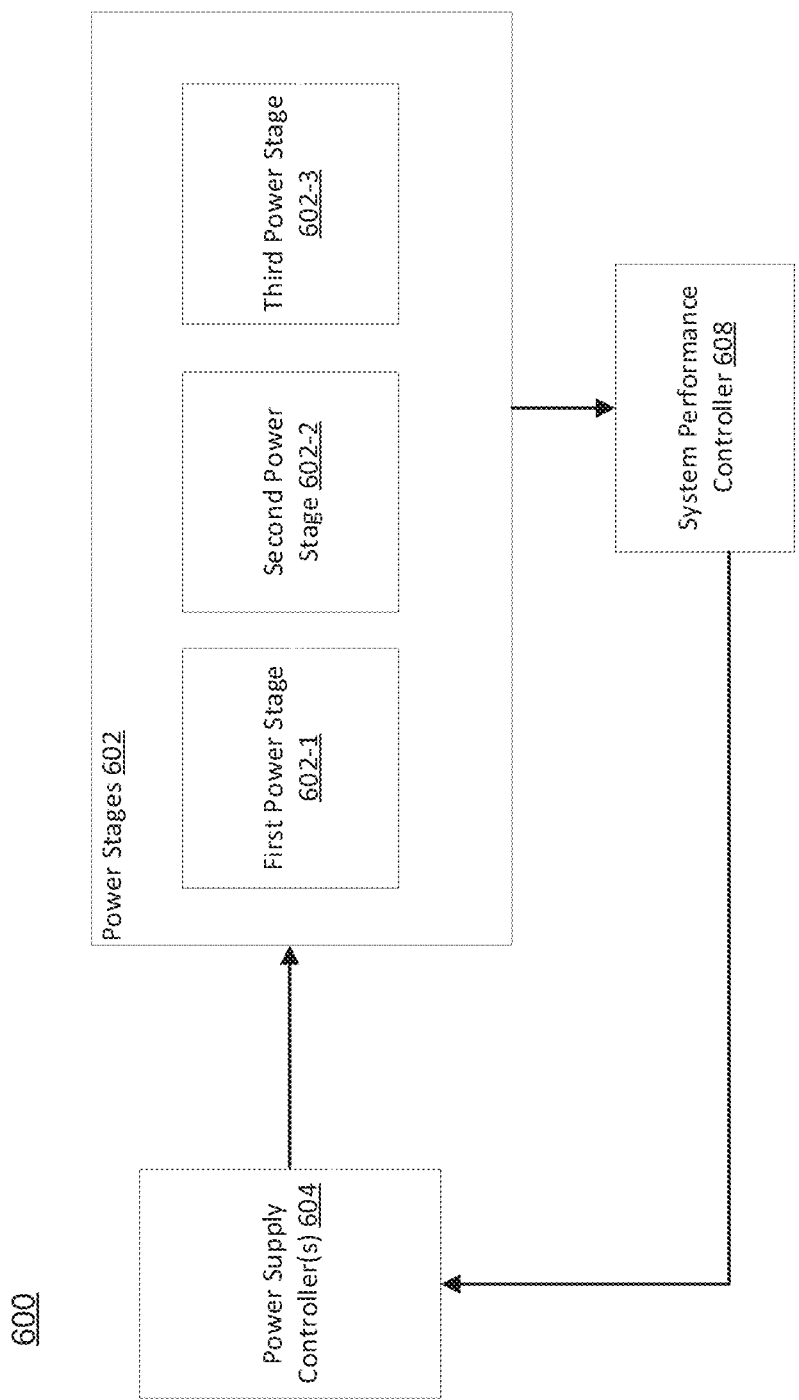
FIG. 6 illustrates a power supply system having a system performance controller and a plurality of power stages according to an aspect.

FIG. 6 illustrates a power supply system 600 having multiple power stages 602 with a single system performance controller 608 according to an aspect. For example, the power stages 602 include a first power stage 602-1, a second power stage 602-2, and a third power stage 602-3. In some examples, the power stages 602 are coupled in series with respect to each other. In some examples, the power stages 602 are coupled in parallel with respect to each other. Although FIG. 6 illustrates three power stages 602, the power supply system 600 may include any number of power stages 602 such as two power stages 602 or more than three power stages 602. In some examples, the power supply system 600 includes a power supply controller 604 configured to control each of the power stages 602. In some examples, the power supply system 600 includes a separate power supply controller 604 for each of the power stages 602.

In some examples, the system performance controller 608 is configured to individually optimize the performance for each power stage 602. For example, referring to FIGS. 1A, 1B, and 6, the system performance controller 608 is configured to set or adjust a control parameter 105 (or multiple control parameter 105) for each power stage 602 such that each power stage 502 achieves a targeted a performance metric 101 (or multiple performance metrics 101). If the monitored performance metric 101 is energy conversion efficiency 123, the system performance controller 108 is configured to compute the energy conversion efficiency 123 of the first power stage 602-1 and adjust one or more control parameters 105 for the first power stage 602-1 until the energy conversion efficiency 123 achieves the threshold condition. The system performance controller 608 is configured to separately monitor the energy conversion efficiency 123 of the second power stage 602-2 (and make any adjustments to one or more of its control parameters 105), and separately monitor the energy conversion efficiency 123 of the third power stage 602-3 (and make any adjustments to one of more of its control parameters 105).

In some examples, the system performance controller 608 is configured to monitor the overall efficiency 123B of the power stages 602, and then adjust one or more control parameters 105 for one or more of the power stages 602 until the overall efficiency 123B achieves the threshold condition. For example, the system performance controller 608 may receive the input voltage, and the input current, which are the inputs to the power stages 602. Also, the system performance controller 608 may receive output voltage, and the output current, which are the outputs of the power stages 602. The system performance controller 108 is configured to adjust one or more control parameters 105 for one or more of the power stages 602 until the overall efficiency 123B achieves the threshold condition.

Figure 7:
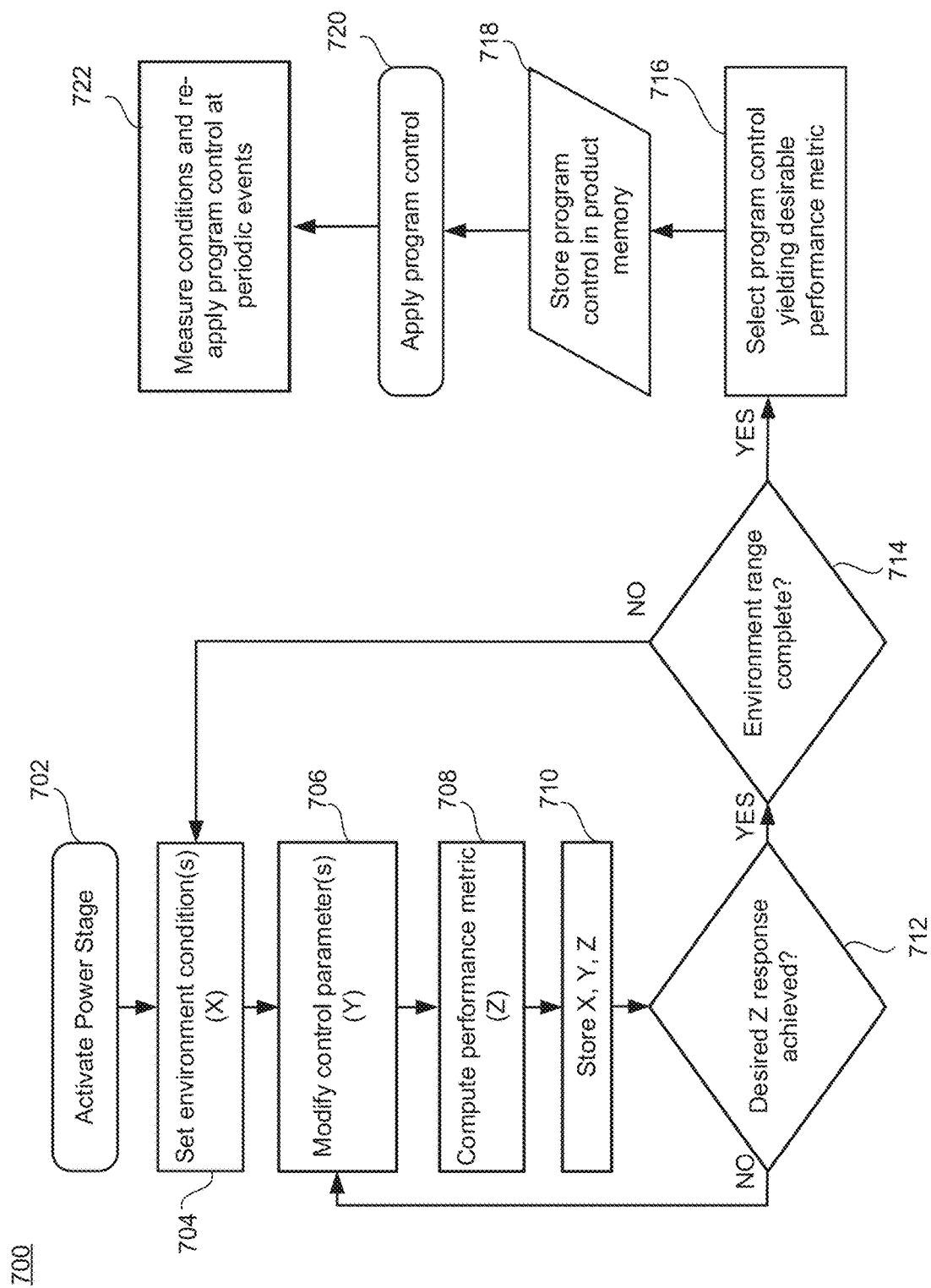
FIG. 7 illustrates a flowchart depicting example operations of a system performance controller using a targeted search algorithm according to an aspect.

FIG. 7 illustrates a flowchart 700 depicting example operations of the power supply system 100 according to an aspect. Although the flowchart 700 of FIG. 7 is described with respect to the power supply system 100, the operations of FIG. 7 may be applicable to any of the power supply systems discussed herein. In some examples, the control parameters 105 are set using the system performance controller 108, and then stored at the power supply controller 104. The system performance controller 108 may execute some of the operations of FIG. 7 using the targeted search algorithm 134. The power supply controller 104 periodically measures the environment conditions and applies the appropriate control parameter 105 to the power stage 102. In some examples, the system performance controller 108 is configured to initiate the operations of FIG. 7 during the development, testing, and/or production of the power supply system. In some examples, the system performance controller 108 is configured to initiate the operations of FIG. 7 in response to the power stage 102 being activated.

In some examples, the performance metric 101 is the energy conversion efficiency 123. In some examples, the energy conversion efficiency 123 is the individual efficiency 123A. In some examples, the energy conversion efficiency 123 is the overall efficiency 123B. In some examples, the performance metric 101 is the standby power 125. In some examples, the performance metric 101 is the THD metric, the ripple metric, the emission metric, or the transient response metric. The control parameters 105 may be any of the above-described parameters for controlling the power stage 102.

In some examples, the system performance controller 108 is configured to provide the first value to the power supply controller 104 such that the power stage 102 operates according to the first value. In operation 708, the computation circuit 120 is configured to compute the performance metric 101. For example, the system performance controller 108 receives the measured conditions 103 from the metering circuit 106 and computes the performance metric 101 (e.g., the energy conversion efficiency 123). In operation 710, the system performance controller 108 stores the environment condition(s), the first value of the control parameter 105, and the computed performance metric 101.

In operation 712, the system performance controller 108 determines whether a desired Z response is achieved, e.g., whether the performance metric 101 achieves a threshold condition (e.g., is maximized, minimized, or greater/less than the threshold level). If no, the operations return to operation 706, and the control manipulation module 130 selects a second value for the control parameter 105 based on the targeted search algorithm 134. If yes, in operation 714, the system performance controller 108 determines if the environment range is complete, e.g., whether the range of the environment condition have been tested. If no, the system performance controller 108 directs the process back to operation 704 to set another value for the environment condition. For example, the system performance controller 108 may select input voltage B as the environment condition, and then modify the values of the control parameter 105 until the performance metric 101 achieves the threshold condition. If yes, the process proceeds to operation 716.

In operation 716, the program control yielding the desirable performance metric 101 may be selected (e.g., selecting the value(s) of the control parameter 105 that results in the performance metric 101 achieving the threshold condition for the environment range). For instance, the program control may include the values of the control parameter 105 and the corresponding environment conditions that resulted in the performance metric 101 achieving the threshold condition.

In operation 718, the program control may be stored in the product memory of the power supply controller 104. In operation 720, the power supply controller 104 applies the program control to the power stage 102. In operation 722, in some examples, the power supply controller 104 measures the environment conditions, and applies the program control at periodic intervals. In some examples, periodic intervals may refer to only once, or more than once as a function of more than one event such as power cycles to ensure effective coverage.

For example, the power supply controller 104 may receive one or more environment conditions such as input voltage, current sense, temperature, etc. If the power supply controller 104 detects an environment change, the power supply controller 104 may control the power stage 102 using the appropriate value for the control parameter 105. For example, upon activation of the power stage 102 (e.g., the power stage 102 being turned-on), the power supply controller 104 may determine that the environment condition is the input voltage B. In this example, the power supply controller 104 may use the appropriate value for the control parameter 105. Upon a subsequent activation, the power supply controller 104 may determine that the environment condition is the input voltage A, and the power supply controller 104 may select the appropriate value for the control parameter 105.

Figure 8:
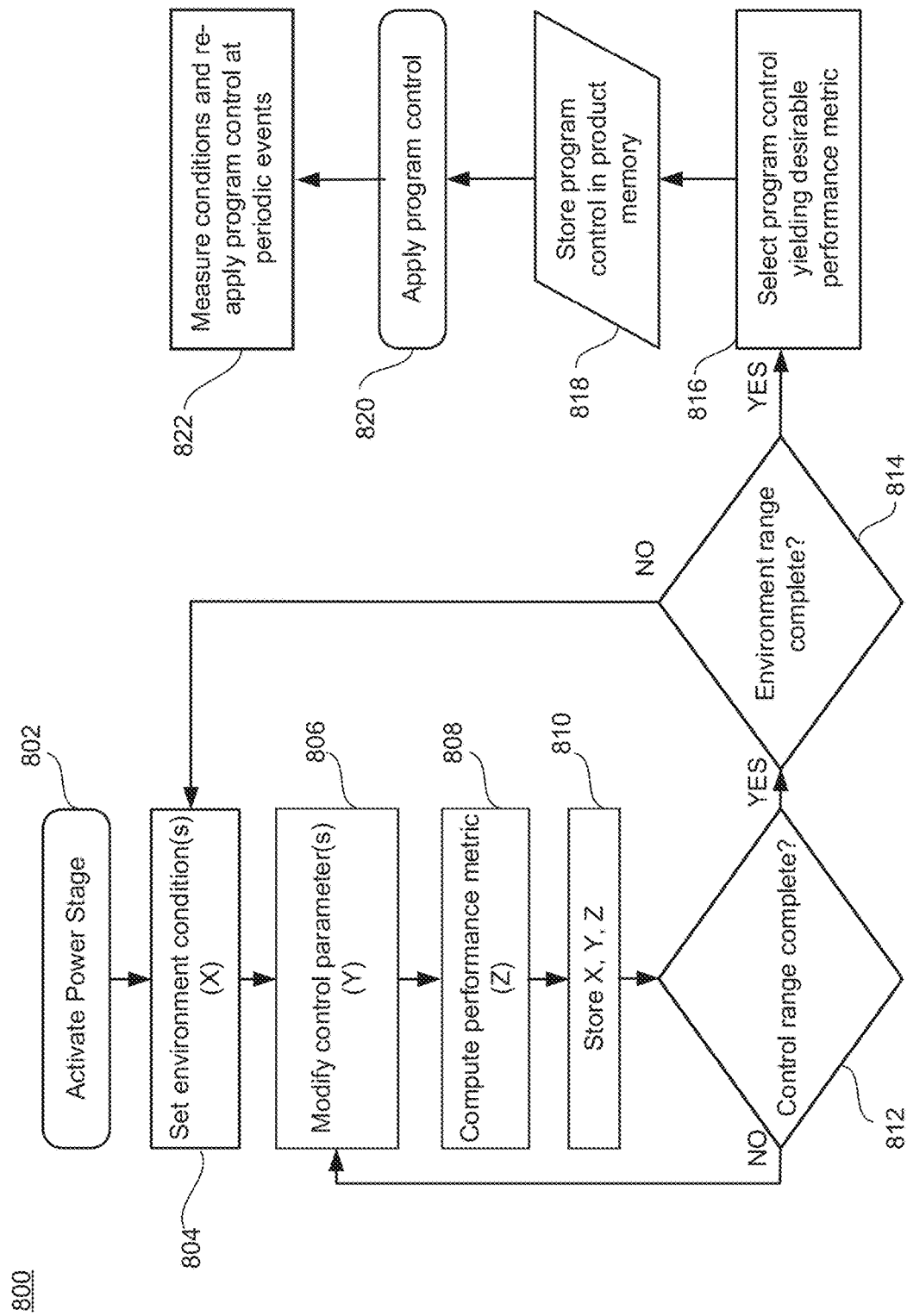
FIG. 8 illustrates a flowchart depicting example operations of a system performance controller using an applied learning algorithm according to an aspect.

FIG. 8 illustrates a flowchart 800 depicting example operations of the power supply system 100 according to an aspect. Although the flowchart 800 of FIG. 8 is described with respect to the power supply system 100, the operations of FIG. 8 may be applicable to any of the power supply systems discussed herein. The flowchart 800 of FIG. 8 may be similar to the flowchart 700 of FIG. 7 except that the flowchart 800 of FIG. 8 uses the applied learning algorithm 136. The operations of FIG. 8 may include any of the features described with reference to FIG. 7. In some examples, the system performance controller 108 is configured to initiate the operations of FIG. 8 during the development, testing, and/or production of the power supply system 100. In some examples, the system performance controller 108 is configured to initiate the operations of FIG. 8 in response to the power stage 102 being activated (e.g., turned-on).

With respect to the operations of FIG. 8, in some examples, the performance metric 101 is the energy conversion efficiency 123. In some examples, the energy conversion efficiency 123 is the individual efficiency 123A. In some examples, the energy conversion efficiency 123 is the overall efficiency 123B. In some examples, the performance metric 101 is the standby power 125. In some examples, the performance metric 101 is the THD metric, the ripple metric, the emission metric, or the transient response metric. The control parameters 105 may be any of the above-described parameters for controlling the power stage 102.

In operation 802, the power stage 102 is activated (e.g., initial power on). In operation 804, the system performance controller 108 sets one or more environment conditions. In operation 806, the control manipulation module 130 modifies a value for the control parameter 105 using the applied learning algorithm 136. Although the flowchart 800 depicts the modification of a single control parameter 105, the control manipulation module 130 may set and modify multiple different control parameters 105. The control parameter 105 may have a control range that defines a range of values. The control manipulation module 130 may select a first value within the control range (e.g., a certain value of a ZVS control parameter 142). In some examples, the system performance controller 108 is configured to provide the first value to the power supply controller 104 such that the power stage 102 operates according to the first value. In operation 808, the computation circuit 120 computes the performance metric 101. For example, the computation circuit 120 receives the measured conditions 103 from the metering circuit 106 and computes the performance metric 101 (e.g., the energy conversion efficiency 123). In operation 810, the system performance controller 108 stores the environment condition(s), the value of the control parameter 105, and the computed performance metric 101.

In operation 812, the system performance controller 108 determines whether the control range of the control parameter 105 is complete. If no, the process returns to operation 806, the control manipulation module 130 selects another value of the control parameter 105 using the applied learning algorithm 136. If yes, in operation 814, the system performance controller 108 determines whether the environment range is complete, e.g., whether the range of the environment conditions have been tested. If no, the system performance controller 108 directs the process back to operation 804 to set another value for the environment condition. For example, the control manipulation module 130 may select another value for the environment condition, and then modify the values of the control parameter 105 for its control range. If yes, the process proceeds to operation 816.

In operation 816, the program control yielding the desirable performance metric may be selected (e.g., selecting the value(s) of the control parameter 105 that results in the best performance metric for the environment range). For instance, the program control may include the values of the control parameter 105 and the corresponding environment conditions that optimized the performance metric 101. In operation 818, the program control may be stored in the product memory of the power supply controller 104. In operation 820, the power supply controller 104 applies the program control to the power stage 102. In operation 822, in some examples, the power supply controller 104 measures the environment conditions, and applies the program control at periodic intervals as discussed with reference to the flowchart 700 of FIG. 7.

Figure 9A:
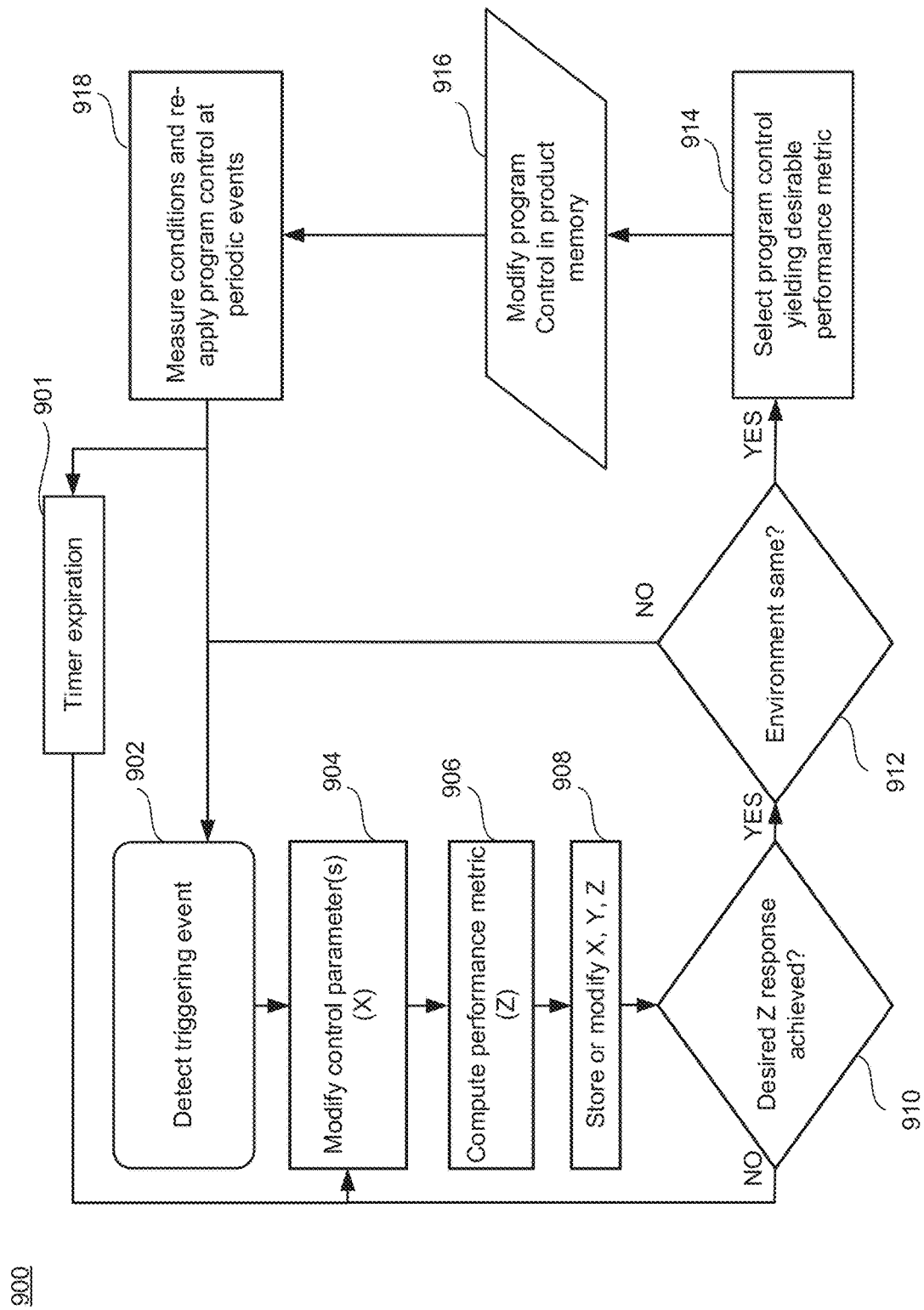
FIG. 9A illustrates a flowchart depicting example operations of a system performance controller using a targeted search algorithm according to another aspect.

FIG. 9A illustrates a flowchart 900 depicting example operations of the power supply system 100 according to another aspect. Although the flowchart 900 of FIG. 9A is described with respect to the power supply system 100, the operations of FIG. 9A may be applicable to any of the power supply systems discussed herein. The flowchart 900 of FIG. 9A may be similar to the flowchart 700 of FIG. 7 (e.g., both use the targeted search algorithm 134) except that the flowchart 900 depicts a continuous learning example.

With respect to the operations of FIG. 9A, in some examples, the performance metric 101 is the energy conversion efficiency 123. In some examples, the energy conversion efficiency 123 is the individual efficiency 123A. In some examples, the energy conversion efficiency 123 is the overall efficiency 123B. In some examples, the performance metric 101 is the standby power 125. In some examples, the performance metric 101 is the THD metric, the ripple metric, the emission metric, or the transient response metric. The control parameters 105 may be any of the above-described parameters for controlling the power stage 102.

In FIG. 9A, the initiation of the operations may be event driven and/or periodically driven. In operation 902, the system performance controller 108 may detect a triggering event. In some examples, the triggering event includes the power stage 102 being activated. In some examples, the triggering event occurs during the operations of the power stage 102. For example, while the power stage 102 is executing, the system performance controller 108 may detect an environment change. In some examples, while the power stage 102 is executing, the system performance controller 108 may continuously (e.g., periodically) compute the performance metric 101, and, in response to the performance metric 101 not achieving the threshold condition, the system performance controller 108 may detect the trigger event. In some examples, the system performance controller 108 monitors a timer, and, in operation 901, upon the detection of the timer expiration, the system performance controller 108 is configured to trigger the operations of FIG. 9A.

Upon the detection of the triggering event or the expiration of the timer, in operation 904, the control manipulation module 130 modifies a value for the control parameter 105 using the targeted search algorithm 134. Although the flowchart 900 depicts the modification of a single control parameter 105, the control manipulation module 130 may set and modify multiple different control parameters 105. In some examples, the control parameter 105 may have a control range that defines a range of values. The control manipulation module 130 may select a value within the control range (e.g., a certain value of a ZVS control parameter 142). In some examples, the system performance controller 108 provides the value to the power supply controller 104 such that the power stage 102 operates according to the first value. In operation 906, the computation circuit 120 computes the performance metric 101. For example, the computation circuit 120 receives the measured conditions 103 from the metering circuit 106 and computes the performance metric 101 (e.g., the energy conversion efficiency 123). In operation 908, the system performance controller 108 stores or modifies the environment condition(s), the value of the control parameter 105, and the computed performance metric 101. In some examples, the system performance controller 108 updates the historical data 140 with the environment condition(s), the value of the control parameter 105, and the computed performance metric 101.

In operation 910, the system performance controller 108 determines whether a desired Z response is achieved, e.g., whether the performance metric 101 achieves a threshold condition (e.g., is maximized or is equal to or greater than the threshold level). If no, the operations return to operation 904, and the control manipulation module 130 selects another value for the control parameter 105 based on the targeted search algorithm 134. If yes, in operation 912, the system performance controller 108 determines if the environment is the same. For example, the system performance controller 108 may determine if one or more environment conditions has changed (e.g., indicating that the power stage 102 has not stabilized). If one or more environment conditions has changed, the system performance controller 108 directs the process back to operation 902 to wait until stabilization is detected.

In response to the environment conditions being detected as the same or similar, in operation 914, the system performance controller 108 selects the program control yielding the desirable performance metric (e.g., selecting the value(s) of the control parameter 105 that results in the performance metric 101 achieving the threshold condition). For instance, the program control may include the value of the control parameter 105 that results in the performance metric 101 achieving the threshold condition, and the corresponding environment conditions. In operation 916, the system performance controller 108 may update the product memory of the power supply controller 104 with the selected program control. In operation 918, in some examples, the power supply controller 104 measures the environment conditions, and applies the program control at periodic intervals. In some examples, in the learning example, periodic events may be triggered by environmental changes and measured after system stabilization, in addition to intervals as noted in the flowchart 700 and 800 of FIGS. 7 and 8.

Figure 9B:
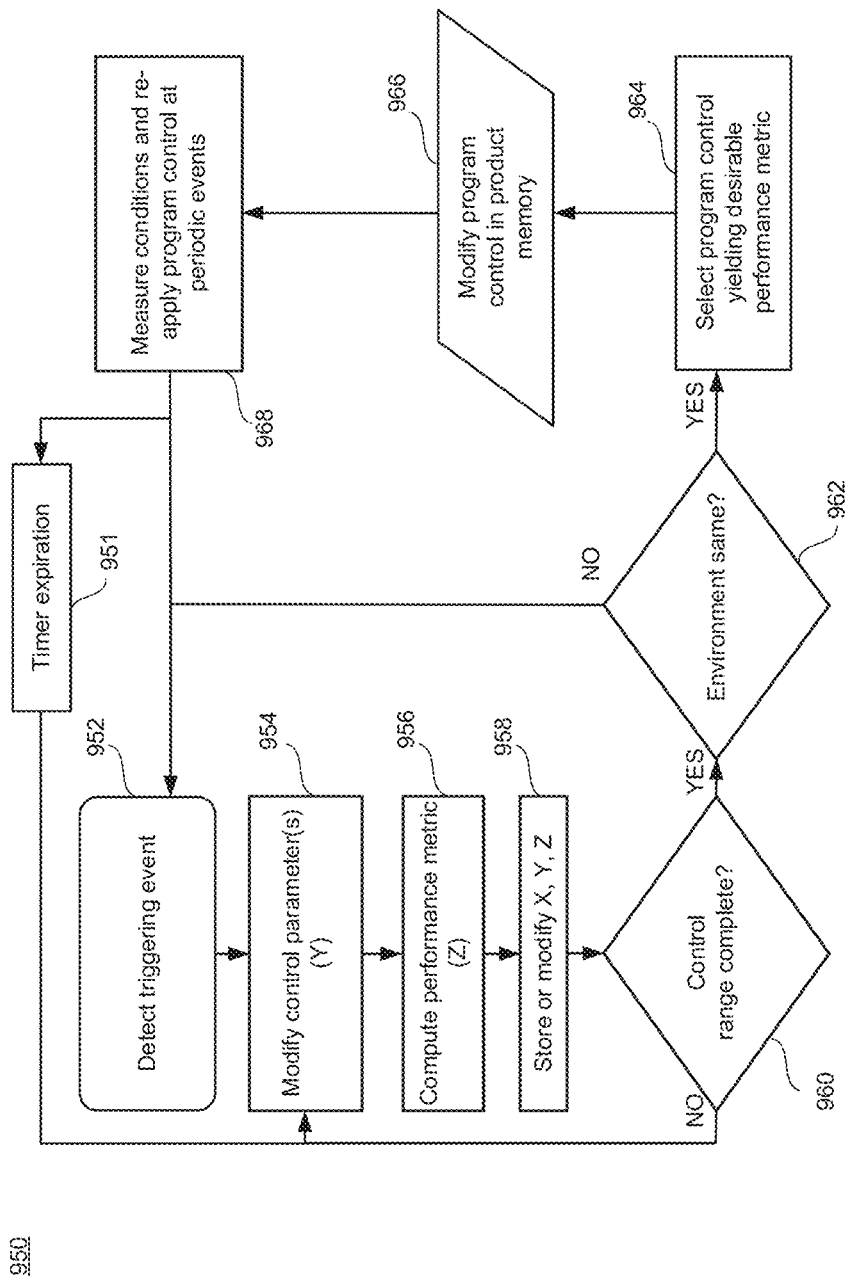
FIG. 9B illustrates a flowchart depicting example operations of a system performance controller using an applied learning algorithm according to another aspect.

FIG. 9B illustrates a flowchart 950 depicting example operations of the system performance controller 108 according to another aspect. Although the flowchart 950 of FIG. 9B is described with respect to the power supply system 100, the operations of FIG. 9B may be applicable to any of the power supply systems discussed herein. The flowchart 950 of FIG. 9B may be similar to the flowchart 900 of FIG. 9A (e.g., both continuous learning examples) except that the flowchart 950 of FIG. 9B uses the applied learning algorithm 136.

With respect to the operations of FIG. 9B, in some examples, the performance metric 101 is the energy conversion efficiency 123. In some examples, the energy conversion efficiency 123 is the individual efficiency 123A. In some examples, the energy conversion efficiency 123 is the overall efficiency 123B. In some examples, the performance metric 101 is the standby power 125. In some examples, the performance metric 101 is the THD metric, the ripple metric, the emission metric, or the transient response metric. The control parameters 105 may be any of the above-described parameters for controlling the power stage 102.

In FIG. 9B, the initiation of the operations may be event driven and/or periodically driven. In operation 952, the system performance controller 108 may detect a triggering event. In some examples, the triggering event includes the power stage 102 being activated. In some examples, the triggering event occurs during the operations of the power stage 102. For example, while the power stage 102 is executing, the system performance controller 108 may detect an environment change. In some examples, while the power stage 102 is executing, the system performance controller 108 may continuously (e.g., periodically) compute the performance metric 101, and, in response to the performance metric 101 not achieving the threshold condition, the system performance controller 108 may detect the trigger event. In some examples, the system performance controller 108 monitors a timer, and, in operation 951, upon the detection of the timer expiration, the system performance controller 108 is configured to trigger the operations of FIG. 9B.

Upon the detection of the triggering event or the expiration of the timer, in operation 954, the control manipulation module 130 modifies a value for the control parameter 105 using the applied learning algorithm 136. Although the flowchart 950 of FIG. 9B depicts the modification of a single control parameter 105, the system performance controller 108 may set and modify multiple different control parameters 105. In some examples, the control parameter 105 may have a control range that defines a range of values. The system performance controller 108 may select a value within the control range (e.g., a certain value of a ZVS control parameter 142). In some examples, the system performance controller 108 provides the value to the power supply controller 104 such that the power stage 102 operates according to the first value. In operation 956, the computation circuit 120 computes the performance metric 101. For example, the computation circuit 120 receives the measured conditions 103 from the metering circuit 106 and computes the performance metric 101 (e.g., the energy conversion efficiency 123). In operation 958, the system performance controller 108 stores or modifies the environment condition(s), the value of the control parameter 105, and the computed performance metric 101. In some examples, the system performance controller 108 updates the historical data 140 with the environment condition(s), the value of the control parameter 105, and the computed performance metric 101.

In operation 960, the system performance controller 108 determines whether the control range of the control parameter 105 is complete. If no, the process returns to operation 954, and the control manipulation module 130 selects another value of the control parameter 105 using the applied learning algorithm 136. If yes, in operation 962, the system performance controller 108 determines if the environment is the same. For example, the system performance controller 108 may determine if one or more environment conditions has changed (e.g., indicating that the power stage 102 has not stabilized). If one or more environment conditions has changed, the system performance controller 108 directs the process back to operation 952. In response to the environment conditions being detected as the same or similar, in operation 964, the system performance controller 108 selects the program control yielding the desirable performance metric (e.g., selecting the values for the control parameter 105 resulting in the best performance metric for the environment range). For instance, the program control may include the values of the control parameter 105 and the corresponding environment conditions that optimized the performance metric 101.

In operation 966, the system performance controller 108 may update the product memory of the power supply controller 104 with the selected program control. In operation 968, in some examples, the power supply controller 104 measures the environment conditions, and applies the program control at periodic intervals.

Figure 10A:
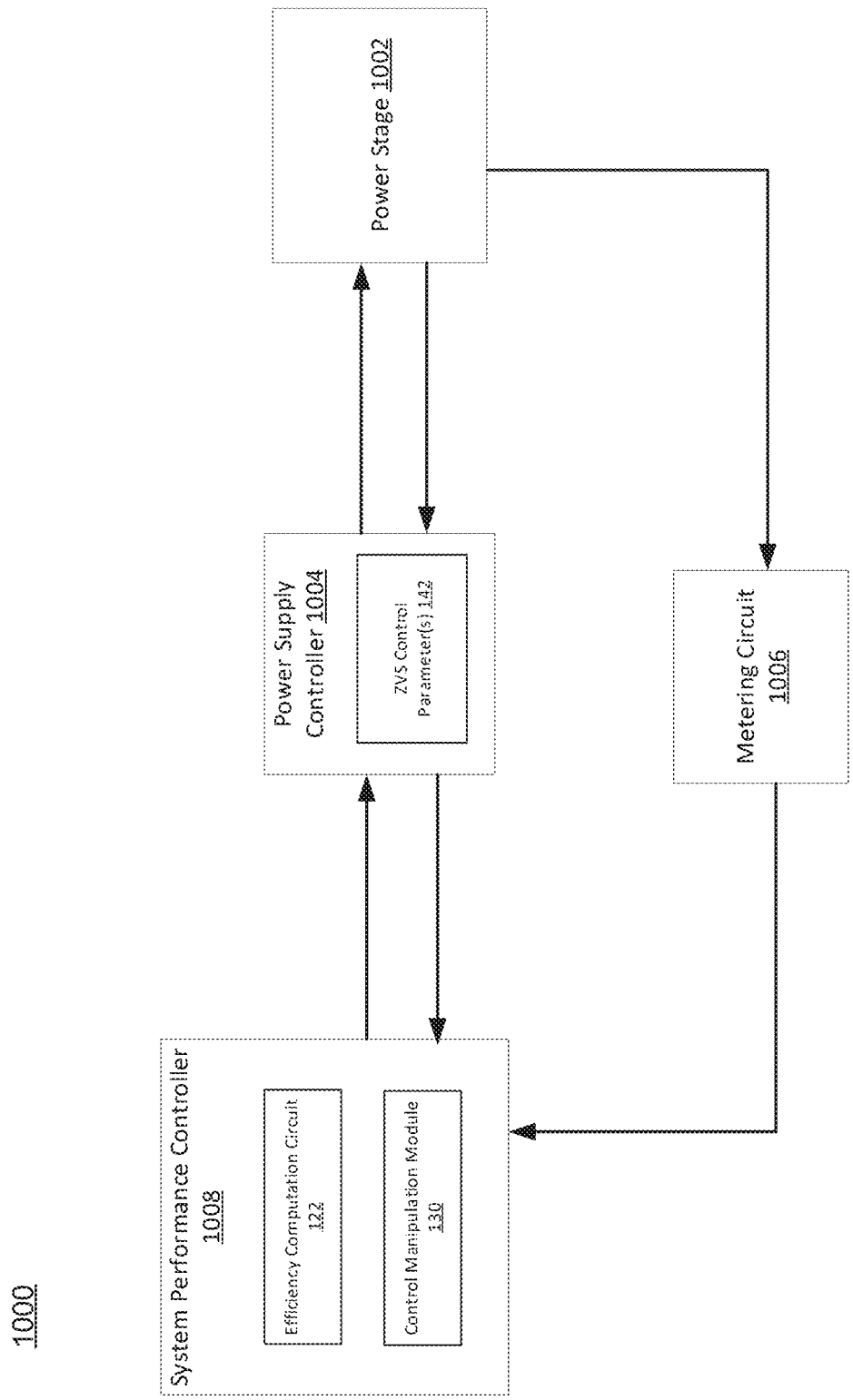
FIG. 10A illustrates a power supply system having a system performance controller for zero-voltage switching control according to an aspect.

FIG. 10A illustrates an example of a power supply system 1000 according to an aspect. The power supply system 1000 includes a power stage 1002, a metering circuit 1006, a system performance controller 1008, and a power supply controller 1004. The power stage 1002, the metering circuit 1006, and the system performance controller 1008 may include any of the features described with reference to the previous figures. As shown in FIG. 10A, the system performance controller 1008 includes the efficiency computation circuit 122 and the control manipulation module 130. Referring to FIGS. 1A, 1B, and 10A, the system performance controller 1008 may set or adjust a value for a ZVS control parameter 142 (or multiple ZVS control parameters 1042) by monitoring and computing energy conversion efficiency 123 and adjusting the value for the ZVS control parameter 142 (or multiple ZVS control parameters 1042) to maximize the energy conversion efficiency 123.

Figure 10B:
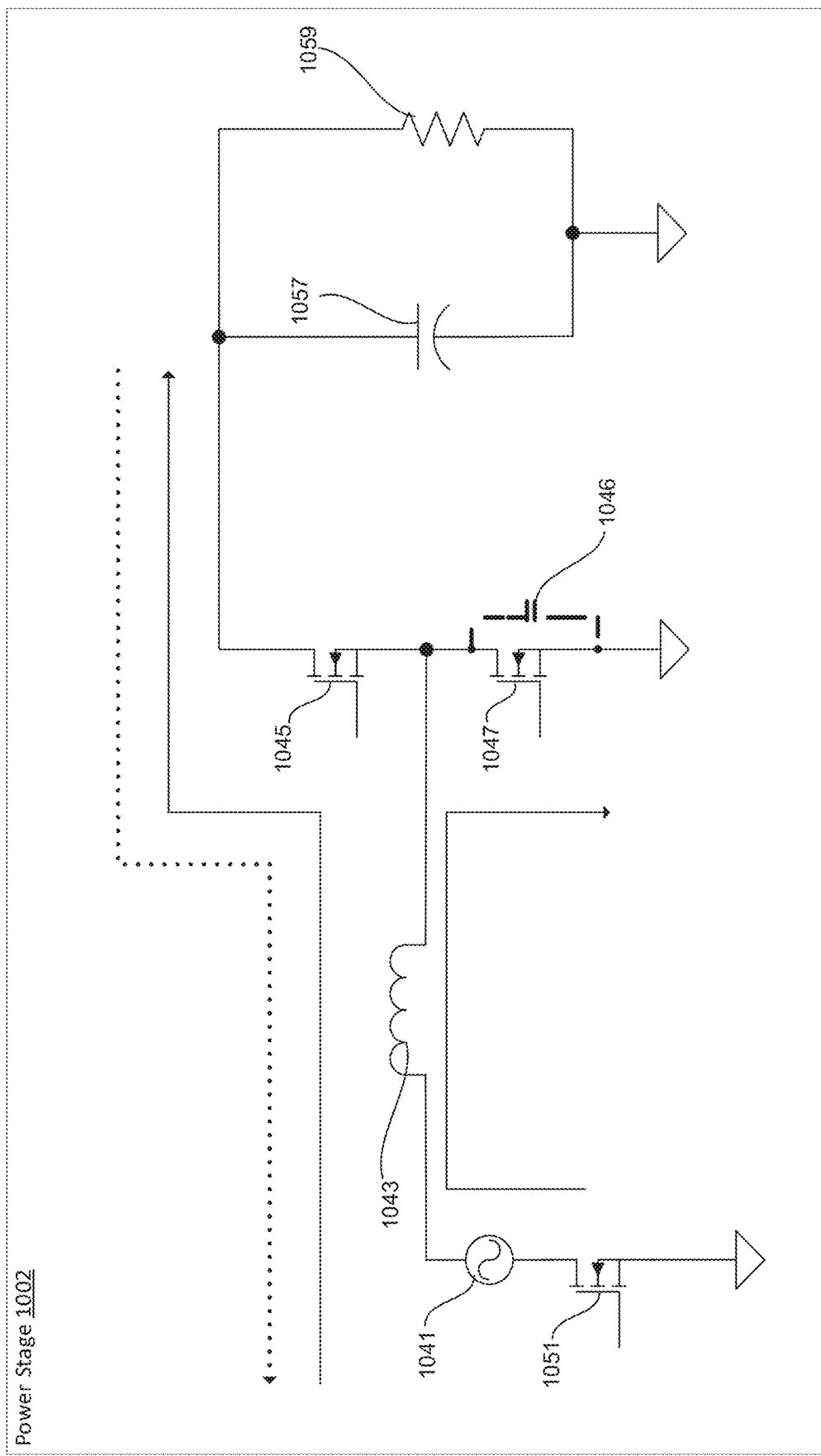
FIG. 10B illustrates a power stage of a power supply system according to an aspect.
Figure 10C:
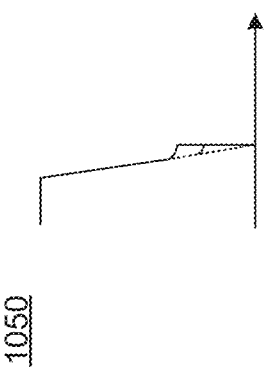
FIG. 10C illustrates switching losses of a power stage according to an aspect.
Figure 10D:
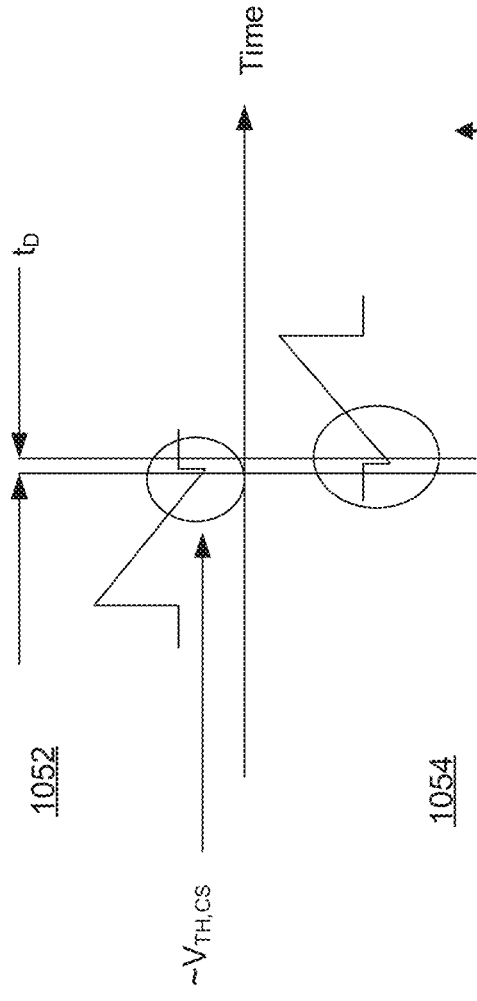
FIG. 10D illustrates a current sense voltage threshold as a zero-voltage switching control parameter according to an aspect.
Figure 10E:
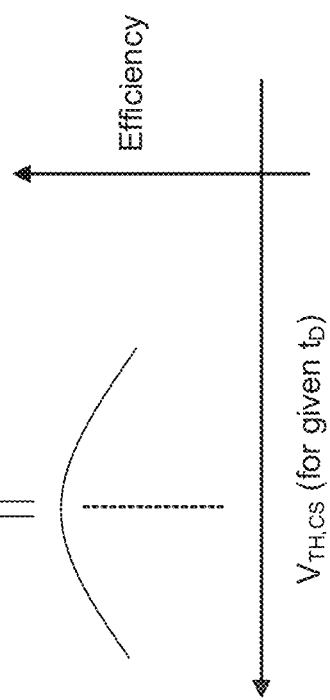
FIG. 10E illustrates an efficiency curve for values of the current sense voltage threshold according to an aspect.

FIG. 10B illustrates an example of a portion of the power stage 1002, which includes an AC power source 1041, an inductor 1043, a first power switch 1045, a second power switch 1047, a power switch 1051, a capacitor 1057, and a resistor 1059. In some examples, the first power switch 1045 is a high-side PWM FET. In some examples, the second power switch 1047 is a low-side PWM FET. FIG. 10C illustrates a graph 1050 depicting a level of switching losses as a function of drain-source voltage ($V_{DS}$) at the second power switch 1047. FIG. 10D illustrates a graph 1052 depicting a current sense voltage threshold ($V_{TH,CS}$) in a given time delay $t_D$. FIG. 10E illustrates an efficiency curve depicting the energy conversion efficiency 123 of the power stage 1002 with respect to the current sense voltage threshold ($V_{TH,CS}$) for a given dead time $t_D$.

Referring to FIGS. 10B through 10E, switching losses (e.g., substantial switching losses) may occur from the activation (e.g., turn on) of the second power switch 1047 when the drain-source voltage ($V_{DS}$) is non-zero. The switching losses are proportional to a parasitic capacitance 1046 of the second power switch 1047 (e.g., $C_{OSS}$), the square of drain-source voltage ($V_{DS}$) of the second power switch 1047, and the switching frequency ($F_{SW}$). In some examples, the second power switch 1047 may be forced to activate at $V_{DS}=0$ by obtaining the appropriate value of the current sense voltage threshold $V_{TH,CS}$, which may be indicative of reverse inductor current (e.g., $I_{L,R}$) necessary to discharge the parasitic capacitance 1046 ($C_{OSS}$) for a given time delay, $t_D$, between deactivation (e.g., turn-off) of the first power switch 1045) and activation (e.g., turn-on) of the second power switch 1047. If the magnitude of current through the inductor 1043 is allowed to reverse is too high (e.g., $I_{L,R}$ is above a certain level), the power stage 1002 may incur a loss of efficiency as energy is pulled from the load. In other words, conduction losses will negate any benefit from lower switching losses.

In some examples, the power supply system 1000 discussed herein include forcing a negative (or reverse) inductor current (e.g., $I_{L,R}$) and using forced commutation to achieve ZVS. However, the appropriate value of the reverse inductor current (e.g., $I_{L,R}$) would need to be determined since a large negative inductor current ($I_{L,R}$) can reduce ZVS (which reduces switching losses) but can increase the conduction losses. However, the system performance controller 1008 may adjust the reverse inductor current ($I_{L,R}$) based on historical or observed energy conversion efficiency 123 that can adapt to change in ambient conditions.

In some examples, the ZVS control parameter 142 includes a magnitude of the inductor reverse current ($I_{L,R}$) sufficient to discharge the parasitic capacitance 1046 ($C_{OSS}$) for a time delay, $t_D$, between the deactivation of the first power switch 1045 and the activation of the second power switch 1047. In some examples, the ZVS control parameter 1042 includes a current sense voltage threshold $V_{TH,CS}$, which is indicative of the reverse inductor current ($I_{L,R}$) necessary to discharge the parasitic capacitance 1046 ($C_{OSS}$) for the given time delay. In some examples, the ZVS control parameter 1042 includes a time value to activate the second power switch 1047 longer than the first power switch 1045 such that the magnitude of the reverse inductor current ($I_{L,R}$) causes the parasitic capacitance 1046 ($C_{OSS}$) of the second power switch 1047 to discharge.

In some examples, the system performance controller 1008 sets or adjusts the ZVS control parameter 142 until the energy conversion efficiency 123 achieving the threshold condition. For instance, the system performance controller 1008 may determine the value for the ZVS control parameter 1042 that optimizes the energy conversion efficiency 123. Using the current sense voltage threshold $V_{TH,CS}$ as an example of the ZVS control parameter 1042, the control manipulation module 1030 may set a first value for the current sense voltage threshold $V_{TH,CS}$, and provide the first value to the power supply controller 1004 such that the power stage 1002 operates according to the first value. The metering circuit 1006 may obtain the measured conditions 103 (e.g., input voltage, input current, output voltage, and output current), and provide the measured conditions 103 to the system performance controller 1008 in the digital format.

The efficiency computation circuit 122 may compute the energy conversion efficiency 123 based on the measured conditions 103. If the energy conversion efficiency 123 does not achieve the threshold condition, the control manipulation module 130 may select a second value for the current sense voltage threshold $V_{TH,CS}$ and provide the second value to the power supply controller 1004 such that the power stage 1002 operates according to the second value. The metering circuit 1006 may obtain the measured conditions 103, and the efficiency computation circuit 122 may compute the energy conversion efficiency 123 based on the measured conditions 103. If the energy conversion efficiency 123 achieves the threshold condition, the control manipulation module 130 may select the second value and instruct the power supply controller 104 to set or update the ZVS control parameter 1042 with the second value.

In some conventional approaches, a developer may measure an indirect parameter as a measure of energy conversion efficiency, and then adjust a ZVS control parameter to optimize the indirect parameter. For example, sudden time discharge rate may be measured as an indirect way of measuring energy conversion efficiency. For example, the sudden time discharge rate may indirectly correspond to a certain negative current through an inductor, which may indirectly correspond to certain switching losses, which may indirectly correspond to energy conversion efficiency. As such, the developer may adjust parameters to optimize the sudden time discharge rate, which can indirectly improve energy conversion efficiency of the power stage. However, using indirect parameters as a function of energy conversion efficiency 123 may result in a relatively long time to market. Furthermore, the energy conversion efficiency 123 may be negatively affected by the environment (e.g., the external stimulus) of the power supply system 1000, as well as the manufacturing variations of the components of the power supply system 1000.

However, the system performance controller 1008 directly computes the energy conversion efficiency 123 (e.g., it does not use an indirect parameter as a measure of energy conversion efficiency), and then sets or adjusts the ZVS control parameter 142 that would result in the energy conversion efficiency 123 achieving the threshold condition. Furthermore, in some examples, the system performance controller 1008 monitors and computes the energy conversion efficiency 123 during the power stage's lifetime and can programmatically re-evaluate and potentially select a new value for the ZVS control parameter 142 that maximizes or maintains the energy conversion efficiency 123 at the threshold level despite changes in the environment, the aging of components, and/or the thermal effects on the power stage 1002.

Figure 11:
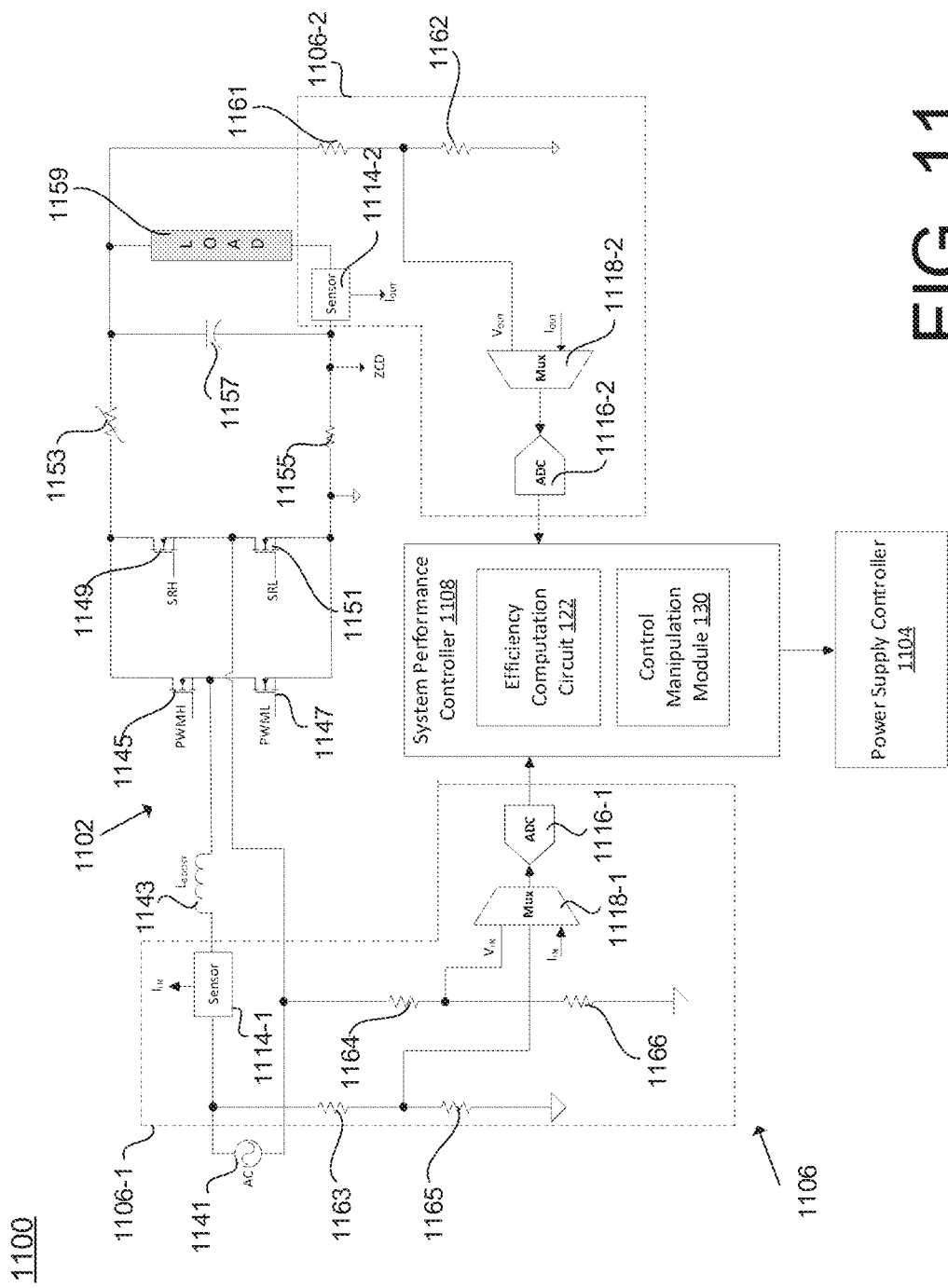
FIG. 11 illustrates a power supply system having a system performance controller for zero-voltage switching control according to an aspect.

FIG. 11 illustrates an example of a power supply system 1100 according to an aspect. In some examples, the power supply system 1100 is a totem pole PFC power supply system. The power supply system 1000 may include any of the features discussed herein with respect to the other figures. The power supply system 1100 includes a power stage 1102, a metering circuit 1106, a system performance controller 1108, and a power supply controller 1104. In some examples, the system performance controller 1108 is configured to obtain one or more ZVS control parameters 142 in a manner than optimizes energy conversion efficiency 123 by monitoring and computing the energy conversion efficiency 123 and adjusting the one or more ZVS control parameters 142 based on the energy conversion efficiency 123. As shown in FIG. 11, the system performance controller 1108 includes the efficiency computation circuit 122 and the control manipulation module 130.

The power stage 102 may include an AC power source 1141, an inductor 1143 (e.g., $L_{BOOST}$), a first power switch 1145, a second power switch 1147, a third power switch 1149, and a fourth power switch 1151. In some examples, the first power switch 1145 is a high-side PWM FET. In some examples, the second power switch 1147 is a low-side PWM FET. In some examples, the first power switch 1145 and the second power switch 1147 switch at a PWM frequency. In some examples, the first power switch 1145 and the second power switch 1147 operate according to a critical conduction mode (CrM), where the ON time of the first power switch 1145 is constant, and the switching period is terminated when the inductor current falls to zero resulting in a variable PWM frequency or continuous conduction mode (CCM) at a fixed frequency. In some examples, the third power switch 1149 and the fourth power switch 1151 switch at an AC frequency. In some examples, the power stage 102 may include a variable resistor 1153, a resistor 1155, and a capacitor 1157, where the power stage 1102 is coupled to a load 1159.

The metering circuit 1106 is configured to monitor the measured conditions 103 of the power stage 1102. The measured conditions 103 include input voltage, input current, output voltage, and output current. The metering circuit 1106 includes a first metering circuit 1106-1 configured to detect the input conditions (e.g., input voltage and input current), and a second metering circuit 1106-2 configured to detect the input conditions (e.g., the output voltage and the output current).

The first metering circuit 1106-1 includes a first current sensor 1114-1 configured to detect the input current (e.g., $I_{IN}$). In some examples, the first current sensor 114-1 is connected between the AC power source 1141 and the inductor 1143. The first metering circuit 1106-1 includes a plurality of resistors coupled to the AC lines at a location proximate to the AC power source 1141. The plurality of resistors includes a resistor 1163, a resistor 1164, a resistor 1165, and a resistor 1166. The first metering circuit 1106-1 includes a first multiplexer 1118-1 and a first ADC 1116-1. The first ADC 1116-1 is connected to an output of the first multiplexer 1118-1, and the output of the first ADC 1116-1 is connected to an input of the system performance controller 1108. The first multiplexer 1118-1 is configured to receive a signal representing the input voltage and a signal representing the input current, and to multiplex the signals to generate a single signal that is provided to the first ADC 1116-1. The first ADC 1116-1 is configured to convert the signal to a digital format detectable by the system performance controller 1108.

The second metering circuit 1106-2 includes a second current sensor 1114-2 configured to detect the output current (e.g., $I_{OUT}$) (e.g., also referred to as the load current). The second metering circuit 1106-2 includes a plurality of resistors coupled to the output of the power stage 1102. The plurality of resistors includes a resistor 1161 and a resistor 1162. The second metering circuit 1106-2 includes a second multiplexer 1118-2 and a second ADC 1116-2. The second ADC 1116-2 is connected to an output of the second multiplexer 1118-2, and the output of the second ADC 1116-2 is connected to an input of the system performance controller 1108. The second multiplexer 1118-2 is configured to receive a signal representing the output voltage and a signal representing the output current, and to multiplex the signals to generate a single signal that is provided to the second ADC 1116-2. The second ADC 1116-2 is configured to convert the signal to a digital format detectable by the system performance controller 1108.

The efficiency computation circuit 122 is configured to monitor and compute the energy conversion efficiency 123 of the power stage 1102 based on the input voltage, input current, output voltage, and output current received from the metering circuit 1106. The control manipulation module 130 manipulates one or more ZVS parameters 142 based on the energy conversion efficiency 123 according to any of the techniques described herein. The system performance controller 1108 is configured to provide the ZVS parameters 142 to the power supply controller 1104.

Figure 12:
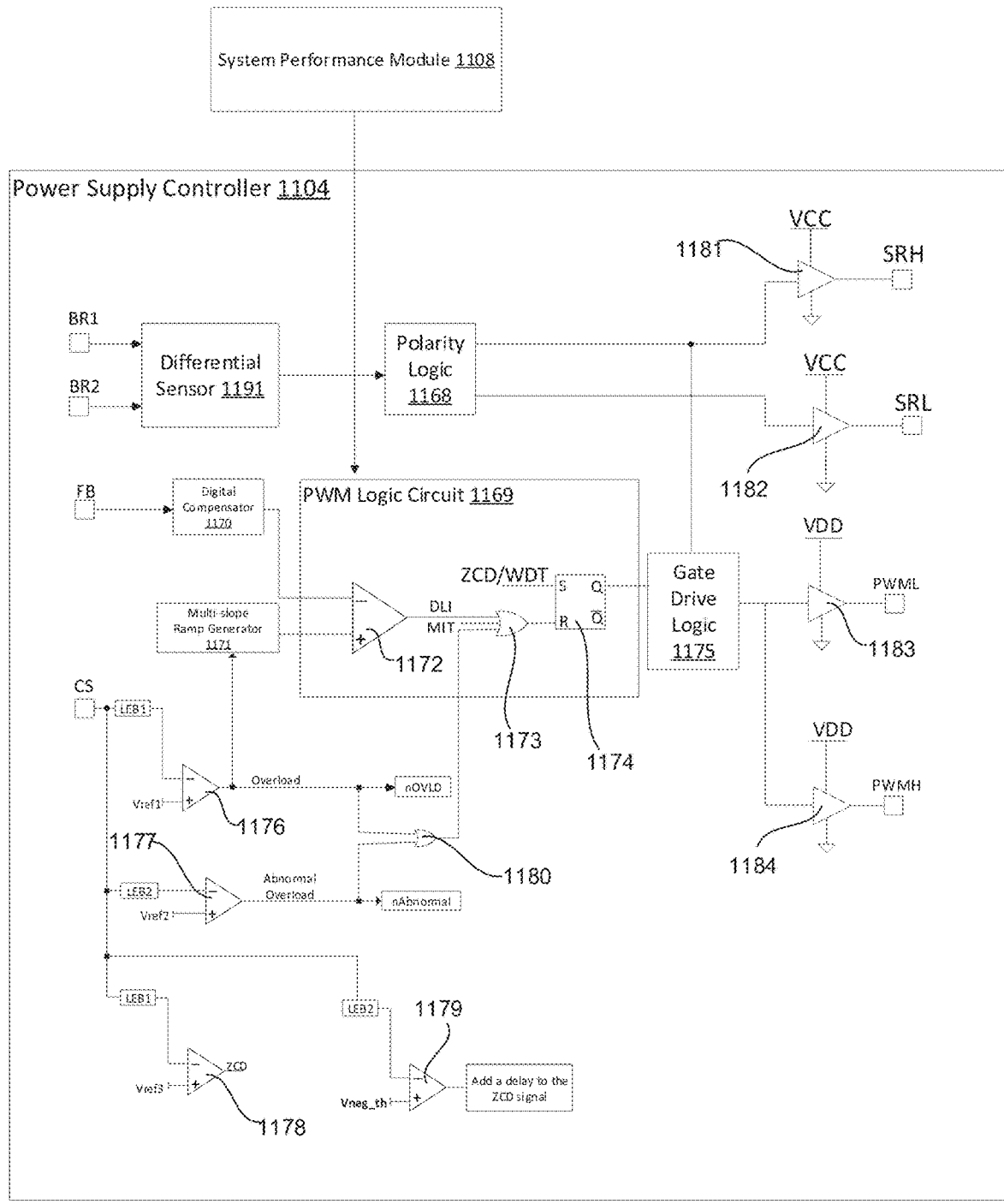
FIG. 12 illustrates a power supply controller of a power supply system according to an aspect.

FIG. 12 illustrates an example of the power supply controller 1104 according to an aspect. The power supply controller 1104 is configured to receive the ZVS parameters 142 from the system performance controller 1108.

The power supply controller 1104 includes a plurality of analog drivers configured to drive the control of the power switches of the power stage 1102. For example, the power supply controller 1104 may include a first analog driver 1181 configured to generate a control signal (e.g., SRH) for the third power switch 1149, a second analog driver 1182 configured to generate a control signal (e.g., SRL) for the fourth power switch 1151, a third analog driver 1183 configured to generate a control signal (e.g., PWML) for the second power switch 1147, and a fourth analog driver 1184 configured to generate a control signal (e.g., PWMH) for the first power switch 1145.

The power supply controller 1104 may include a differential sensor 1191 configured to receive a signal (BR1) and a signal (BR2) and generate a difference signal reflecting the difference between BR1 and BR2, and a polarity logic 1168 configured to determine the polarity of the difference signal. The outputs of the polarity logic 1168 are connected to the first analog driver 1181 and the second analog driver 1182.

The power supply controller includes a digital compensator 1170 configured to digitally compensate a signal (FB), a multi-slope ramp generator 1171, a PWM logic circuit 1169, and a gate drive logic 1175. The PWM logic circuit 1169 is configured to receive the ZVS parameters 142 from the system performance controller 1108. The PWM logic circuit 1169 includes a PWM comparator 1172, a logic component 1173, and a flip-flop circuit 1174. The PWM comparator 1172 may compare the output of the digital compensator 1170 and the output of the multi-slope ramp generator 1171. The logic component 1173 is connected to the PWM comparator 1172. The logic component 1173 is connected to an input (e.g., reset terminal) of the flip-flop circuit 1174. The flip-flop circuit 1174 is configured to receive a zero crossing detector (ZCD) signal and/or a watchdog timer (WDT) signal. In some examples, a delay is added to the ZCD signal, where the amount of the delay is determined by ZVS control parameters 142 received from the system performance controller 1108. The output of the flip-flop circuit 1174 is connected to an input of the gate drive logic 1175. The output of the gate drive logic 1175 is connected to third analog driver 1183 and the fourth analog driver 1184.

Figure 13:
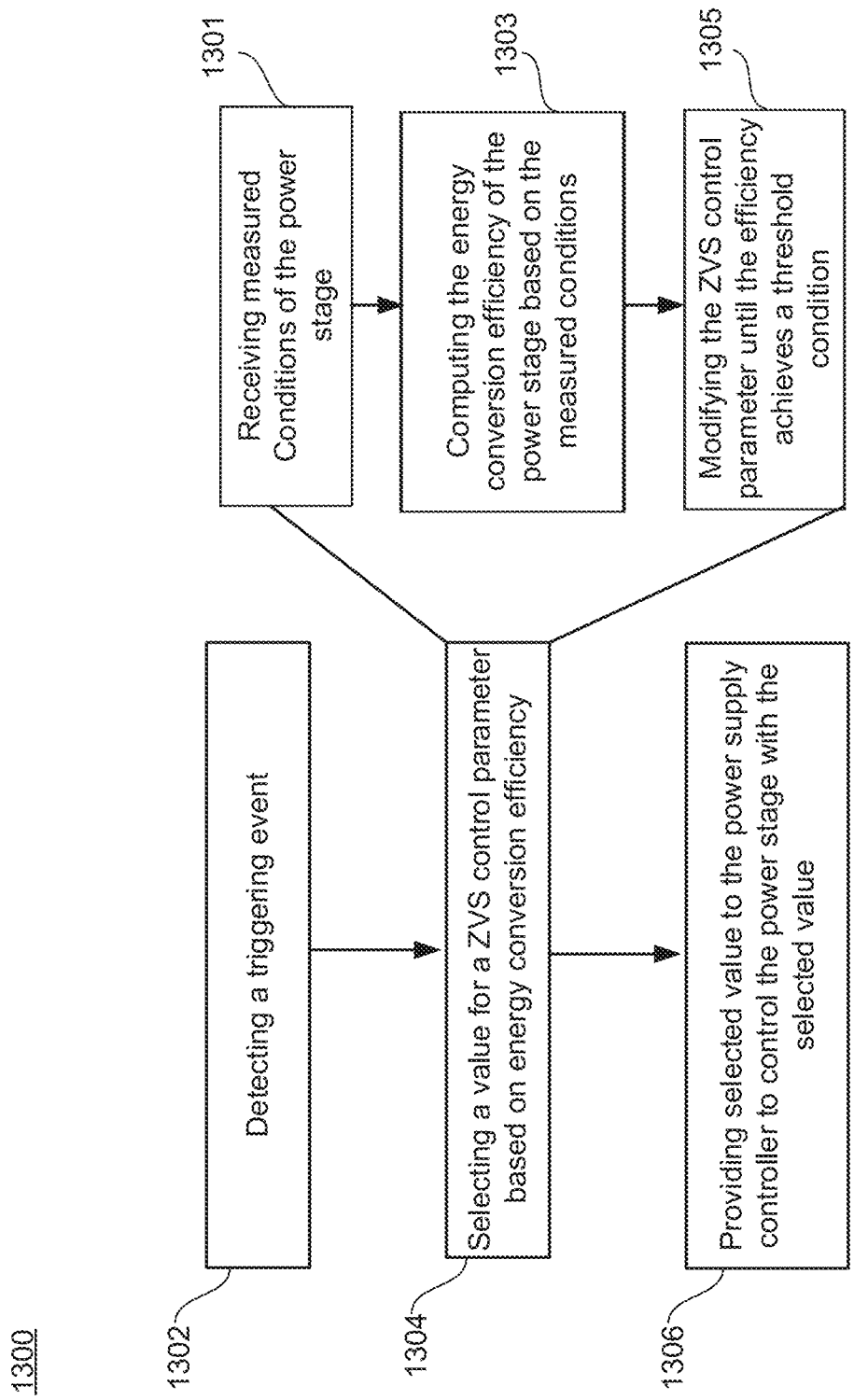
FIG. 13 illustrates a flowchart depicting example operations of a system performance controller for zero-voltage switching control according to an aspect.

As shown in FIG. 13, the power supply controller 1104 may include a comparator 1176, a comparator 1177, a comparator 1178, a comparator 1179, and a logic component 1180. The comparator 1176 compares the voltage of the current sense signal (e.g., $V_{CS,TH}$) and a first voltage threshold, the comparator 1177 compares the voltage of the current sense signal to a second voltage threshold, the comparator 1178 compares the voltage of the current sense to a third voltage threshold, and the comparator 1179 compares the voltage of the current sense to a voltage of the negative threshold (e.g., $V_{CS,TH}$). In some examples the voltage of the negative threshold $V_{CS,TH}$ indicates the amount of delay added to the ZCD signal.

FIG. 13 illustrates a flowchart 1300 depicting example operations of the power supply system 1100 according to an aspect. Although the flowchart 1300 is described with respect to the power supply system 1100 of FIG. 11, the operations of FIG. 13 may be applicable to any of the power supply systems described herein.

In operation 1302, the system performance controller 1108 detects a triggering event. In some examples, the triggering event includes activation of the power stage 1102. In some examples, the triggering event includes the detection of a change to one or more environment conditions. In some examples, the triggering event includes the expiration of a timer. In some examples, the triggering event includes the detection of the energy conversion efficiency 123 not achieving the threshold condition.

In operation 1304, the system performance controller 1108 selects a value for a ZVS control parameter 142 based on the energy conversion efficiency 123. In some examples, the ZVS control parameter 142 indicates a magnitude of a reverse current ($I_{L,R}$) through the inductor 1143 to discharge the parasitic capacitance of the second power switch 1147. In some examples, the ZVS control parameter 142 is a current sense voltage threshold ($V_{TH,CS}$) indicative of the magnitude of the reverse inductor current ($I_{L,R}$). In some examples, the ZVS parameter includes a time value to delay activation of the second power switch 1147 such that the magnitude of the reverse inductor current ($I_{L,R}$) causes the parasitic capacitance of the second power switch 1147 to discharge. In some examples, the system performance controller 1108 selects a combination of ZVS control parameters 142 (e.g., $V_{CS,TH}$, time delay $t_D$).

For example, in operation 1301, the system performance controller 1108 receives the measured conditions 103 of the power stage 1102. In some examples, the system performance controller 1108 receives the measured conditions 103 from the metering circuit 1106. The measured conditions 103 may include input voltage, input current, output voltage, and output current. In some examples, the metering circuit 1106 includes one or more ADCs (e.g., ADC 1116-1, ADC 1116-2) and one or more multiplexers (e.g., multiplexer 1118-1, multiplexer 1118-2).

In operation 1303, the efficiency computation circuit 122 computes the energy conversion efficiency 123 of the power stage 1102 based on the measured conditions 103 (e.g., $(V_{OUT}*I_{OUT})/(V_{IN}*I_{IN}))$. In operation 1305, the control manipulation module 130 modifies the ZVS control parameter 142 until the energy conversion efficiency 123 achieves the threshold condition. In some examples, the control manipulation module 130 selects a first value for the ZVS parameter 142 and sends the first value to the power supply controller 1104. Then, the efficiency computation circuit 122 computes the energy conversion efficiency 123 of the power stage 1102 that operates according to the first value based on the measured conditions 103. Then, the control manipulation module 130 modifies the first value to obtain a second value in response to the energy conversion efficiency 123 not achieving the threshold condition, and sends the second value to the power supply controller 1104. Then, the efficiency computation circuit 122 computes the energy conversion efficiency 123 of the power stage 1102 that operates according to the second value based on the measured conditions 103.

In some examples, the control manipulation module 130 modifies the ZVS parameter 142 using the AI algorithm 132. In some examples, the AI algorithm 132 is the targeted search algorithm 134. In some examples, the AI algorithm is the applied learning algorithm 136. In some examples, the control manipulation module 130 applies historical data 140 to the neural network 138 to predict a value for the ZVS parameter 142 that results in the energy conversion efficiency 123 achieving the threshold condition. In some examples, the system performance controller 1108 determines a first value of the ZVS parameter 142 that results in the energy conversion efficiency 123 achieving the threshold condition for a first environment condition, and determines a second value of the ZVS parameter 142 that results in the energy conversion efficiency 123 achieving the threshold condition for a second environment condition. In some examples, the first and second environment conditions are different voltages.

In operation 1306, the system performance controller 1108 provides the selected value to the power supply controller 1104 to control the power stage 1102 with the selected value. In some examples, the selected value is stored in a program memory at the power supply controller 1104. In some examples, the system performance controller 1108 updates the program memory with the selected value.

Figure 14:
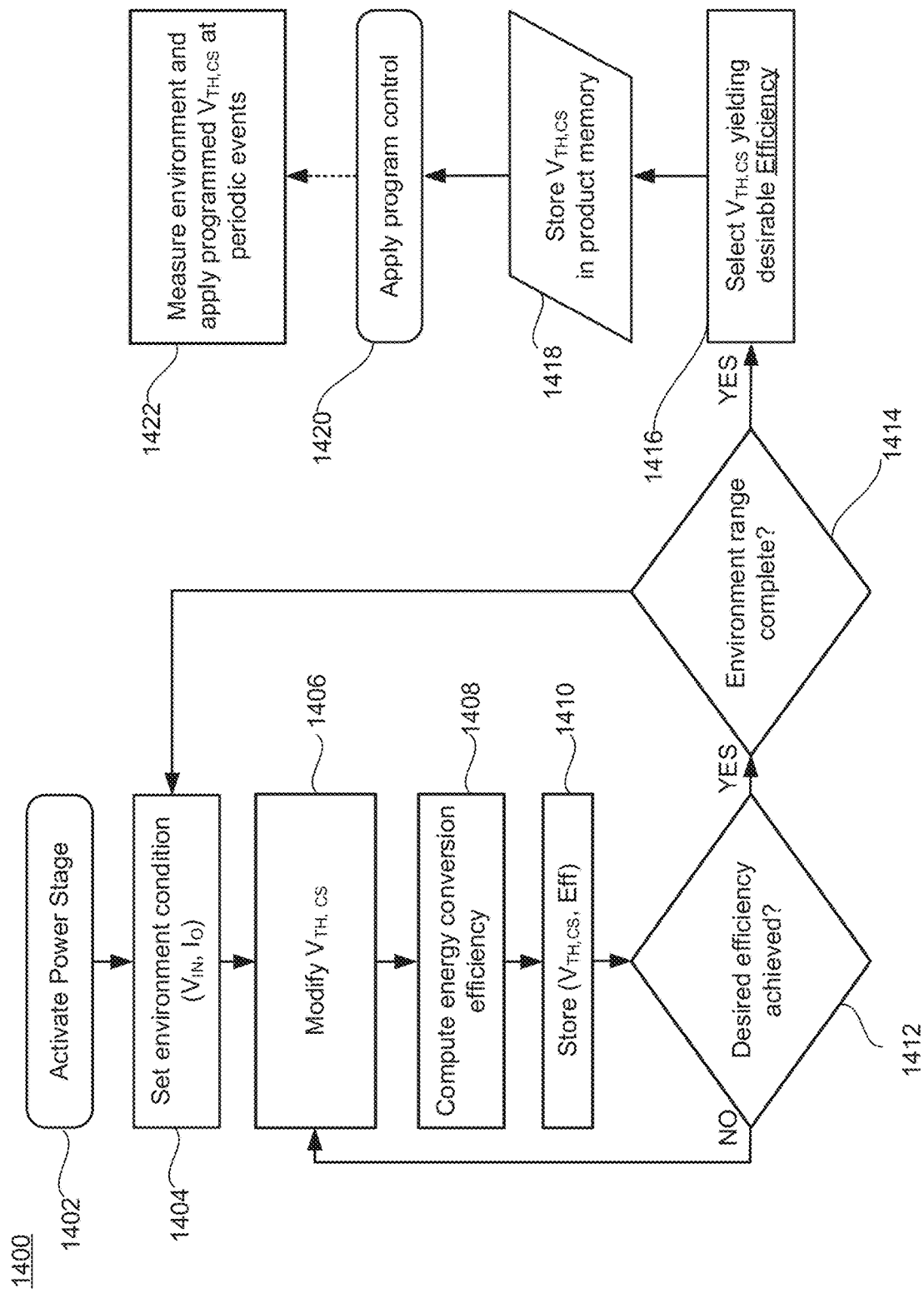
FIG. 14 illustrates a flowchart depicting example operations of a system performance controller for zero-voltage switching control using a targeted search algorithm according to an aspect.

FIG. 14 illustrates a flowchart 1400 depicting example operations of the power supply system 1100 according to an aspect. The flowchart 1400 relates to the determination of a ZVS control parameter 142 that optimizes or provides an energy conversion efficiency 123 that achieves a threshold condition using the targeted search algorithm 134. In some examples, the ZVS control parameter 142 is a current sense voltage threshold ($V_{TH,CS}$). The $V_{TH,CS}$ indicates a magnitude of the reverse current ($I_{L,R}$) used to discharge the parasitic capacitance ($C_{OSS}$) during a time delay ($t_D$), thereby achieving ZVS. Although the flowchart 1400 of FIG. 14 is described with respect to the power supply system 1100, the operations of FIG. 14 may be applicable to any of the power supply systems discussed herein.

Similar to the flowchart of FIG. 7, in some examples, the operations of the flowchart 1400 may relate to a fixed product solution, where the optimal values for $V_{TH,CS}$ are determined using the system performance controller 1108, and the determined ZVS parameters 142 are stored in the product memory of the power supply controller 1104. In some examples, the system performance controller 1108 is configured to initiate the operations of FIG. 14 during the development, testing, and/or production of the power supply system 1100. In some examples, the system performance controller 1108 is configured to initiate the operations of FIG. 14 in response to the power stage 1102 being activated (e.g., turned-on).

In operation 1402, the power stage 1102 is activated (e.g., power on). In operation 1404, the system performance controller 108 sets one or more environment conditions. For example, the system performance controller 108 sets the input voltage ($V_{IN}$) and the output current ($I_O$). In operation 1406, the control manipulation module 130 modifies a value for $V_{TH,CS}$. In some examples, the system performance controller 108 modifies the $V_{TH,CS}$ while other ZVS control parameters 142 are fixed (e.g., the time delay to). It is noted that as the time delay $t_D$ gets smaller, the magnitude of required reverse inductor current ($I_{L,R}$, as indicated by the $V_{TH,CS}$) increases to cause the parasitic capacitance $C_{OSS}$ to discharge and obtain ZVS. In some examples, the system performance controller 1108 may identify a combination of both $V_{TH,CS}$ and $t_D$, and store the preferred result.

In some examples, the control range of $V_{TH,CS}$ is from 0 mV to −300 mV. The system performance controller 1108 provides the value for $V_{TH,CS}$ to the power supply controller 1104 such that the power stage 1102 operates according to the value. In operation 1408, the efficiency computation circuit 122 is configured to compute the energy conversion efficiency 123. For example, the system performance controller 1108 receives the measured conditions 103 from the metering circuit 1106, and the efficiency computation circuit 122 computes the energy conversion efficiency 123 based on the measured conditions 103. In operation 1410, the system performance controller 1108 stores value of the $V_{TH,CS}$ and the computed energy conversion efficiency 123. In some examples, the system performance controller 108 stores the environment conditions (e.g., the set values for $V_{IN}$ and $I_O$), the value of the $V_{TH,CS}$, and the computed energy conversion efficiency 123.

In operation 1412, the system performance controller 1108 determines whether a desired energy conversion efficiency is achieved, e.g., whether the energy conversion efficiency 123 achieves a threshold condition (e.g., is maximized or equal to or greater than the threshold level). If no, the operations return to operation 1406, and the control manipulation module 130 selects another value for $V_{TH,CS}$ based on the targeted search algorithm 134. If yes, in operation 1414, the system performance controller 1108 determines if the environment range is complete, e.g., whether the range of the environment conditions have been tested. If no, the system performance controller 1108 directs the process back to operation 1404 to set another value for at least one of $V_{IN}$ and $I_O$.

In operation 1416, the program control yielding the desirable energy conversion efficiency 123 may be selected (e.g., selecting the value(s) of $V_{TH,CS}$ that results in the energy conversion efficiency 123 achieving the threshold condition for the environment range). In operation 1418, the program control may be stored in the product memory of the power supply controller 1104. In operation 1420, the power supply controller 1104 applies the program control to the power stage 1102. In operation 1422, in some examples, the power supply controller 1104 measures the environment conditions, and applies the program control at periodic intervals.

Figure 15:
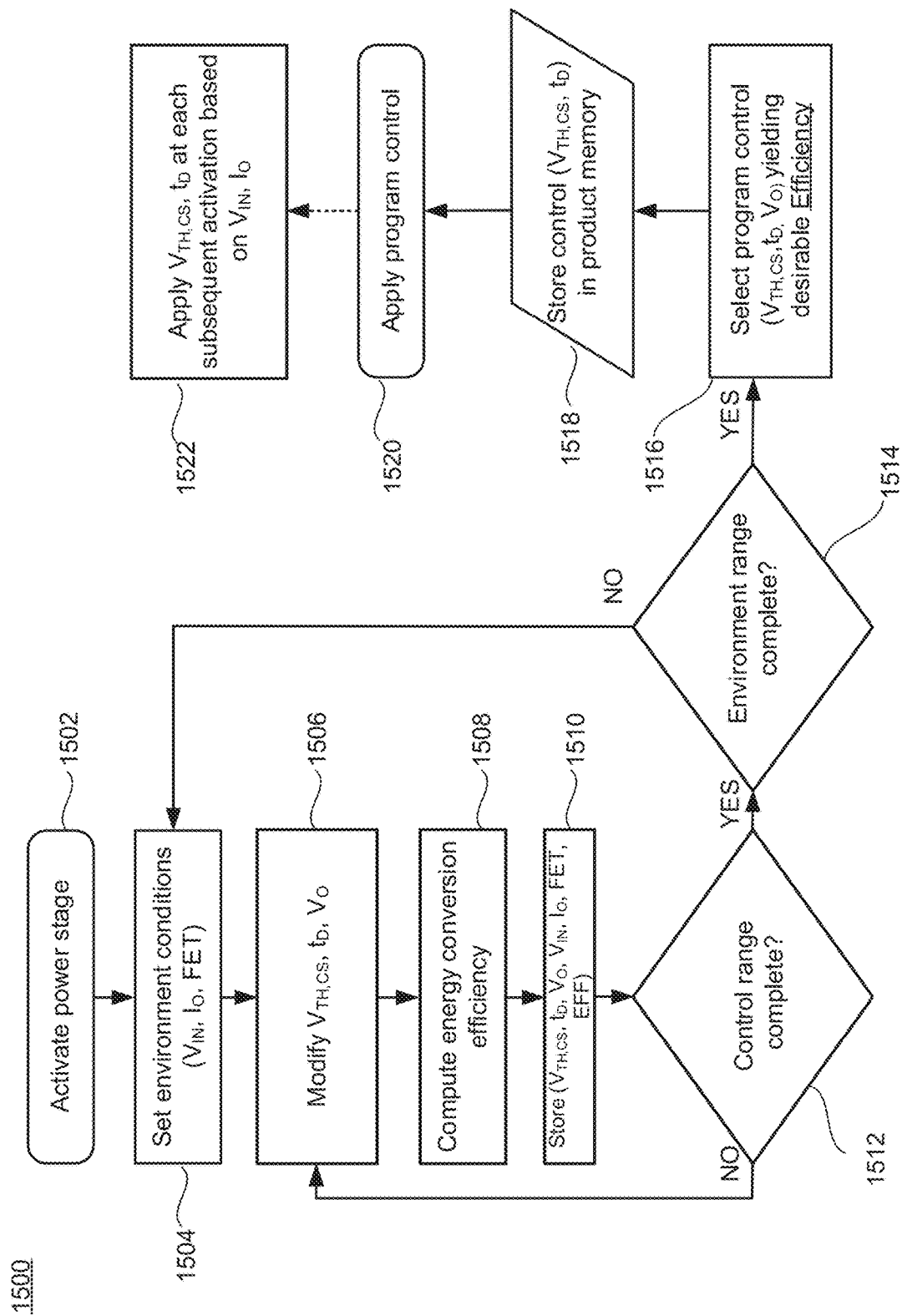
FIG. 15 illustrates a flowchart depicting example operations of a system performance controller for zero-voltage switching control using an applied learning algorithm according to an aspect.

FIG. 15 illustrates a flowchart 1500 depicting example operations of the power supply system 1100 according to an aspect. The flowchart 1500 relates to the determination of a ZVS control parameter 142 that optimizes or provides an energy conversion efficiency 123 that achieves a threshold condition using the applied learning algorithm 136. In some examples, the ZVS control parameter 142 is a current sense voltage threshold ($V_{TH,CS}$). The $V_{TH,CS}$ indicates a magnitude of the reverse current ($I_{L,R}$) used to discharge the parasitic capacitance ($C_{OSS}$) during a time delay (to), thereby achieving ZVS. Although the flowchart 1500 of FIG. 15 is described with respect to the power supply system 1100, the operations of FIG. 15 may be applicable to any of the power supply systems discussed herein. The flowchart 1500 of FIG. 15 may be similar to the flowchart 1400 of FIG. 14 except that the flowchart 1500 of FIG. 15 uses the applied learning algorithm 136. Also, the flowchart 1500 of FIG. 15 may be similar to the flowchart 700 of FIG. 7 in the sense that the flowchart 1500 of FIG. 15 relates to a fixed product solution, where the optimal values for $V_{TH,CS}$ are determined using the system performance controller 1108, and the determined control parameters 105 are stored in the product memory of the power supply controller 1104.

In some examples, the system performance controller 1108 is configured to initiate the operations of FIG. 15 during the development, testing, and/or production of a power supply system. In some examples, the system performance controller 1108 is configured to initiate the operations of FIG. 15 in response to the power stage 1102 being activated (e.g., turned-on).

In operation 1502, the power stage 1102 is activated (e.g., power on). In operation 1504, the system performance controller 1108 sets one or more environment conditions. For example, the system performance controller 1108 may set the input voltage ($V_{IN}$), the output current ($I_O$), and one or more attributes for the second power switch 1147 (which, in some examples, is a FET). In some examples, the attributes of the second power switch 1147 include an on-resistance ($R_{ON}$) and the capacitance ($C_{OSS}$). In operation 1506, the control manipulation module 130 modifies the $V_{TH,CS}$, the $t_D$ (time delay), and the $V_O$ (output voltage) according to the applied learning algorithm 136. In some examples, the control manipulation module 130 is configured to train and adjust the neural network 138 based on the historical data 140 to predict the energy conversion efficiency 123. The system performance controller 1108 stores the results in memory (e.g., the environment conditions (e.g., $V_{IN}$, $I_O$, and FET), the ZVS control parameters 142 (e.g., $V_{TH,CS}$, $T_D$, and $V_O$), and the predicted energy conversion efficiency. Then, the control manipulation module 130 is configured to select the $V_{TH,CS}$, $T_D$, and $V_O$ that maximizes energy conversion efficiency 123.

The system performance controller 1108 provides the selected $V_{TH,CS}$, the $t_D$, and the $V_O$ to the power supply controller 1104 such that the power stage 1102 operates according to these values. In operation 1508, the efficiency computation circuit 122 computes the energy conversion efficiency 123. For example, the system performance controller 1108 receives the measured conditions 103 from the metering circuit 1106, the efficiency computation circuit 122 computes the energy conversion efficiency 123 based on the measured conditions 103. In operation 1510, the system performance controller 1108 stores the environment conditions (e.g., $V_{IN}$, $I_O$, and FET), the ZVS control parameters 142 (e.g., $V_{TH,CS}$, $T_D$, and $V_O$), and the computed energy conversion efficiency 123.

In operation 1512, the system performance controller 1108 determines whether the control range of the control parameter 105 is complete. If no, the process returns to operation 1506 to loop through other values of $V_{TH,CS}$, $t_D$, and $V_O$, and the control manipulation module 130 modifies one or more of the $V_{TH,CS}$, $T_D$, and $V_O$ according to the applied learning algorithm 136.

Table 1 below shows an example of the historical data 140.

| $V_{IN}$ ($V_{RMS}$) | $V_O$ ($V_{DC}$) | $I_O$ ($A_{DC}$) | $V_{TH,CS}$ (mV) | $T_D$ (nsec) | $R_{ON}$ (mOhms) | $C_{OSS}$ (pF) |
|---|---|---|---|---|---|---|
| A1 | B1 | C1 | D1 | E1 | F1 | G1 |
| A2 | B2 | C2 | D2 | E2 | F2 | G2 |
| A3 | B3 | C3 | D3 | E3 | | |
| A4 | B4 | C4 | D4 | E4 | | |
| | | C5 | D5 | E5 | | |
| | | C6 | D6 | E6 | | |
| | | | D7 | E7 | | |

In some examples, the control manipulation module 130 is configured to first step through inputs that may easiest to control while keeping more difficult ones fixed. In some examples, the following inputs are listed as most to least difficult: GaN FET, $V_O$, $t_D$, $V_{TH,CS}$, $V_{IN}$, $I_O$. In some examples, in operation 1504, the control manipulation module 130 loops through $I_O$, then changes $V_{IN}$ and loops through $I_O$ again, and stepping $V_{IN}$ until all steps are finished. Then, the control manipulation module 130 changes $V_{TH,CS}$.

If yes, in operation 1514, the system performance controller 1108 determines whether the environment range is complete, e.g., whether the range of the environment conditions (e.g., the ranges of $V_{IN}$, $I_O$, and FET) have been tested. If no, the system performance controller 1108 directs the process back to operation 1504 to modify one or more of the $V_{IN}$, $I_O$, and FET. If yes, the process proceeds to operation 1516.

In operation 1516, the control manipulation module 130 is configured to select the combinations of $V_{TH,CS}$, $T_D$, and $V_O$ that yield the targeted energy conversion efficiency for one or more environment conditions (e.g., different combinations of $V_{IN}$, $I_O$. In operation 1518, the selected values for $V_{TH,CS}$ and $t_D$ are stored in the product memory of the power supply controller 1104. In operation 1520, the power supply controller 1104 applies the program control (e.g., $V_{TH,CS}$ and $t_D$) to the power stage 1102. In operation 1522, in some examples, the power supply controller 1104 measures the environment conditions, and applies the program control at periodic intervals (e.g., applies $V_{TH,CS}$, $t_D$ at each subsequent power on based on $V_{IN}$, $I_O$).

Figure 16:
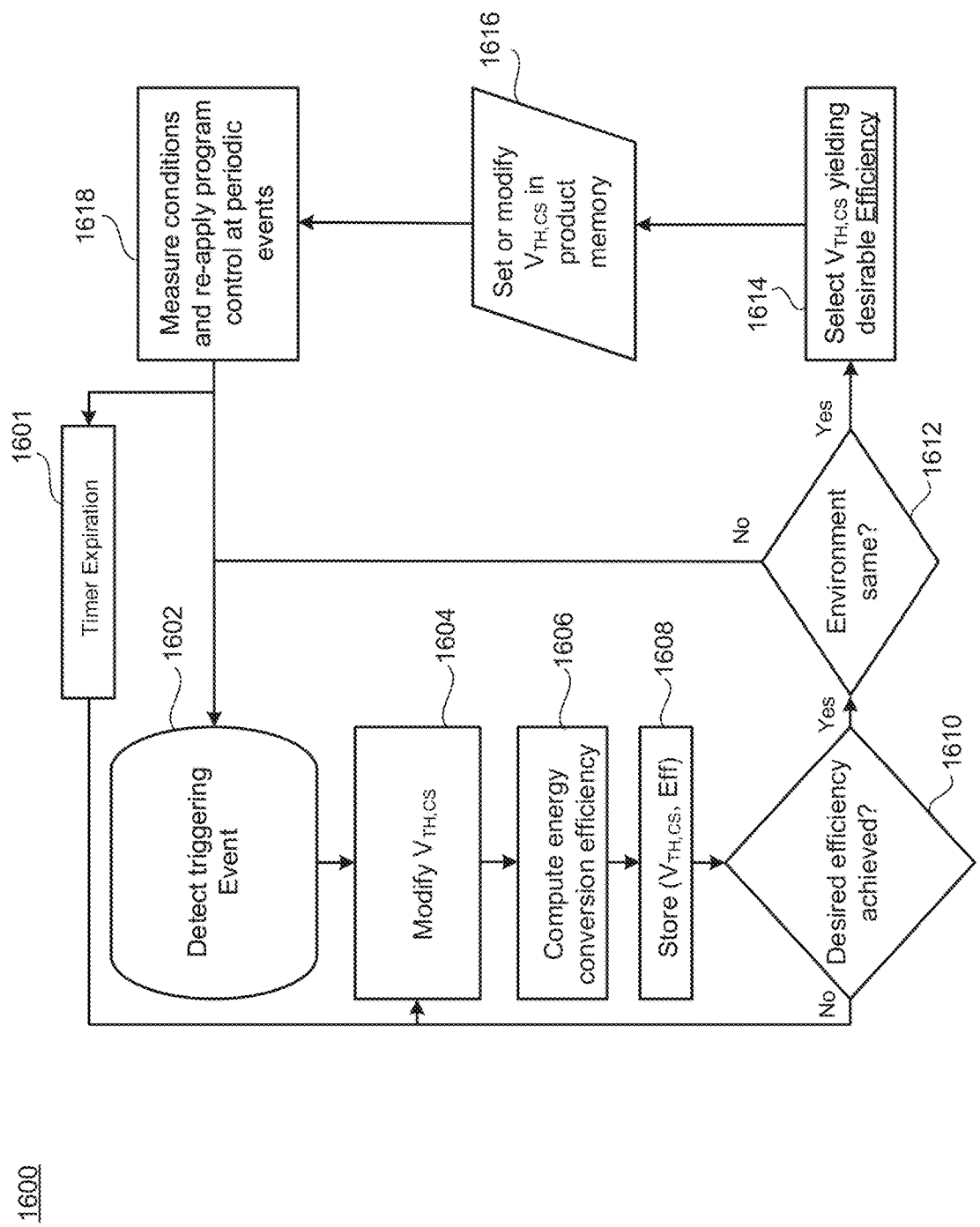
FIG. 16 illustrates a flowchart depicting example operations of a system performance controller for zero-voltage switching control using a targeted search algorithm according to another aspect.

FIG. 16 illustrates a flowchart 1600 depicting example operations of the power supply system 1100 according to another aspect. For example, the system performance controller 1108 is configured to execute the operations of the flowchart 1600 of FIG. 16 when the power stage 1102 is operating (which include activation of the power stage 1102). The flowchart 1600 relates to the determination of a ZVS control parameter 142 that optimizes or provides an energy conversion efficiency 123 that achieves a threshold condition using the targeted search algorithm 134. In some examples, the ZVS control parameter 142 is a current sense voltage threshold ($V_{TH,CS}$). The $V_{TH,CS}$ indicates a magnitude of the reverse current ($I_{L,R}$) used to discharge the parasitic capacitance ($C_{OSS}$) during a time delay ($t_D$), thereby achieving ZVS. Although the flowchart 1600 of FIG. 16 is described with respect to the power supply system 1100, the operations of FIG. 16 may be applicable to any of the power supply systems discussed herein.

In operation 1602, the system performance controller 1108 may detect a triggering event. In some examples, the triggering event includes the power stage 102 being activated. In some examples, the triggering event occurs during the operations of the power stage 1102. For example, while the power stage 1102 is executing, the system performance controller 1108 may detect a change in the environment conditions, thereby detecting a triggering event. In some examples, while the power stage 1102 is executing, the efficiency computation circuit 122 may continuously (e.g., periodically) compute the energy conversion efficiency 123, and, in response to the energy conversion efficiency 123 not achieving the threshold condition, the system performance controller 1108 may detect the triggering event. In some examples, the system performance controller 1108 monitors a timer, and, in operation 1601, upon the detection of the timer expiration, the system performance controller 1108 is configured to trigger the operations of FIG. 16.

Upon the detection of the triggering event or the expiration of the timer, in operation 904, the control manipulation module 130 modifies the $V_{TH,CS}$ using the targeted search algorithm 134. In some examples, the system performance controller 1108 modifies the $V_{TH,CS}$ while other ZVS control parameters 142 are fixed (e.g., the time delay to). The system performance controller 1108 provides the value for $V_{TH,CS}$ to the power supply controller 1104 such that the power stage 1102 operates according to the value.

In operation 1606, the efficiency computation circuit 122 is configured to compute the energy conversion efficiency 123. For example, the system performance controller 1108 receives the measured conditions 103 from the metering circuit 1106, and the efficiency computation circuit 122 computes the energy conversion efficiency 123 based on the measured conditions 103. In operation 1608, the system performance controller 1108 stores value of the $V_{TH,CS}$ and the computed energy conversion efficiency 123. In some examples, the system performance controller 1108 stores the environment conditions (e.g., the measured values for $V_{IN}$ and $I_O$), the value of the $V_{TH,CS}$, and the computed energy conversion efficiency 123.

In operation 1610, the system performance controller 1108 determines whether a desired energy conversion efficiency is achieved, e.g., whether the energy conversion efficiency 123 achieves a threshold condition (e.g., is maximized or equal to or greater than the threshold level). If no, the operations return to operation 1604, and the control manipulation module 130 selects another value for $V_{TH,CS}$ based on the targeted search algorithm 134. If yes, in operation 1612, the system performance controller 1108 determines if the environment is substantially the same. If no, the process loops back to operation 1602 until system stability is detected. If yes, the process proceeds to operation 1614.

In operation 1614, the system performance controller 1108 selects the $V_{TH,CS}$ yielding the describable energy conversion efficiency, e.g., selecting the value for the $V_{TH,CS}$ that results in the energy conversion efficiency 123 achieving the threshold condition. In operation 1616, the system performance controller 1108 sets or modifies the selected $V_{TH,CS}$ in the product memory of the power supply controller 104. In operation 1618, in some examples, the power supply controller 1104 measures the environment conditions, and applies the program control at periodic intervals.

Figure 17:
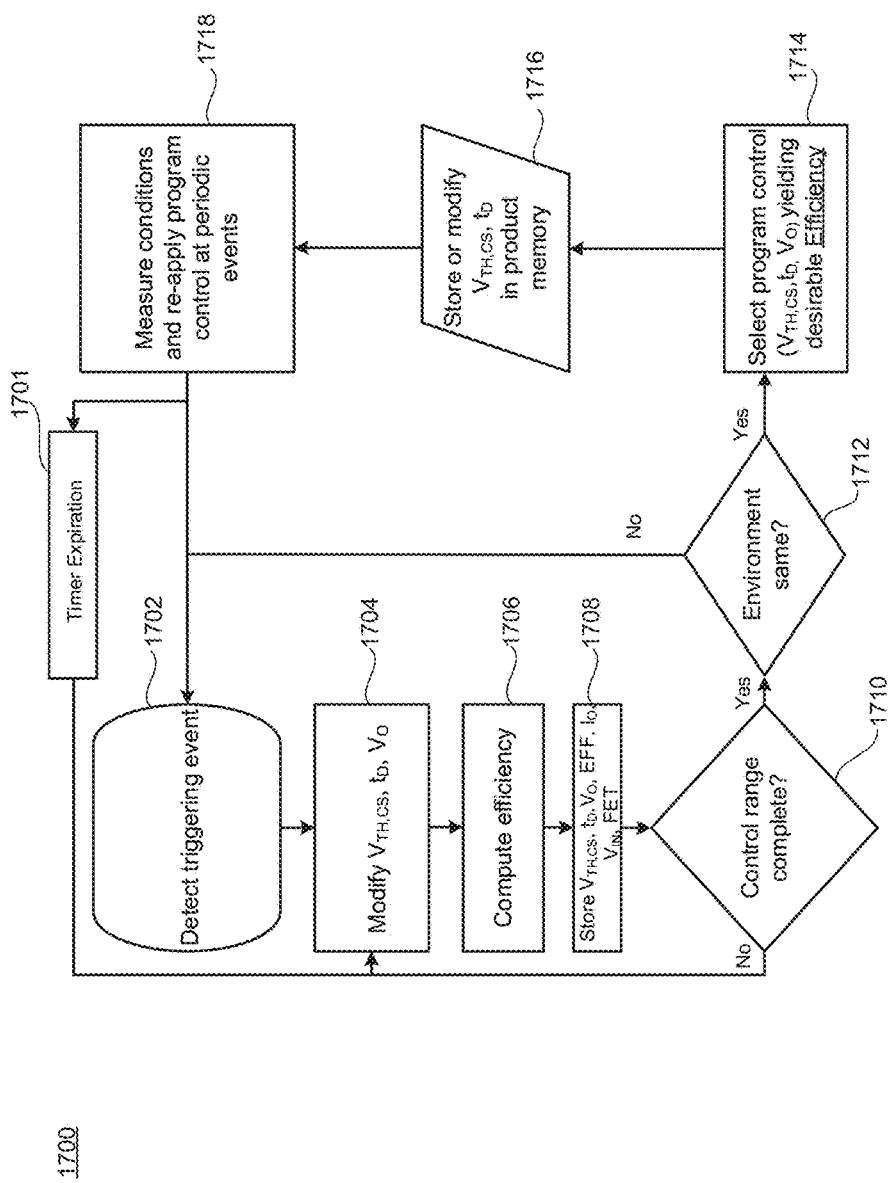
FIG. 17 illustrates a flowchart depicting example operations of a system performance controller for zero-voltage switching control using an applied learning algorithm according to another aspect.

FIG. 17 illustrates a flowchart 1700 depicting example operations of the power supply system 1100 according to another aspect. For example, the system performance controller 1108 is configured to execute the operations of the flowchart 1700 of FIG. 17 when the power stage 1102 is operating (which includes the periodic activation of the power stage 1102). The flowchart 1700 relates to the determination of a ZVS control parameter 142 that optimizes or provides an energy conversion efficiency 123 that achieves a threshold condition using the applied learning algorithm 136. In some examples, the ZVS control parameter 142 is a current sense voltage threshold ($V_{TH,CS}$). The $V_{TH,CS}$ indicates a magnitude of the reverse current ($I_{L,R}$) used to discharge the parasitic capacitance ($C_{OSS}$) during a time delay ($t_D$), thereby achieving ZVS. Although the flowchart 1700 of FIG. 17 is described with respect to the power supply system 1100, the operations of FIG. 17 may be applicable to any of the power supply systems discussed herein.

In operation 1702, the system performance controller 1108 may detect a triggering event. In some examples, the triggering event includes the power stage 1102 being activated. In some examples, the triggering event occurs during the operations of the power stage 1102. For example, while the power stage 1102 is executing, the system performance controller 1108 may detect a change in the environment conditions, thereby detecting a triggering event. In some examples, while the power stage 1102 is executing, the system performance controller 1108 may continuously (e.g., periodically) compute the energy conversion efficiency 123, and, in response to the energy conversion efficiency 123 not achieving the threshold condition, the system performance controller 1108 may detect the triggering event. In some examples, the system performance controller 1108 monitors a timer, and, in operation 1701, upon the detection of the timer expiration, the system performance controller 1108 is configured to trigger the operations of FIG. 17.

Upon the detection of the triggering event or the expiration of the timer, in operation 1704, the control manipulation module 130 modifies the $V_{TH,CS}$, the $t_D$ (time delay), and the $V_O$ (output voltage) according to the applied learning algorithm 136. In some examples, the control manipulation module 130 is configured to train and adjust the neural network 138 based on the historical data 140 to predict the energy conversion efficiency 123. The system performance controller 1108 stores the results in memory (e.g., the environment conditions (e.g., $V_{IN}$, $I_O$, and FET), the ZVS control parameters 142 (e.g., $V_{TH,CS}$, $T_D$, and $V_O$), and the predicted energy conversion efficiency. Then, the control manipulation module 130 is configured to select the $V_{TH,CS}$, $T_D$, and $V_O$ that maximizes energy conversion efficiency 123.

The system performance controller 1108 provides the selected $V_{TH,CS}$, the $t_D$, and the $V_O$ to the power supply controller 1104 such that the power stage 1102 operates according to these values. In operation 1706, the efficiency computation circuit 122 computes the energy conversion efficiency 123. For example, the system performance controller 1108 receives the measured conditions 103 from the metering circuit 1106 and computes the energy conversion efficiency 123 based on the measured conditions 103. In operation 1708, the system performance controller 1108 stores the environment conditions (e.g., $V_{IN}$, $I_O$, and FET), the ZVS control parameters 142 (e.g., $V_{TH,CS}$, $T_D$, and $V_O$), and the computed energy conversion efficiency 123.

In operation 1710, the system performance controller 1108 determines whether the control ranges of the ZVS control parameters 142 are complete. If no, the process returns to operation 1704 to loop through other values of $V_{TH,CS}$, $t_D$, and $V_O$, and the control manipulation module 130 modifies one or more of the $V_{TH,CS}$, $T_D$, and $V_O$ according to the applied learning algorithm 136. If yes, in operation 1712, the system performance controller 1108 determines whether the environment is substantially the same. If no, the system performance controller 108 directs the process back to operation 1702 until stability is detected. If yes, the process proceeds to operation 1714.

In operation 1714, the control manipulation module 130 is configured to select the combinations of $V_{TH,CS}$, $T_D$, and $V_O$ that yield the targeted energy conversion efficiency 123 for the current environment conditions. In operation 1716, the system performance stores or modify the $V_{TH,CS}$ and to in the product memory of the power supply controller 1104. In operation 1718, the power supply controller 1104 detects conditions and applies the program based on periodic events.

Figure 18A:
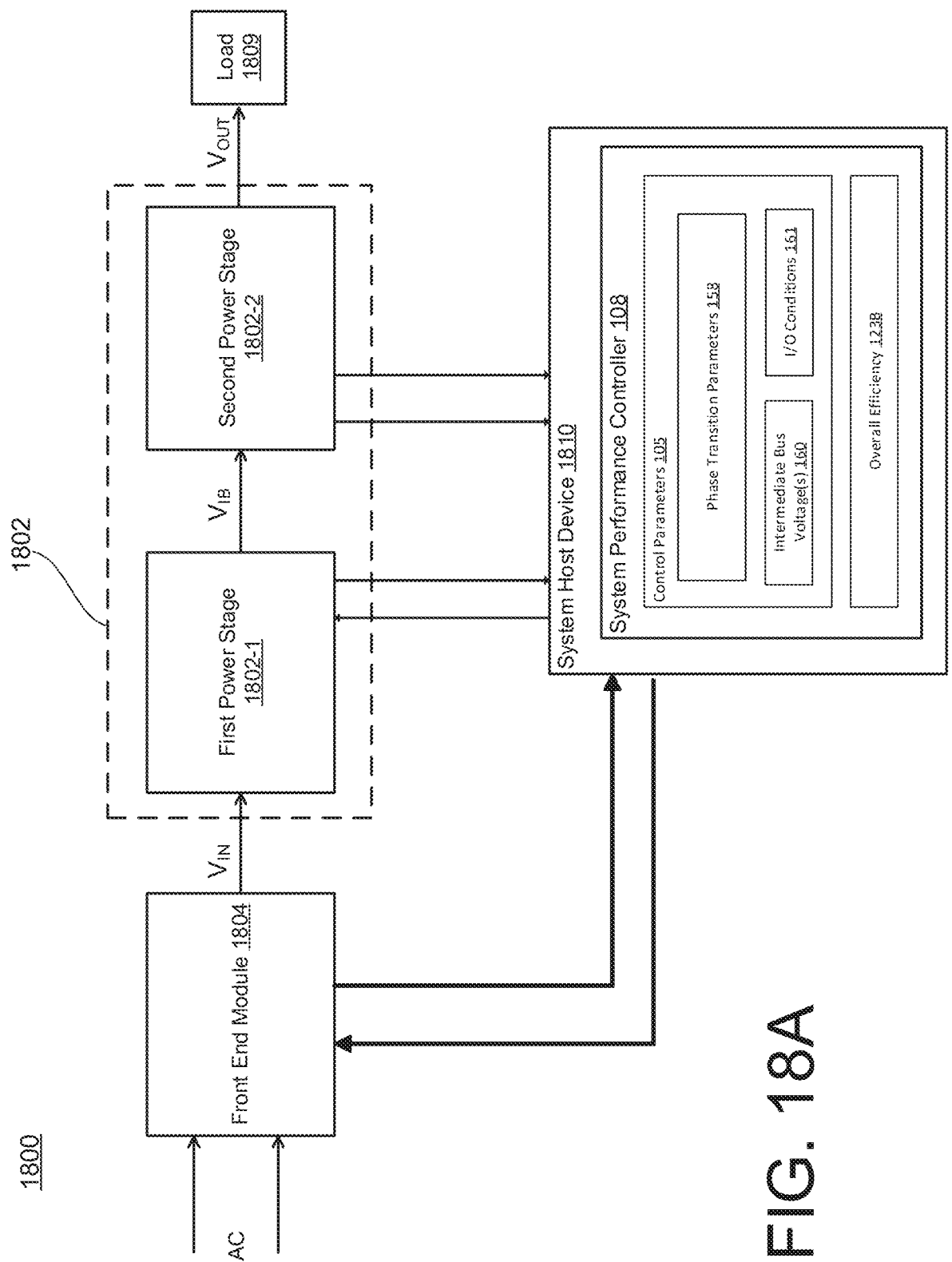
FIGS. 18A and 18B illustrate a power supply system having a system performance controller for controlling a plurality of serial power stages using overall efficiency according to an aspect.
Figure 18B:
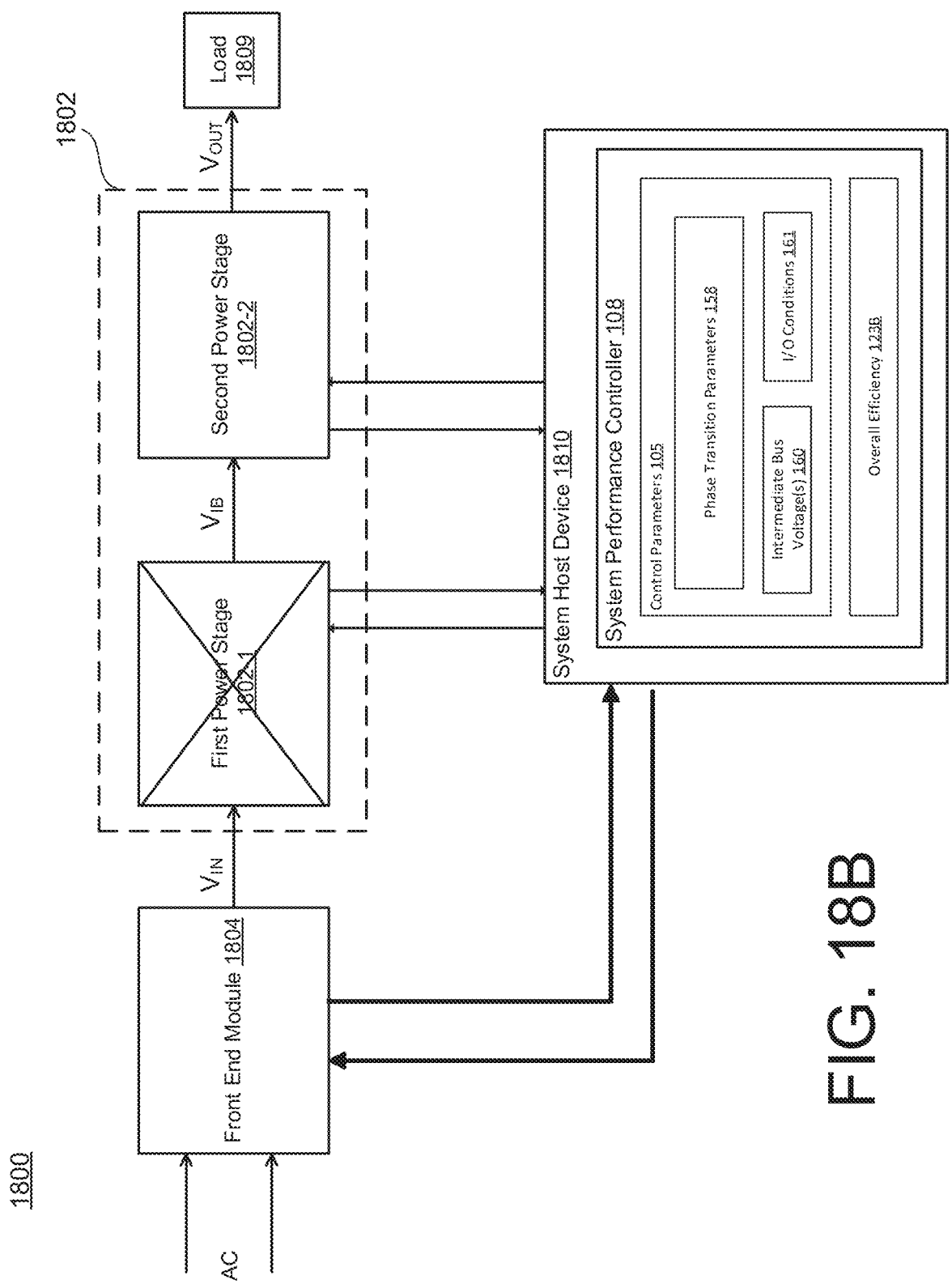

FIGS. 18A and 18B illustrate a power supply system 1800 having a system performance controller 1808 configured to optimize the performance the power supply system 1800 based on the overall efficiency 123B of the power supply system 1800. In some examples, the power supply system 1800 includes a cascade power system. In some examples, the power supply system 1800 is configured to power one or more server computers (e.g., cloud-based). In some examples, the power supply system 1800 is configured to power one or more telecommunication components (e.g., base station). The power supply system 1800 may include any of the features discussed with reference to the previous figures.

As shown in FIGS. 18A and 18B, the power supply system 1800 may include a front-end module 1804 configured to receive AC voltage and generate an input voltage (e.g., a DC voltage) ($V_{IN}$), a plurality of power stages 1802 configured to receive the input voltage ($V_{IN}$) and generate an output voltage ($V_{OUT}$) that is provided to a load 1809. In some examples, the front-end module 1804 includes a PFC front end AC-DC module.

The plurality of power stages 1802 includes a first power stage 1802-1 and a second power stage 1802-2. Although only two power stages are illustrated in FIGS. 18A and 18B, the power supply system 1800 may include any number of power stages such as three power stages, four power stages, five power stages, or more than five power stages. In some examples, the first power stage 1802-1 is a DC power stage (e.g., DC-DC converter), and the second power stage 1802-2 is a DC power stage. As shown in FIGS. 18A and 18B, the power stages 1802 are connected in series with the second power stage 1802-2 being coupled to the load 1809.

The power supply system 1800 may include a system host device 1810 communicatively coupled to each of the power stages 1802. In some examples, the system host device 1810 includes a multi-phase controller. In some examples, the system host device 1810 may include any of the features described with reference to the power supply controller of the previous figures. In some examples, the system host device 1810 is located at a location separate from the power stages 1802. In some examples, the system host device 1810 is included in a server computer. The system host device 1810 is communicatively coupled to the first power stage 1802-1 via a first communication link. In some examples, the first communication link is a network communication link (e.g., network-based such as the Internet). In some examples, the communication link is a power management bus (e.g., PMBus) (e.g., a two-wire communication protocol). The system host device 1810 is communicatively coupled to the second power stage 1802-2 via a second communication link. In some examples, the second communication link is a network communication link. In some examples, the second communication kink is the power management bus. Also, the system host device 1810 may be communicatively coupled to the front-end module 1804.

The system host device 1810 may include the system performance controller 108. The system performance controller 108 may include any of the features described with respect to the previous figures. Generally, the system host device 1810 (that executes the system performance controller 108) is configured to monitor environment conditions, measured conditions, and the control parameters 105 and apply any of the operations discussed herein to obtain a targeted overall efficiency 123B. In some examples, as discussed above, the system performance controller 1808 may determine the optimized control parameters 105 that causes the overall efficiency 123B to achieve the threshold condition, and then may store the control parameters 105 as historical data 140, which is then used during the operation of the power supply system 1800. In some examples, as discussed above, the system performance controller 108 may execute during the system's lifetime such that the control parameters 105 are re-adjusted as the environment changes (including thermal effects on the power supply system 1800) as well as the aging of components of the power supply system 1800 in order to assist with ensuring that the power supply system 1800 achieves the targeted overall efficiency threshold.

In some examples, the system performance controller 1808 is configured to control the power stages 1802 in a manner than optimizes or results in the overall energy conversion efficiency 123B achieving a threshold condition. For example, as shown in FIG. 18A, the first power stage 1802-1 and the second power stage 1802-2 may be both activated to provide power to the load 1809. However, if both power stages 1802 are activated, the overall efficiency 123B may be reduced when operating at relatively loads. As such, it may be more efficient to deactivate (e.g., isolate) one of the power stages 1802 as shown in FIG. 18B. As shown in FIG. 18B, the first power stage 1802-1 is deactivated, and the load 1809 is powered by the second power stage 1802-2.

The system performance controller 1808 may set or adjust one or more control parameters 105 for the power stages 1802 based on the overall efficiency 123B. In some examples, the control parameters 105 include the phase transition parameters 158 (e.g., phase shedding/adding transition points). The phase transition parameters 158 may include one or more efficiency transition points that indicate a timing of when to deactivate (or activate) one or more power stages 1802 such that the efficiency transition points cause the overall efficiency 123B to achieve a threshold condition. In some examples, an efficiency transition point is activation/deactivation of a power stage 102 at a particular $I_O$ value.

For example, the system performance controller 108 is configured to determine when to enable and/or disable phases (e.g., power stages 1802) in a manner that optimizes the overall efficiency 123B. In some examples, the system performance controller 108 may optimize phase shedding transitions to maximize the overall efficiency 123B over the power curve (e.g., entire power curve). For example, one way to reduce switching losses (e.g., at light loads) is to decrease the number of power stages 1802 in operation, e.g., reducing the number of phases in operation (e.g., referred to as phase shedding). Therefore, phase shedding may be defined as the process of being able to shed an increasing number of phases, when the load current (e.g., $I_O$) passes decreasing thresholds. The vice versa process may be defined as phase adding. In some examples, phase shedding may increase in the overall efficiency 123B of the power supply system 1800 at light loads.

For example, the system performance controller 108 may include any of the features previously described, e.g., the efficiency computation circuit 122, and the control manipulation module 130. The system performance controller 108 is configured to receive the measured conditions 103 from the first power stage 1802-1 via the first communication link and measured conditions 103 from the second power stage 1802-2 via the second communication link. The measured conditions 103 may include any of the previously described information such as the input voltage, input current, output voltage, output current, etc. for each of the power stages 1802. The system performance controller 108 is configured to compute the overall efficiency 123B for the power stages 1802 as a whole, and then determine or adjust the phase transition parameters 158 such that the overall efficiency 123B achieves a threshold condition. In some examples, the system performance controller 108 computes the individual efficiency 123A for each of the power stages 1802. The system host device 1810 is configured to control the power stages 1802 according to the set or adjusted phase transition parameters 158.

Figure 19:
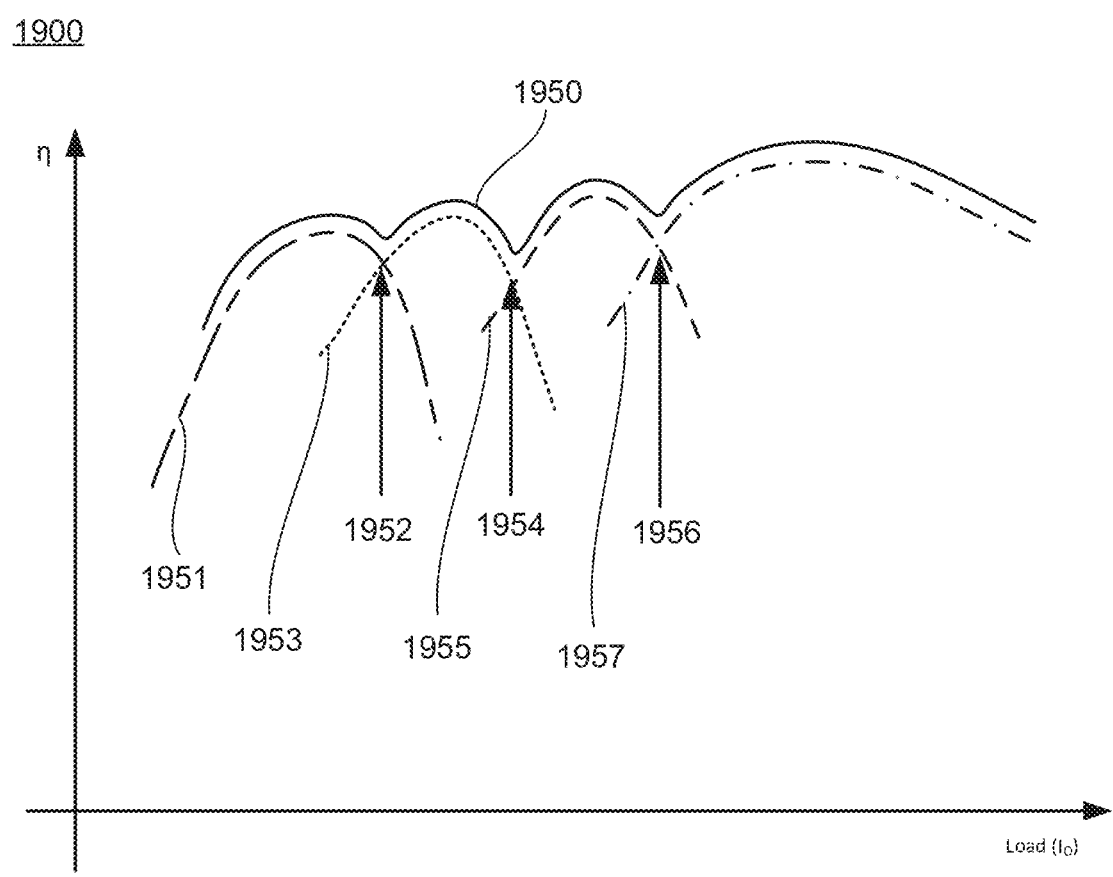
FIG. 19 illustrates phase transition points along an overall efficiency power curve as control parameters for a power supply system according to an aspect.

FIG. 19 illustrates a graph 1900 showing energy conversion efficiency of the power supply system 1800 versus increasing load conditions (e.g., Jo). For example, the graph 1900 depicts an efficiency curve 1951 for a first power stage, an efficiency curve 1953 for a second power stage, an efficiency curve 1955 for a third power stage, and an efficiency curve 1957 from a fourth power stage. At light load conditions, the first power stage may be activated and the second through fourth power stages may be deactivated (or isolated). As the load conditions increase (and with respect to phase adding), the system performance controller 108 is configured to determine a transition point 1952 to activate the second power stage, a transition point 1954 to activate the third power stage, and a transition point 1956 to activate the fourth power stage in a manner that optimizes the overall efficiency curve 1950. These transition points may be used for phase shedding as well. The system host device 1810 may be configured to enable/disable phases based on the efficiency transition points as shown by the arrows in FIG. 19.

In some examples, the control parameters 105 include intermediate bus voltage(s) 1895. For example, referring to FIGS. 18A and 18B, the voltage between the first power stage 1802-1 and the second power stage 1802-2 is identified as $V_{IB}$. In some examples, the system performance controller 1808 may determine or adjust $V_{IB}$ in a manner that causes the overall efficiency 123B to achieve the threshold condition. In some examples, the control parameters 105 include I/O conditions 161. The I/O conditions 161 may include the input voltage and/or output voltage of one or more of the power stages 1802. For example, the levels of input/output voltages may be control parameters 105 that are optimized by the system performance controller 108 to achieve the targeted overall efficiency condition.

Figure 20A:
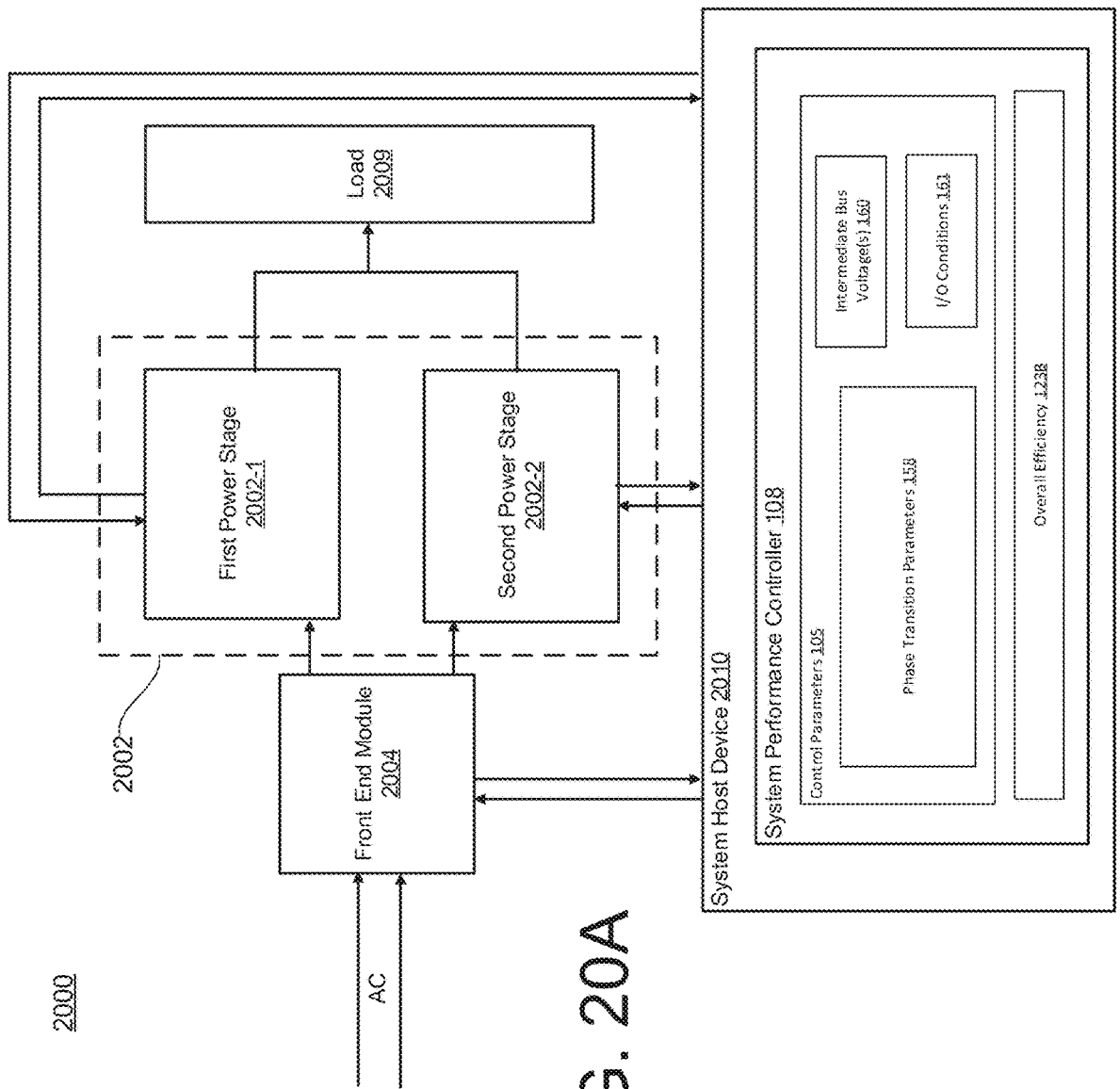
FIGS. 20A and 20B illustrate a power supply system having a system performance controller for controlling a plurality of parallel power stages using overall efficiency according to an aspect.
Figure 20B:
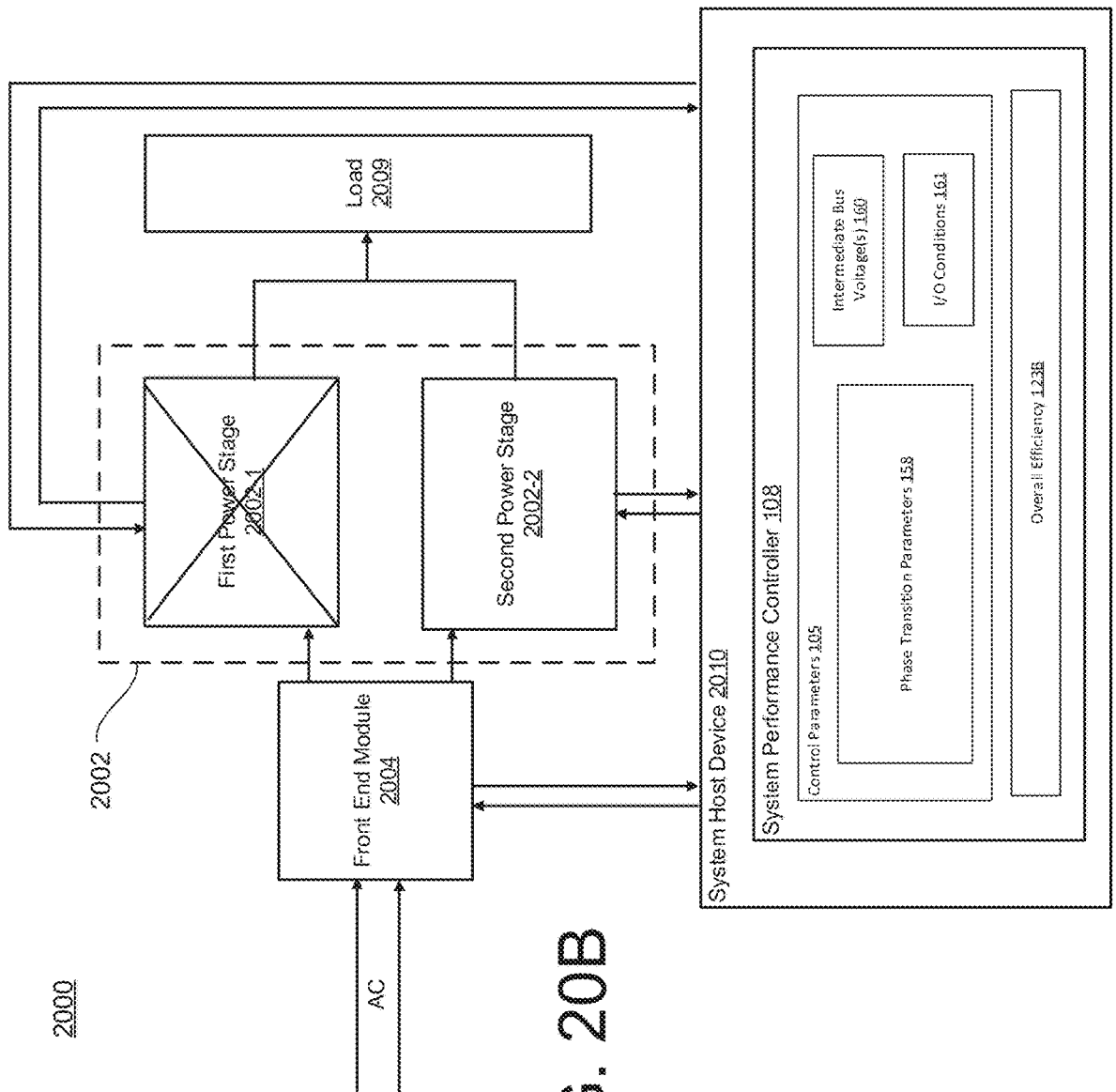

FIGS. 20A and 20B illustrate a power supply system 2000 having a plurality of power stages 2002 connected in parallel. For example, the power supply system 2000 is similar to the power supply system 1800 of FIGS. 18A and 18B except that the power stage 2002 are connected in parallel (e.g., as opposed to being connected in series). As such, the power supply system 2000 may include any of the features of the power supply system 1800. For example, the power supply system 2000 may include a system host device 2010 having the system performance controller 108. The power supply system 2000 may include a front-end module 2004 configured to receive AC voltage and generate an input voltage (e.g., a DC voltage) ($V_{IN}$), a plurality of power stages 2002 configured to receive the input voltage ($V_{IN}$) and generate an output voltage ($V_{OUT}$) that is provided to a load 2009. The plurality of power stages 2002 includes a first power stage 2002-1 and a second power stage 2002-2.

Figure 21:
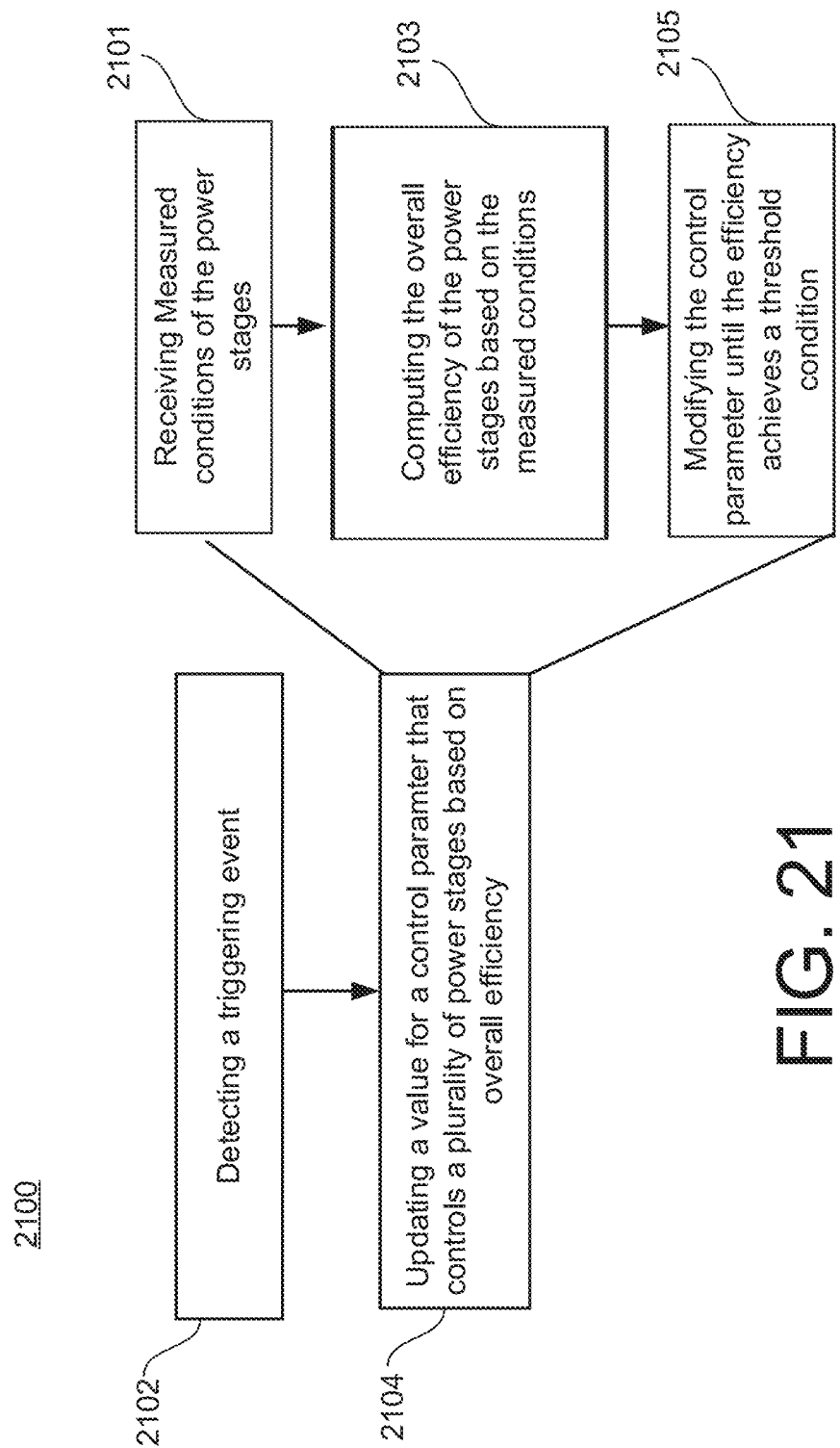
FIG. 21 illustrates a flowchart depicting example operations of a system performance controller for controlling a plurality of power stages using overall efficiency according to an aspect.

FIG. 21 illustrates a flowchart 2100 depicting example operations of the power supply systems of FIGS. 18A-18B and 20A-20B according to an aspect. Although the flowchart 2100 is described with reference to the power supply system 1800 of FIGS. 18A-18B, the operations of FIG. 21 may be applicable to any of the power system described herein.

In operation 2102, the system performance controller 108 detects a triggering event. In some examples, the triggering event includes activation of the power stages 1802. In some examples, the triggering event includes detection of a change to one or more environment conditions. In some examples, the triggering event includes the expiration of a timer. In some examples the triggering event includes the detection of the overall efficiency 123B not achieving the threshold condition.

In operation 2104, the system performance controller 108 updates a value for the control parameter 105 that controls a plurality of power stages 1802 based on the overall efficiency 123B. In some examples, the control parameter 105 is a phase transition parameter 158. In some examples, the phase transition parameter 158 define one or more efficiency transition points that indicate a timing of when to deactivate or activate one or more power stages 1802. In some examples, the power stages 1802 are connected in series. In some examples, they are connected in parallel (e.g., as shown in FIGS. 20A and 20B). In some examples, the control parameter 105 is an intermediate bus voltage 160. In some examples, the control parameter 105 is an I/O condition 161.

For examples, in operation 2101, the system performance controller 108 may receive the measured conditions 103 of the power stages 1802. The measured conditions 103 include the DC input voltage, the input current, the DC output voltage, and the output current. In operation 2103, the system performance controller 108 computes the overall efficiency 123B based on the measured conditions 103. In operation 2105, the system performance controller 108 modifies the control parameter 105 until the overall efficiency 123B achieves the threshold condition.

In some examples, the control manipulation module 130 modifies the control parameter 105 using the AI algorithm 132. In some examples, the AI algorithm 132 is the targeted search algorithm 134. In some examples, the AI algorithm is the applied learning algorithm 136. In some examples, the control manipulation module 130 applies historical data 140 to the neural network 138 to predict a value for the control parameter 105 that results in the energy conversion efficiency 123 achieving the threshold condition. In some examples, the system performance controller 108 determines a first value of the control parameter 105 that results in the energy conversion efficiency 123 achieving the threshold condition for a first environment condition and determine a second value of the control parameter 105 that results in the energy conversion efficiency 123 achieving the threshold condition for a second environment condition. In some examples, the first and second environment conditions are different voltages.

Figure 22:
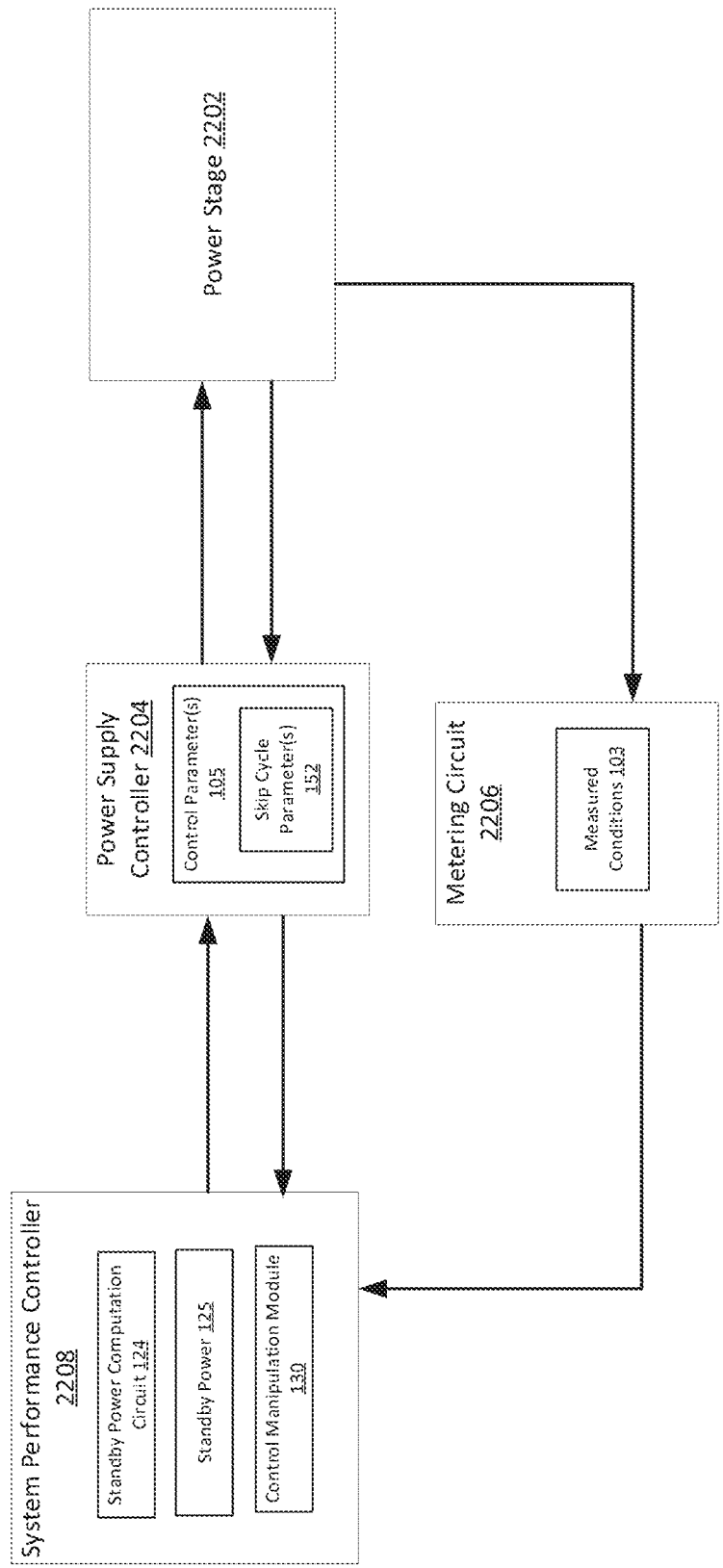
FIG. 22 illustrates a power supply system having a system performance controller for setting or adjusting control parameters based on standby power according to an aspect.

FIG. 22 illustrates a power supply system 2200 having a power supply controller 2204 configured to control a power stage 2202, a metering circuit 2206 configured to sense measured conditions 103, and a system performance controller 2208 including the standby power computation circuit 124 configured to compute the standby power 125 based on the measured conditions 103, and the control manipulation module 130 configured to adjust one or more control parameters 105 until the standby power 125 is minimized and/or achieves a threshold level. In some examples, the control parameters 105 include the skip cycle parameters 152.

For example, the system performance controller 2208 receives the measured conditions 103 (e.g., in a digital format) from the metering circuit 2206. The measured conditions 103 may include the input voltage and the input current. The standby power computation circuit 124 computes the standby power 125 based on the input voltage and the input current (e.g., $V_{in}*I_{in}$). Then, the control manipulation module 130 is configured to repeatedly modify, a control parameter 105 (or a set of control parameters 105) until the standby power 125 achieves the threshold condition.

The standby power 125 may be the electrical energy that is used by a deactivated device (e.g., the device is coupled to the power stage 2202, but switched off). For example, when the deactivated device is coupled to the power stage 102, the power supply controller 2204 may control the power stage 102 in a skip-cycle mode (e.g., skip mode, skip-cycle modulation, etc.). In some examples, the skip cycle parameters 152 include one or more parameters that define a control signal for the switching operations during the skip-cycle mode.

Figure 23:
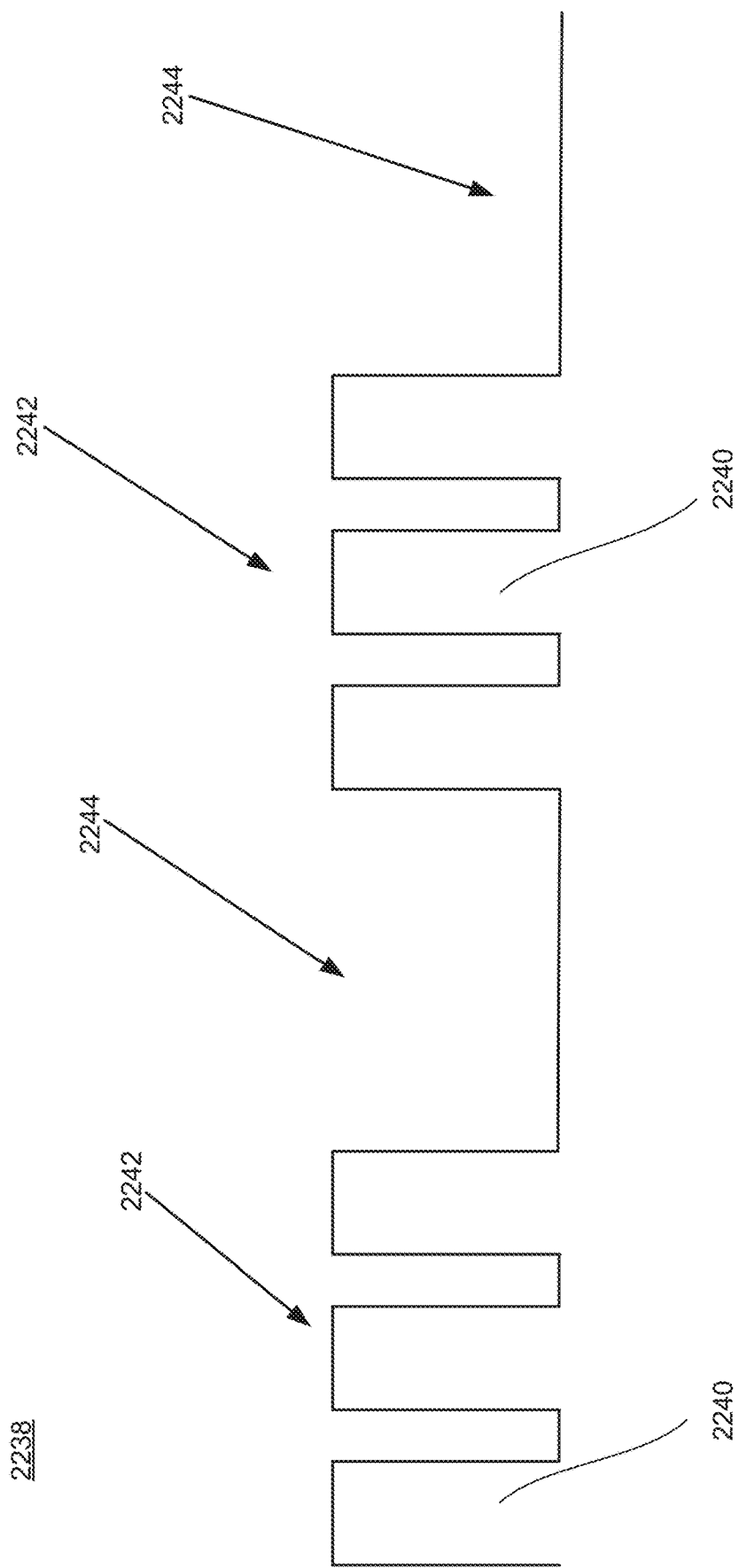
FIG. 23 illustrates a control signal during a skip-cycle mode to control one or more power stages according to an aspect.

FIG. 23 illustrates an example of a control signal 2238 for the skip-cycle mode. The power supply controller 2204 may generate pulses 2240 during a burst period 2242, and then waits until after a skip-cycle period 2244 to generate another set of pulses 2240. For example, after the burst period 2242, the power supply controller 2204 does not generate pulses 2240 during the skip-cycle period 2244. After the skip-cycle period 2244, the power supply controller 2204 generates another set of pulses 2240 during the subsequent burst period 2242. In some examples, the skip-cycle parameters 152 may include the frequency of the pulses 2240 during the burst period 2242, the duty cycle during the burst period 2242, the frequency between burst periods 2242, and/or the length of the skip cycle period 2244.

Figure 24:
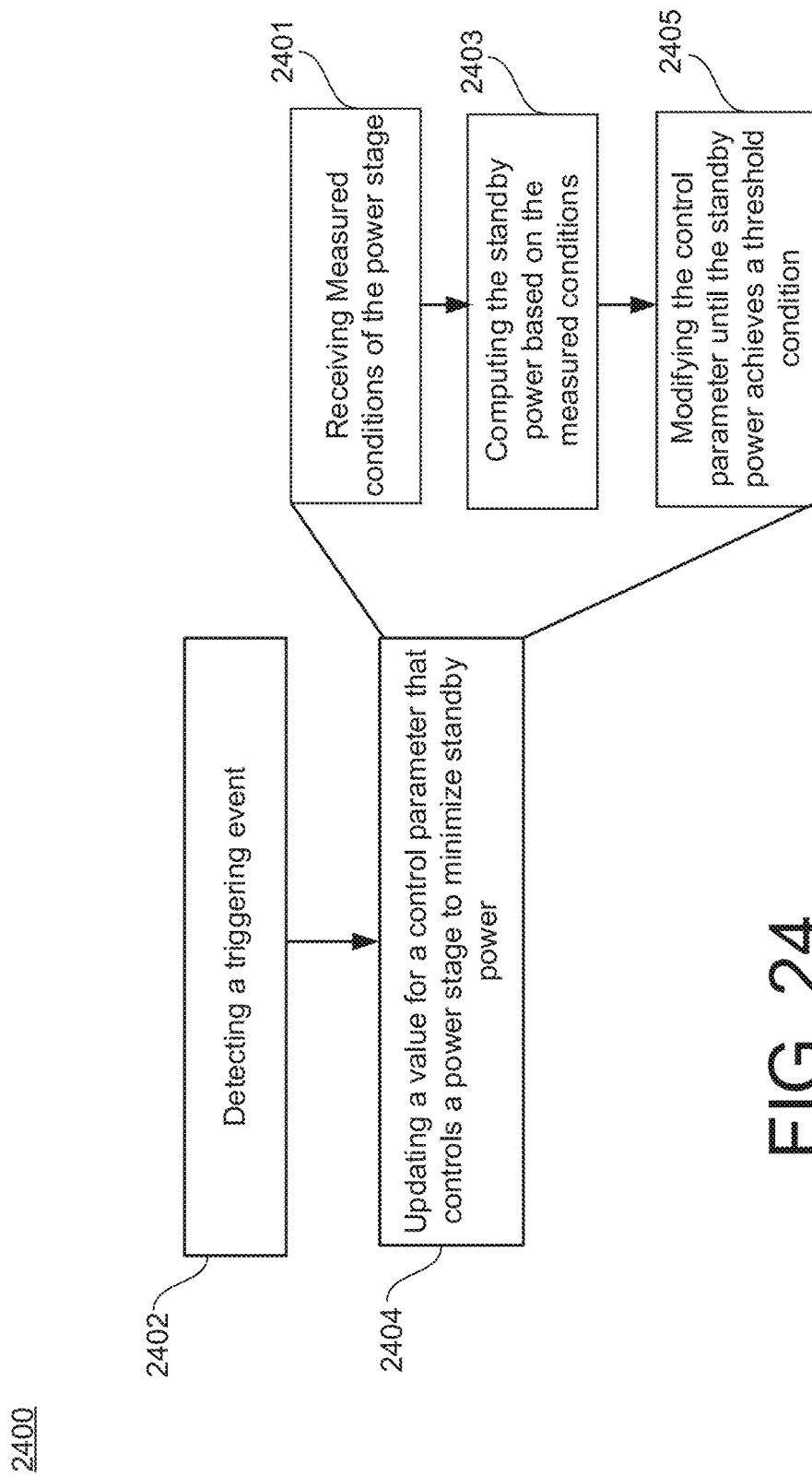
FIG. 24 illustrates a flowchart depicting example operations of a system performance controller for controlling a power stage based on standby power according to an aspect.

FIG. 24 illustrates a flowchart 2400 depicting example operations of the power supply system 2200 of FIG. 22 according to an aspect. Although the flowchart 2400 is described with reference to the power supply system 2200 of FIG. 24, the operations of FIG. 24 may be applicable to any of the power system described herein.

In operation 2402, the system performance controller 2208 detects a triggering event. In some examples, the triggering event includes activation of the power stage 2202. In some examples, the triggering event includes detection of a change to one or more environment conditions. In some examples, the triggering event includes the expiration of a timer. In some examples the triggering event includes the detection of the standby power 125 not achieving the threshold condition.

In operation 2404, the system performance controller 2208 updates a value for the control parameter 105 that controls the power stage 2202 to minimize the standby power 125. In some examples, the control parameter 105 includes one or more skip-cycle parameters 152. For example, in operation 2401, the system performance controller 2208 may receive the measured conditions 103 of the power stage 2202. In some examples, the measured conditions 103 include the input voltage and the input current. In operation 2403, the system performance controller 1108 computes the standby power 125 based on the measured conditions 103 (e.g., $V_{IN}*I_{IN}$). In operation 2405, the system performance controller 2208 modifies the control parameter 105 until the standby power 125 achieves the threshold condition.

In some examples, the control manipulation module 130 selects a first value for the control parameter 105 and sends the first value to the power supply controller 2204. Then, the standby power computation circuit 124 computes the standby power 125 of the power stage 2202 that operates according to the first value based on the measured conditions 103. Then, the control manipulation module 130 modifies the first value to obtain a second value in response to the standby power 125 not achieving the threshold condition and sends the second value to the power supply controller 104. Then, the standby power computation circuit 124 computes the standby power 125 of the power stage 2202 that operates according to the second value based on the measured conditions 103.

In some examples, the control manipulation module 130 modifies the control parameter 105 using the AI algorithm 132. In some examples, the AI algorithm 132 is the targeted search algorithm 134. In some examples, the AI algorithm 132 is the applied learning algorithm 136. In some examples, the control manipulation module 130 applies historical data 140 to the neural network 138 to predict a value for the control parameter 105 that results in the standby power 125 achieving the threshold condition. In some examples, the system performance controller 2208 determines a first value of the control parameter 105 that results in the standby power 125 achieving the threshold condition for a first environment condition and determines a second value of the control parameter 105 that results in the standby power 125 achieving the threshold condition for a second environment condition.

Figure 25:
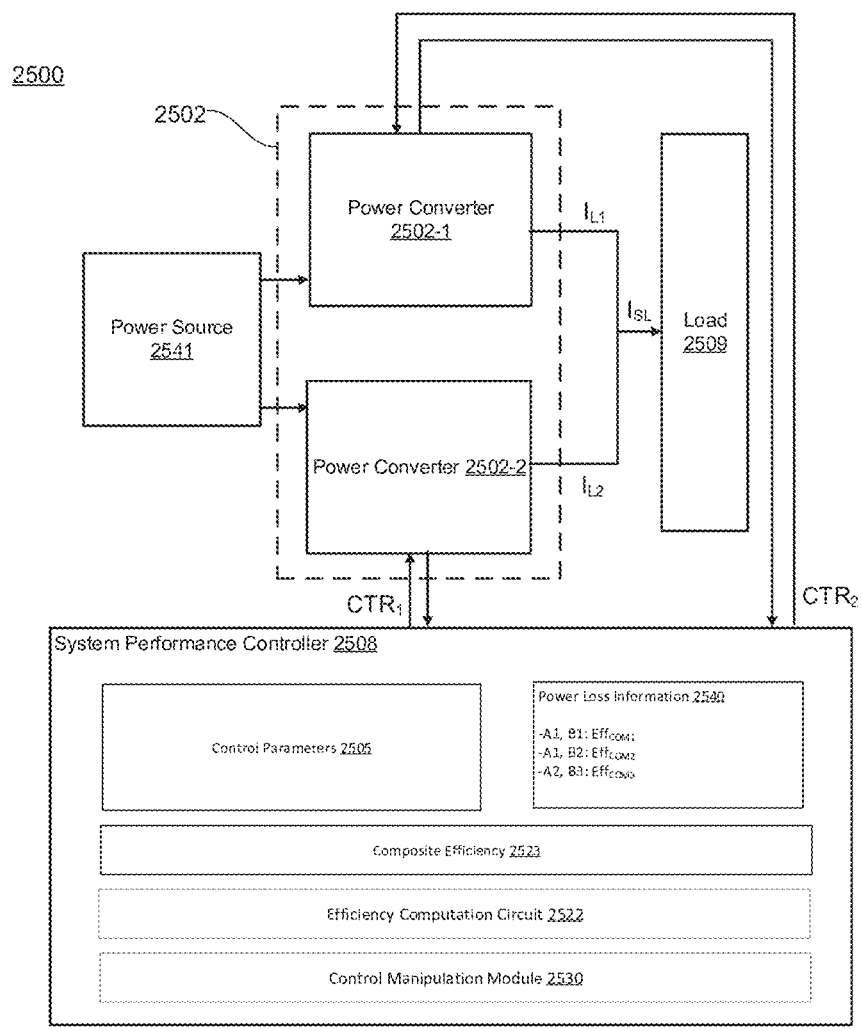
FIG. 25 illustrates a power supply system for controlling load distribution across multiple converters to optimize overall efficiency according to an aspect.

FIG. 25 illustrates a power supply system 2500 for controlling power distribution across a plurality of power converters 2502 to optimize composite efficiency 2523 according to an aspect. In some examples, the power supply system 2500 may be similar to the phase shedding embodiments (explained above) and include assessing efficiency for each power converter 2502 and applying them for improved or optimal composite efficiency 2523, which may be beneficial when power converters 2502 have dissimilar efficiencies over the load range. Generally, the power supply system 2500 may include any of the details discussed with reference to the previous figures. In some examples, the power supply system 2500 is an example of the power supply system 100 of FIG. 1A, the power supply system 500 of FIG. 5, the power supply system 600 of FIG. 6, the power supply system 1100 of FIG. 11 (including the power supply controller 1104 of FIG. 12), and/or the power supply system 2000 of FIGS. 20A-20B and may include any of the detail discussed herein with respect to those figures and/or any of the flowcharts related to those figures.

The power converters 2502 are connected a load 2509. The power converters 2502 are connected to the load 2509 in a manner such that the output currents of the power converters 2502 combine to provide a system load current JO to the load 2509. In some examples, the power converters 2502 are connected in parallel with respect to each other. In some examples, one or more power converters 2502 are not connected in parallel with one or more other power converters 2502 but are configured in a manner such that their current outputs are combined to produce the system load current ($I_{SL}$).

The power supply system 2500 includes a power source 2541 coupled to the power converters 2502. In some examples, the power source 2541 is an AC power source. In some examples, the power source 2541 is a DC power source. In some examples, the power supply system 2500 includes multiple power sources 2541 (e.g., independent power sources which can be DC and/or AC power sources). For example, two or more power converters 2502 may draw power from independent power sources, but their outputs combine to provide the system load current ($I_{SL}$). The power converters 2502, collectively, are configured to deliver the system load current ($I_{SL}$) to the load 2509. The system load current ($I_{SL}$) is a combination of individual load currents (e.g., $I_{L1}$, $I_{L2}$) provided by the power converters 2502. In some examples, the power converters 2502 are AC to DC power converters. In some examples, the power converters 2502 are DC to DC power converters.

The power converters 2502 include a first power converter 2502-1 and a second power converter 2502-2. Although FIG. 25 illustrates two power converters 2502, the power supply system 2500 may include any number of power converters 2502 such as three power converters, four power converters, or more than four power converters. In some examples, an individual power converter 2502 may be referred to as a power stage (e.g., the power stage 102 of FIG. 1A). The power converters 2502 may encompass one of a wide variety of topologies such as a buck converter, boost converter, inverting buck-boost converter, fly-back converter, active clamp forward converter, single switch forward converter, two switch forward converter, push-pull converter, half-bridge converter, full-bridge converter, phase-shafted full-bridge converter, etc. In some examples, the power converters 2502 include switching resonant converters.

In some examples, the first power converter 2502-1 includes a metering circuit (e.g., the metering circuit 106 of FIG. 1A) that senses the input and output conditions (e.g., the input current, input voltage, output voltage, output current). In some examples, the metering circuit of the first power converter 2502-1 includes the details of the metering circuit 1106 of FIG. 11 (e.g., the multiplexers, ADCs, sensors, etc.). In some examples, the first power converter 2502-1 may include a power supply controller (e.g., the power supply controller 104 of FIG. 1A) configured to control the operations of the first power converter 2502-1. In some examples, the first power converter 2502-1 and/or the second power converter 2502-1 include the details of the power supply controller 1104 of FIG. 12 (e.g., PWM logic circuit, differential sensor, digital compensator, multi-slope ramp generator, polarity logic, gate drive logic, etc.). In some examples, the second power converter 2502-2 may include the same/similar components of the first power converter 2502-1 such as the metering circuit and the power supply controller.

The power supply system 2500 includes a system performance controller 2508 communicately coupled to the power converters 2502. The system performance controller 2508 may include any one or more of the details discussed with reference to the system performance controllers of the previous figures. For example, the system performance controller 2508 is a computing device having one or more memory devices and one or more digital processors. The memory device(s) include executable instructions that cause the digital processor(s) to execute the operations of the system performance controller 2508. In some examples, the system performance controller 2508 includes one or more integrated circuits. In some examples, the system performance controller 2508 includes one or more field-programmable gate arrays (FPGAs). In some examples, the system performance controller 2508 includes one or more state machines.

The system performance controller 2508 may include a control manipulation module 2530 configured to adjust control parameters 2505 and an efficiency computation circuit 2522 configured to compute a composite efficiency 2523 based on the measured input and output conditions of the power converters 2502. In some examples, the control parameters 2505 include individual load currents of the power converters 2502 such as a first load current ($I_{L1}$) provided by the first power converter 2502-1 and a second load current ($I_{L2}$) provided by the second power converter 2502-2. The system performance controller 2508 may use the control manipulation module 2530 and the efficiency computation circuit 2522 to generate power loss information 2540, which is used by the system performance controller 2508 to select the values for the individual load currents to increase or optimize composite efficiency 2523 (in some examples, provide the maximum or highest composite efficiency 2523).

The system performance controller 2508 may activate the first power converter 2502-1 (and deactivate the second power converter 2502-2), and the control manipulation module 2530 may step through (or loop through) values of the first load current ($I_{L1}$) over the current load range of the first power converter 2502-1, and the system performance controller 2508 may compute the individual efficiency of the first power converter 2502-1 at each iteration.

If the first power converter 2502-1 has a current load range of 100 A, in some examples, the control manipulation module 2530 may initially set the value of the first load current ($I_{L1}$) to 0 A, and the efficiency computation circuit 2522 may receive the measured input and output conditions (e.g., $V_{IN}$, $V_{OUT}$, $I_{IN}$, $I_{OUT}$), and compute the individual efficiency based on the measured input and output conditions (e.g., $(V_{OUT}*I_{OUT})/(V_{IN}*I_{IN})$). In some examples, the efficiency computation circuit 2522 computes the power loss incurred by the first power converter 2502-1 (e.g., $(V_{IN}*I_{IN})-(V_{OUT}*I_{OUT})$). For example, the power loss incurred by the first power converter 2502-1 may indicate the level of efficiency of the first power converter 2502-1. In some examples, the efficiency computation circuit 2522 stores the value (e.g., 0 A) of the first load current ($I_{L1}$) along with the corresponding individual efficiency and/or power loss as efficiency data.

Then, the control manipulation module 2530 selects another value of the first load current (e.g., 10A), and the efficiency computation circuit 2522 receives the measured input and output conditions of the first power converter 2502-1, computes the individual efficiency and/or power loss at the new value, and stores the value (e.g., 10 A) of the first load current ($I_{L1}$) along with the corresponding individual efficiency and/or power loss. The process continues as so forth until the efficiencies and/or power losses are computed for the entire load current range of the first power converter 2502-1. In some examples, if the load current range is 100 A, the control manipulation module 2530 may step through the values of the first load current ($I_{L1}$) in increments of 10 (e.g., 0 A, 10A, 20A, 30A through 100A). Although the above example uses increments of 10 A, the control manipulation module 2530 may step through or loop through the value in any increment.

The system performance controller 2508 may activate the second power converter 2502-2 (and deactivate the first power converter 2502-1), and the control manipulation module 2530 may step through (or loop through) values of the second load current over the current load range of the second power converter 2502-2, and the system performance controller 2508 may compute the individual efficiency and/or power loss of the second power converter 2502-2 at each iteration in the same manner as described above with reference to the first power converter 2502-1.

In some examples, the system performance controller 2508 may combine the efficiency data generated by stepping through (or looping through) the values of the first load current ($I_{L1}$) and the efficiency data generated by stepping through (or looping through) the values of the second load current to generate the power loss information 2540. In some examples, for each combination of load currents, the system performance controller 2508 may combine the efficiency (e.g., the power loss) for the power converters 2502 to generate a total power loss (also referred to as composite efficiency 2523).

Table 1 below provides an example of a portion of the power loss information 2540.

| Total System Current (A) | First Load Current (A) | Second Load Current (A) | Loss (Unit1) (W) | Loss (Unit2) (W) | Total Loss (Composite Efficiency 2523) (W) |
| --- | --- | --- | --- | --- | --- |
| 10 | 10 | 0 | 69.6 | 10 | 79.6 |
|  | 0 | 10 | 5 | 84 | 89 |
| 20 | 20 | 0 | 96 | 10 | 106 |
|  | 10 | 10 | 69.6 | 84 | 153.6 |
|  | 0 | 20 | 5 | 108 | 113 |
| 30 | 30 | 0 | 104.4 | 10 | 114.4 |
|  | 20 | 10 | 96 | 84 | 180 |
|  | 10 | 20 | 69.6 | 108 | 177.6 |
|  | 0 | 30 | 5 | 104.4 | 109.4 |

In some examples, as shown in Table 1, the composite efficiency 2523 may be expressed as a total power loss (e.g., the power loss incurred by the first power converter 2502-1 plus the power loss incurred by the second power converter 2502-2). For example, the lowest total power loss may indicate the highest composite efficiency 2523, or the highest total power loss may indicate the lowest composite efficiency 2523. In some examples, the power loss information 2540 may express the composite efficiency 2523 in terms of a composite percentage (e.g., 93%) that reflects the overall (or end-to-end) efficiency. The composite efficiency 2523 may refer to the end-to-end power conversion efficiency. In some examples, the composite efficiency 2523 is an example of the overall efficiency 123 of FIG. 1B and one of the performance metrics 101 of FIG. 1B. In some examples, the composite efficiency 2523 may be expressed in terms of a percentage and/or total loss incurred by the power converters 2502.

If the total system maximum current is 200 A, the power loss information 2540 would specify the load current combinations and composite efficiencies 2523 over the entire range of 0-200 A instead of only the combinations of load currents at 10 A, 20 A, and 30 A as shown in Table 1 (e.g., Table 1 would go up to 200 A). The power loss information 2540 includes the composite efficiency 2523 for combinations of values of the first load current ($I_{L1}$) and values of the second load current ($I_{L2}$). In some examples, the power loss information 2540 includes load current combinations over a range of system load current values, and each load current combination provides a separate combination of values for the individual load currents along with its computed composite efficiency 2523. As shown with respect to Table 1, one particular load current combination is (10 A, 0 A) that provides a composite efficiency 2523 based on 79.6 W power loss, and the next load current combination is (0 A, 10 A) that provides a composite efficiency 2523 based on 89 W power loss.

In some examples, the control manipulation module 2530 iteratively modifies the values of the first load current ($I_{L1}$) and the second load current ($I_{L2}$) by selecting different values for the control parameter(s) 2505 based on an artificial intelligence (AI) algorithm (e.g., the AI algorithm 132 of FIG. 1A). For example, the control manipulation module 2530 may execute the AI algorithm (inputted with the power loss information 2540 or a portion of the power loss information 2540) to identify which value(s) of the first load current ($I_{L1}$) and the second load current ($I_{L2}$) to select next.

In some examples, the AI algorithm may obtain a maximum weighted combination of the computed metrics (e.g., the efficiencies) for combinations of the load currents, and then selects the value(s) for the load currents that correspond to the maximum weighted combination. In some examples, the AI algorithm obtains the maximum weighted combination based on a predetermined minimization, targeting or maximizing each of the computed metrics.

In some examples, the AI algorithm includes a targeted search algorithm (e.g., the targeted search algorithm 134 of FIG. 1A). The targeted search algorithm may be a search algorithm that selects a value for the first load current ($I_{L1}$) and/or the second load current ($I_{L2}$) in a manner than maximizes composite efficiency 2523. In some examples, the AI algorithm includes an applied learning algorithm (e.g., the applied learning algorithm 136 of FIG. 1A) that defines a neural network (inputted with the power loss information 2540) to predict value(s) for one or more control parameters 2505. For example, according to the applied learning algorithm, the control manipulation module 2530 is configured to apply the power loss information 2540 (e.g., also referred to as training data) to the neural network to predict value(s) for one or more of the first load current ($I_{L1}$) and the second load current ($I_{L2}$) that result in the composite efficiency 2523 achieving the threshold condition.

The system performance controller 2508 is configured to, in response to the power converters 2502 being activated (e.g., turned-on) in an operating environment (e.g., placed in the field), detect a value of the system load current ($I_{SL}$). In some examples, upon activation, the power converters 2502 initialize according to a start-up operation, which may involve the first power converter 2502-1 and the second power converter 2502-2 providing the same load current to the load 2509. For example, if the first power converter 2502-1 has a load capacity of 100 A and the second power converter 2502-2 has a load capacity of 100 A, the power supply system 250 may operate each of these converters at 50% so that the first power converter 2502-1 provides 50 A for the first load current ($I_{L1}$) and the second power converter 2502-2 provides 50 A for the second load current ($I_{L2}$) for a total system current ($I_{SL}$) of 100 A. However, for a total system current ($I_{SL}$) of 100 A, operating each of the first power converter 2502-1 and the second power converter 2502-2 at 50% may not be the most efficient in terms of composite efficiency 2523.

After the power converters 2502 have stabilized, the system performance controller 2508 may detect the value of the system load current ($I_{SL}$), and determine, using the power loss information 2540, values for the individual load currents (e.g., $I_{L1}$, $I_{L2}$) such that the composite efficiency 2523 at the detected value achieves a threshold condition. In some examples, the threshold condition is a maximum or highest composite efficiency 2523. In some examples, the threshold condition is a composite efficiency 2523 exceeding a threshold level. In some examples, the threshold condition is not the highest composite efficiency but an efficiency that is relatively close to the highest composite efficiency.

The system performance controller 2508 may detect that the system load current is 20 A, and, in some examples, the system performance controller 2508 may select, using the power loss information from Table 1, 20 A for the first load current ($I_{L1}$) and 0 A for the second load current ($I_{L2}$) since the combination of 20 A for the first load current ($I_{L1}$) and 0 A for the second load current ($I_{L2}$) provides the highest composite efficiency 2523 (e.g., resulting in the lowest total power loss). This approach may be referred to as the optimal sharing (OS) approach. For example, according to the OS approach, the system performance controller 2508 may determine which load current combination provides the highest composite efficiency 2523 (e.g., resulting in the lowest power loss). As such, the system performance controller 2508 may select the values for the first load current ($I_{L1}$) and the second load current ($I_{L2}$) that maximize the composite efficiency 2523, which may not necessarily be providing equal currents for the power converters 2502. Then, the system performance controller 2508 generates control signals (e.g., $CTR_1$, $CTR_2$) to operate the power converters 2502 at the determined values. However, besides the OS approach (which selects the load current combination that provides the highest composite efficiency 2523), the system performance controller 2508 may use other algorithms or approaches such as a most efficient converter (MEC) approach, a combination of the MEC approach and an equal sharing (ES) approach, and/or an integral efficiency approach to determine the values for the first load current ($I_{L1}$) and the second load current ($I_{L2}$) in order to increase or optimize the composite efficiency 2523, which is further explained later in the disclosure.

The system performance controller 2508 may detect a change to the value of the system load current ($I_{SL}$) in the operating environment, and determine, using the power loss information 2540, new values for the first load current ($I_{L1}$) and the second load current ($I_{L2}$) such that the composite efficiency 2523 achieves the threshold condition at the changed value of the system load current ($I_{SL}$). For example, if the system load current JO changes from 50 A to 160 A, the system performance controller 2508, determines, using the power loss information 2540, values for the first load current ($I_{L1}$) and the second load current ($I_{L2}$) where the composite efficiency 2523 is optimized. For example, the power loss information 2540 may indicate that, for 160 A of system load current, 90 A for the first load current ($I_{L1}$) and 70 A for the second load current ($I_{L2}$) may provide the highest composite efficiency 2523. According to the OS approach, the system performance controller 2508 may select those values and generate control signals ($CTR_1$, $CTR_2$) to operate the first power converter 2502-1 and the second power converter 2502-2.

In some examples, the system performance controller 2508 is configured to continuously (e.g., periodically) monitor the composite efficiency 2523 during the system's lifetime and update one or more control parameters 2505 such that the composite efficiency 2523 continues to achieve the threshold condition. In some examples, the system performance controller 2508 is configured to execute the control manipulation module 2530 to update one or more control parameters 105 in response to a triggering event. In some examples, the triggering event includes activation of the power converters 2502. In some examples, the triggering event includes detection of an expiration of a timer. In some examples, the triggering event includes detection of a change to one or more environment conditions. In some examples, the triggering event includes the detection of the composite efficiency 2523 not achieving the threshold condition. In addition to continuously (e.g., periodically) monitoring the composite efficiency 2523, the system performance controller 2508 may also be configured to continuously (e.g., periodically) recharacterize (e.g., re-compute) the efficiency over load current range for each of the power converters 2502 independently such that the composite efficiency 2523 can be calculated and the control can be set accurately.

In some examples, using the power loss information 2540, the system performance controller 2508 is configured to determine the values for the individual load currents (e.g., $I_{L1}$, $I_{L2}$) based on the most efficient converter (MEC) approach in order to optimize the composite efficiency 2523. In the MEC approach, the system performance controller 2508 selects the most efficient converter (e.g., least power loss) to deliver all power for each required load, and then delivers any remaining power (if needed) using the next most efficient converter (e.g., the next lowest power loss converter).

Table 2 illustrates another portion of the power loss information 2540 for two power converters 2502 at a total system current of 110 A.

| Total System Current (A) | First Load Current (A) | Second Load Current (A) | Loss (Unit1) (W) | Loss (Unit2) (W) | Total Loss (Composite Efficiency 2523) (W) |
| --- | --- | --- | --- | --- | --- |
| 110 | 100 | 10 | 132 | 84 | 216 |
|  | 90 | 20 | 86.4 | 108 | 194.4 |
|  | 80 | 30 | 57.6 | 104.4 | 162 |
|  | 70 | 40 | 58.8 | 91.2 | 150 |
|  | 60 | 50 | 72 | 66 | 138 |
|  | 50 | 60 | 84 | 50.4 | 134.4 |

-continued

| Total System Current (A) | First Load Current (A) | Second Load Current (A) | Loss (Unit1) (W) | Loss (Unit2) (W) | Total Loss (Composite Efficiency 2523) (W) |
|---|---|---|---|---|---|
| | 40 | 70 | 96 | 50.4 | 146.4 |
| | 30 | 80 | 104.4 | 86.4 | 190.8 |
| | 20 | 90 | 96 | 140.4 | 236.4 |
| | 10 | 100 | 69.6 | 216 | 285.6 |

The first power converter 2502-1 may deliver a maximum of 100 A, and the second power converter 2502-2 may deliver a maximum of 100 A, which provides a system current maximum current of 200 A. Similar to Table 1, Table 2 illustrates only a portion of the power loss information 2540. For example, if the total system maximum current is 200 A (like in this example), the power loss information 2540 would specify the load current combinations and composite efficiencies 2523 over the entire range of 0-200 A instead of only the combinations of load currents at 110 A as shown in Table 2 (e.g., Table 2 would start at 10 A and go up to 200 A). Also, it is noted that providing the composite efficiencies 2523 for increments of 10 A is used for explanatory purposes only.

When the system performance controller 2508 detects the system load current ($I_{SL}$) at 110 A, the system performance controller 2508 determines, using the power loss information 2540 (e.g., Table 2 above), values for the first load current ($I_{L1}$) and the second load current ($I_{L2}$) such that the composite efficiency 2523 is optimized at 110 A. If the system performance controller 2508 implements the MEC approach, the system performance controller 2508 selects the first power converter 2502-1 to deliver 100 A and then selects the second power converter 2502-2 to deliver 10 A in order to provide a system load current ($I_{SL}$) of 110 A. For example, in the MEC approach, one power converter is selected to provide the maximum current provided by that power converter, and then any remaining power is distributed to the next most efficient converter. In this example, each of the first power converter 2502-1 and the second power converter 2502-2 has a maximum of 100 A (so one of these converters is selected to deliver 100 A).

According to Table 2, the first power converter 2502-1 (operating at 100 A) has an individual power loss of 132 W. Conversely, according to Table 2, the second power converter 2502-2 (operating at 100 A) has an individual power loss of 216 W. As such, according to the MEC approach, the system performance controller 2508 may select the first power converter 2502-1 to deliver 100 A (e.g., since the first power converter 2502-1 is the more efficient one), and then select the second power converter 2502-2 to deliver the remaining amount, e.g., 10 A. As such, the system performance controller 2508 may determine the value of the first load current ($I_{L1}$) as 100 A and the value of the second load current ($I_{L2}$) as 10 A. However, if the system performance controller 2508 uses the optimal sharing (OS) approach (as explained above), the system performance controller 2508 may select 50 A for the first power converter 2502-1 and 60 A for the second power converter 2502-2 since the combination of 50/60 provides the lowest total power loss of 134.4 W (whereas the combination of 100/10 provides a total power loss of 216 W).

In some examples, if the system performance controller 2508 uses the MEC approach or the OS approach, and when a power converter 2502 is not used to provide power to the load 2509, the system performance controller 2508 may instruct the power converter 2502 that is not used to deliver power to be placed in a standby mode, e.g., to be connected to the power source 2541 and to consume minimal, yet sufficient power to be ready to respond to commands to deliver power. With respect to the example of Table 1, if the detected system load current ($I_{SL}$) is 20 A, according to either the OS approach or the MEC approach, the system performance controller 2508 may determine the value of the first load current ($I_{L1}$) as 20 A and the value of the second load current ($I_{L2}$) as 0 A. In this example, the system performance controller 2508 may transmit a control signal to the second power converter 2502-2 to be placed in a standby mode such that the second power converter 2502-2 is connected to the power source 2541 and consumes minimal, yet sufficient power to be ready to response to commands to deliver additional power. Then, if the system performance controller 2508 detects that the system load current ($I_{SL}$) has changed to 110 A, according to the OS approach, the system performance controller 2508 may generate control signals (e.g., $CTR_1$, $CTR_2$) to operate the first power converter 2502-1 at 50 A and the second power converter 2502-2 at 60 A. If the MEC approach is used, the system performance controller 2508 may generate control signals (e.g., $CTR_1$, $CTR_2$) to operate the first power converter 2502-1 at 100 A and the second power converter 2502-2 at 10 A. Regardless of whether the OS approach or the MEC approach is used, the second power converter 2502-2 is first in the standby mode and may respond relatively quickly to provide the requested power.

In some examples, the system performance controller 2508 may use a combination of the MEC approach and an equal sharing (ES) approach to select values for the individual power converters 2502 to optimize the composite efficiency 2523. The MEC/ES combination may indicate to use the MEC approach until a first power converter reaches its maximum power, and then to deliver power with equal sharing between most efficient power converters. For example, if the detected system load current ($I_{SL}$) is 20 A, the system performance controller 2508 may use the MEC approach to select the values for the individual currents (e.g., since the detected current is less than the maximum of either the first power converter 2502-1 or the second power converter 2502-2), which, according to Table, 1 would be 20 A for the first power converter 2502-1 and 0 A for the second power converter 2502-2. Then, if the detected current is 110 A, the system performance controller 2508 may transition to the ES approach since 110 A is greater than the maximum of the first power converter 2502-1 or the second power converter 2502-2. According to the ES approach, the system performance controller 2508 may control each of the first power converter 2502-1 and the second power converter 2502-2 to operate at 55 A (e.g., equal sharing means providing the same current for each power converter 2502). In some examples, the MEC approach may be preferable at lighter loads (e.g., one power converter delivering power) and ES approach may be preferable at heavier loads (e.g., two or more, or all power converters delivering power).

In some examples, the system performance controller 2508 using the MEC/ES combination may make a controlled transition between lighter and heavier loads. Upon sensing a demand for greater output power delivery to the load 2509, the system performance controller 2508 may first control the second power converter 2502-2 to deliver all necessary additional power to the load 2509. After allowing for or sensing stabilization of the load demand and power delivery, the system performance controller 2508 may control the first power converter 2502-1 and second power converter 2502-2 to the aforementioned ES approach.

In some examples, the system performance controller 2508 uses an integral efficiency approach for determining the values of the individual currents (e.g., $I_{L1}$, $I_{L2}$) for the power converters 2502. In some examples, the integral efficiency approach is similar to the MEC approach but does not request switching individual power converters 2502 into and out of standby mode. For example, the system performance controller 2508 may calculate the integral of the efficiency over the full load range (e.g., integral efficiency) for each separate power converter 2502 and to progressively enable the power converters 2502 as load demand increases, starting with the most efficient converter and finishing with the least efficient converter. For example, the system performance controller 2508 may calculate the integral of the composite efficiency curve over a load range for the first power converter 2502-1 (e.g., first integral efficiency), and the system performance controller 2508 may calculate the integral of the composite efficiency curve over a load range for the second power converter 2502-2 (e.g., second integral efficiency). If the first integral efficiency provides lower power loss (e.g., more efficient) than provided by the second integral efficiency, the system performance controller 2508 selects the first power converter 2502-1 to deliver the power to the load 2509 (up to its maximum) and then uses the second power converter 2502-2 to delivery any remaining amount (if needed). Use of the least integrally efficient power stage would be enabled only when use would not cause standby transitions with the next least integrally efficient stage over the last two full range load steps.

Note that all of the aforementioned control approaches anticipate the need for timely responses to dynamically changing load conditions. Thus, independent of the control approach used, the system performance controller 2508 continuously monitors the load demand and controls one or more of the parallel power stages (e.g., the power converters 2502) to respond quickly (e.g., immediately) to the change in load 2509. After sensing stabilization of the load demand based on one or more load ranges within the total power delivery range or based on other factors such as voltage regulation within bounds at the load 2509, the system performance controller 2508 may command the power converters 2502 according to the control approaches described. In some examples, the one or more load ranges may be based on load currents at which composite efficiencies 2523 (or power losses) are at minima (or maxima) for the control approach used, or they may be based on other factors such as minimizing the number of transitions of individual power stages into and out of standby mode.

Figure 26:
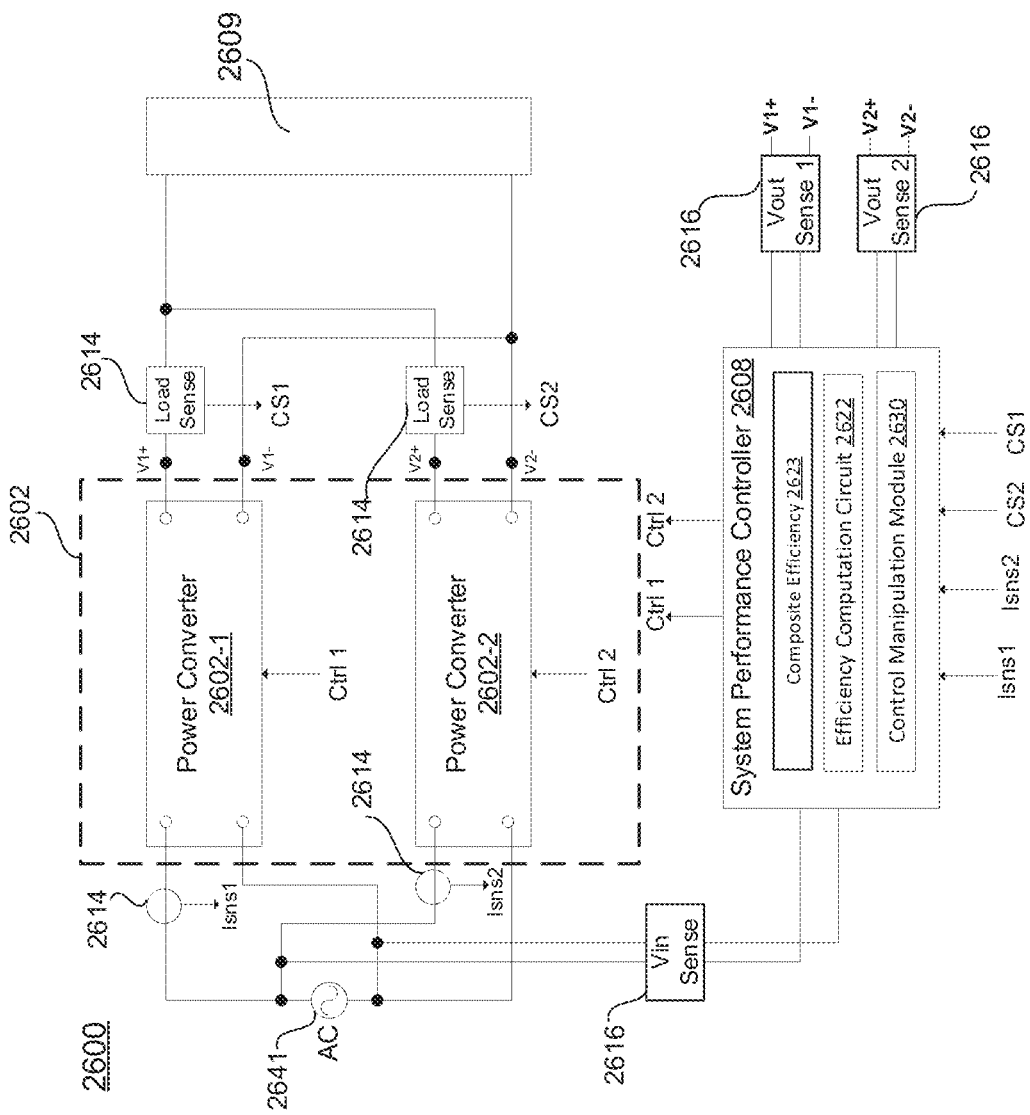
FIG. 26 illustrates a power supply system for controlling load distribution across first and second power converters to optimize overall efficiency according to an aspect.

FIG. 26 illustrates a power supply system 2600 for controlling power distribution across a plurality of power converters 2602 to increase or optimize composite efficiency 2623 according to an aspect. The power supply system 2600 may be an example of the power supply system 2500 of FIG. 25 and may include any of the details discussed with reference to FIG. 25. Generally, the power supply system 2600 may include any of the details discussed with reference to the previous figures. In some examples, the power supply system 2600 is an example of the power supply system 100 of FIG. 1A, the power supply system 500 of FIG. 5, the power supply system 600 of FIG. 6, the power supply system 1100 of FIG. 11 (including the power supply controller 1104 of FIG. 12) and/or the power supply system 2000 of FIGS. 20A-20B and may include any of the detailed discussed herein with respect to those figures and/or any of the flowcharts related to those figures.

The power converters 2602 are connected to a load 2609. The power converters 2602 are connected to the load 2609 in a manner such that the output currents of the power converters 2502 combine to provide a system load current to the load 2609. In some examples, the power converters 2602 are connected in parallel with respect to each other. In some examples, one or more power converters 2602 are not connected in parallel with one or more other power converters 2602 but are configured in a manner such that their output combine to form the system load current. The power supply system 2600 includes a power source 2641 coupled to the power converters 2602. In some examples, the power source 2641 is an AC power source. In some examples, the power source 2641 is a DC power source. In some examples, the power supply system 2600 includes multiple power sources 2641 (e.g., independent power sources). For example, two or more power converters 2602 may draw power from independent power sources, but their outputs combine to provide the system load current. The power converters 2602, collectively, are configured to deliver the system load current to the load 2609. The system load current is a combination of individual load currents provided by the power converters 2602. In some examples, the power converters 2602 are AC to DC power converters. In some examples, the power converters 2602 are DC to DC power converters.

The power converters 2602 include a first power converter 2602-1 and a second power converter 2602-2. Although FIG. 26 illustrates two power converters 2602, the power supply system 2600 may include any number of power converters such as three power converters, four power converters, or more than four power converters. In some examples, an individual power converter 2602 may be referred to as a power stage (e.g., the power stage 102 of FIG. 1A).

The power supply system 2600 includes current sensors 2614 configured to sense the input and output currents (e.g., Isns1, Isns2, CS1, CS2) of the power converters 2602 and voltage sensors 2616 configured to sense input and output voltages (e.g., Vin, Vout1, Vout2) of the power converters 2602. In some examples, the first power converter 2602-1 and/or the second power converter 2602-2 may include a metering circuit (e.g., the metering circuit 106 of FIG. 1A) that senses the input and output conditions (e.g., the input current, input voltage, output voltage, output current). In some examples, the metering circuit of the first power converter 2602-1 and/or the second power converter 2602-2 includes the details of the metering circuit 1106 of FIG. 11 (e.g., the multiplexers, ADCs, sensors, etc.). In some examples, the first power converter 2602-1 and/or the second power converter 2602-2 may include a power supply controller (e.g., the power supply controller 104 of FIG. 1A). In some examples, the first power converter 2602-1 and/or the second power converter 2602-1 include the details of the power supply controller 1104 of FIG. 12 (e.g., PWM logic circuit, differential sensor, digital compensator, multi-slope ramp generator, polarity logic, gate drive logic, etc.).

The power supply system 2600 includes a system performance controller 2608 communicately coupled to the power converters 2602, the current sensors 2614, and the voltage sensors 2616. The system performance controller 2608 may include a control manipulation module 2630 configured to adjust the values of the individual load currents and an efficiency computation circuit 2622 configured to compute a composite efficiency 2623 based on the measured input and output conditions of the power converters 2602. The system performance controller 2608 may use the control manipulation module 2630 and the efficiency computation circuit 2622 to generate power loss information 2640, which is used by the system performance controller 2608 to select the values for the individual load currents that provide the maximum or highest composite efficiency 2623 in the same manner as discussed with reference to FIG. 25.

The system performance controller 2608 is configured to, in response to the power converters 2602 being activated (e.g., turned-on) in an operating environment, detect a value of the system load current, and determine, using the power loss information 2640, values for the individual load currents such that the composite efficiency 2623 at the detected value achieves a threshold condition (e.g., a maximum or highest composite efficiency 2623, a composite efficiency 2623 exceeding a threshold level, or a composite efficiency 2623 that is relatively high, or an integral efficiency that is maximized or is above a threshold amount). In some examples, the system performance controller 2608 is configured to execute an OS approach which selects a load current combination that provides the maximum composite efficiency 2623. In some examples, the system performance controller 2608 is configured to execute an MEC approach that selects the most efficiency converter to deliver power (up it its maximum) and then delivers the remaining (if any) using the next most efficient converter. In some examples, the system performance controller 2608 is configured to execute a combination of the MEC approach and the ES approach in which the MEC approach is used at system load levels that are at or below one of the power converters and then switch to the ES approach when the system load current is greater than the maximum current provided by one of the power converters. In some examples, the system performance controller 2608 uses an integral efficiency approach. The OS approach, the MEC approach, the combination of the MEC/ES approach, and the IE approach may be the same as previously described with reference to FIG. 25.

The system performance controller 2608 is configured to generate control signals (Ctrl1, Ctrl2) to operate the power converters 2602 at the determined values. In some examples, the system performance controller 2608 may detect a change to the value of the system load current in the operating environment, and determine, using the power loss information 2640, new values for the first load current ($I_{L1}$) and the second load current ($I_{L2}$) such that the composite efficiency 2623 achieves the threshold condition at the changed value of the system load current. Then, the system performance controller 2608 may generate new control signals (Ctrl1, Ctrl2) to control the power converters 2602 at the new values. In some examples, the system performance controller 2608 is configured to continuously (e.g., periodically) monitor the composite efficiency 2623 during the system's lifetime and update one or more control parameters such that the composite efficiency 2623 continue to achieve the threshold condition. In addition to continuously (e.g., periodically) monitoring the composite efficiency 2623, the system performance controller 2608 may also be configured to continuously (e.g., periodically) recharacterize (e.g., re-compute) the efficiency over load current range for each of the power converters 2602 independently such that the composite efficiency 2623 can be calculated and the control can be set accurately.

Figure 27:
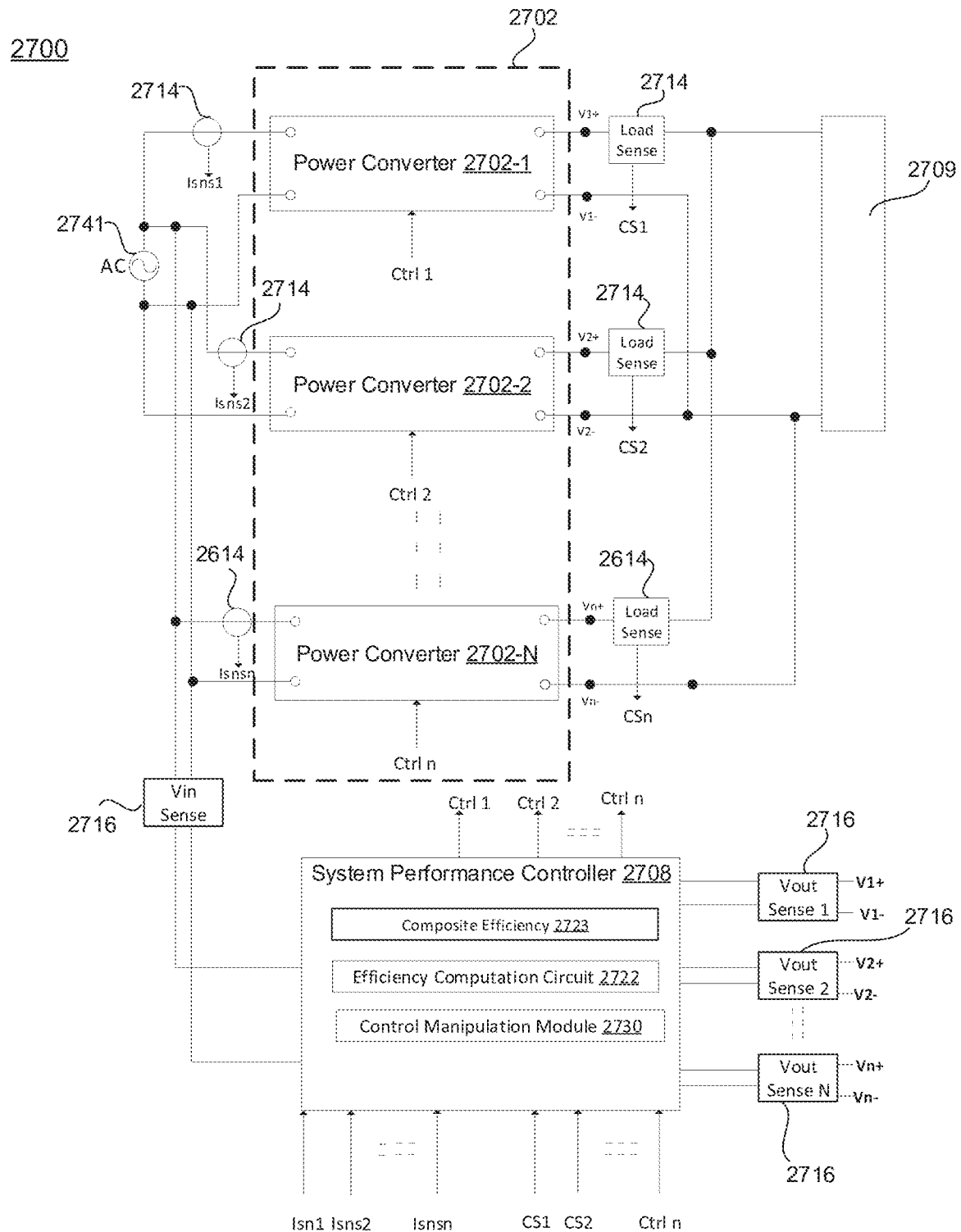
FIG. 27 illustrates a power supply system for controlling load distribution across multiple power converters to optimize overall efficiency according to an aspect.

FIG. 27 illustrates a power supply system 2700 for controlling power distribution across a plurality of power converters 2702 to increase or optimize composite efficiency 2723 according to an aspect. Generally, the power supply system 2700 may include any of the details of the previous figures. The power supply system 2700 may be an example of the power supply system 2500 of FIG. 25 and/or the power supply system 2600 of FIG. 26 and may include any of the details discussed with reference to FIGS. 25-26. The power supply system 2600 may include three or more power converters 2702. In some examples, the power supply system 2700 is an example of the power supply system 100 of FIG. 1A, the power supply system 500 of FIG. 5, the power supply system 600 of FIG. 6, the power supply system 1100 of FIG. 11 (including the power supply controller 1104 of FIG. 12) and/or the power supply system 2000 of FIGS. 20A-20B and may include any of the detailed discussed herein with respect to those figures and/or any of the flowcharts related to those figures.

The power converters 2702 are connected to a load 2709. The power converters 2702 are connected to the load 2709 in a manner such that the output currents of the power converters 2702 combine to provide a system load current to the load 2709. In some examples, the power converters 2702 are connected in parallel with respect to each other. In some examples, one or more power converters 2702 are not connected in parallel with one or more other power converters 2702 but their output combine to form the system load current. The power supply system 2700 includes a power source 2741 coupled to the power converters 2702. In some examples, the power source 2741 is an AC power source. In some examples, the power source 2741 is a DC power source. In some examples, the power supply system 2700 includes multiple power sources 2741 (e.g., independent power sources). For example, two or more power converters 2702 may draw power from independent power sources, but their outputs combine to provide the system load current. The power converters 2702, collectively, are configured to deliver the system load current to the load 2709. The system load current is a combination of individual load currents provided by the power converters 2702. In some examples, the power converters 2702 are AC to DC power converters. In some examples, the power converters 2702 are DC to DC power converters.

The power converters 2702 include a first power converter 2702-1, and a second power converter 2702-2 through N power converter 2702-N, where N may be an integer greater than or equal to three. The power supply system 2700 includes current sensors 2714 configured to sense the input and output currents (e.g., Isns1, Isns2 . . . Isnsn, CS1, CS2 . . . CSn) of the power converters 2702 and voltage sensors 2716 configured to sense input and output voltages (e.g., Vin, Vout1, Vout2 . . . VoutN) of the power converters 2702. In some examples, each power converter 2702 may include a metering circuit (e.g., the metering circuit 106 of FIG. 1A, the metering circuit 1106 of FIG. 11)) that senses the input and output conditions (e.g., the input current, input voltage, output voltage, output current). In some examples, each power converter 2702 may include a power supply controller (e.g., the power supply controller 104 of FIG. 1A, the power supply controller 1104 of FIG. 12)).

The power supply system 2700 includes a system performance controller 2708 communicately coupled to the power converters 2702, the current sensors 2714, and the voltage sensors 2716. The system performance controller 2708 may include a control manipulation module 2730 configured to adjust the values of the individual load currents and an efficiency computation circuit 2722 configured to compute a composite efficiency 2723 based on the measured input and output conditions of the power converters 2702. The system performance controller 2708 may use the control manipulation module 2730 and the efficiency computation circuit 2722 to generate power loss information 2740, which is used by the system performance controller 2708 to select the values for the individual load currents that provide the maximum or highest composite efficiency 2723 in the same manner as discussed with reference to FIG. 25.

The system performance controller 2708 is configured to, in response to the power converters 2702 being activated (e.g., turned-on) in an operating environment, detect a value of the system load current, and determine, using the power loss information 2740, values for the individual load currents such that the composite efficiency 2723 at the detected value achieves a threshold condition (e.g., a maximum or highest composite efficiency 2723, a composite efficiency 2723 exceeding a threshold level, or a relatively high composite efficiency 2723). In some examples, the system performance controller 2708 is configured to execute an OS approach which selects a load current combination that provides the maximum composite efficiency 2723. In some examples, the system performance controller 2708 is configured to execute an MEC approach that selects the most efficiency converter to deliver power (up it its maximum) and then delivers the remaining (if any) using the next most efficient converter. In some examples, the system performance controller 2708 is configured to execute a combination of the MEC approach and the ES approach in which the MEC approach is used at system load levels that are at or below one of the power converters and then switch to the ES approach when the system load current is greater than the maximum current provided by one of the power converters. In some examples, the system performance controller 2708 uses an integral efficiency approach. The OS approach, the MEC approach, the combination of the MEC/ES approach, and the IE approach may be the same as previously described with reference to FIG. 25.

The system performance controller 2708 is configured to generate control signals (Ctrl1, Ctrl2 . . . Ctrln) to operate the power converters 2702 at the determined values. In some examples, the system performance controller 2708 may detect a change to the value of the system load current in the operating environment, and determine, using the power loss information 2740, new values for each of the load currents such that the composite efficiency 2723 achieves the threshold condition at the changed value of the system load current. Then, the system performance controller 2708 may generate new control signals (Ctrl1, Ctrl2 . . . Ctrln) to control the power converters 2702 at the new values. In some examples, the system performance controller 2708 is configured to continuously (e.g., periodically) monitor the composite efficiency 2723 during the system's lifetime and update one or more control parameters such that the composite efficiency 2723 continue to achieve the threshold condition. In addition to continuously (e.g., periodically) monitoring the composite efficiency 2723, the system performance controller 2708 may also be configured to continuously (e.g., periodically) recharacterize (e.g., re-compute) the efficiency over load current range for each of the power converters 2702 independently such that the composite efficiency 2723 can be calculated and the control can be set accurately.

Figure 28:
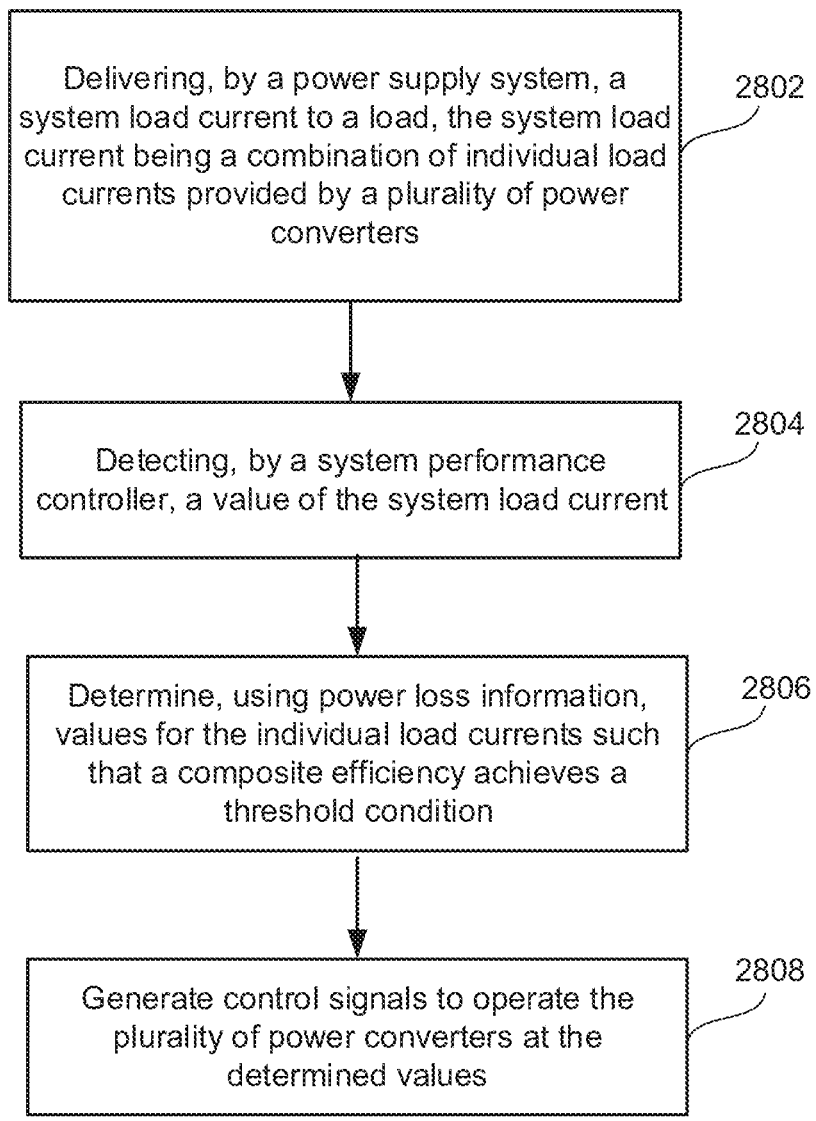
FIG. 28 illustrates a flowchart depicting example operations of the power supply system according to an aspect.

FIG. 28 illustrates a flowchart 2800 depicting example operations of the power supply system 2500 of FIG. 25 according to an aspect. Although the flowchart 2800 is described with reference to the power supply system 2500 of FIG. 25, the operations of FIG. 25 may be applicable to any of the power system described herein.

Operation 2802 includes delivering, by a power supply system 2500 having a plurality of power converters 2502, a system load current to a load 2509, where the system load current is a combination of individual load currents provided by the plurality of power converters 2502. In some examples, the power converters 2502 are connected in parallel.

Operation 2804 includes detecting, by a system performance controller 2508, a value of the system load current. Operation 2806 includes determining, using power loss information 2540, values for the individual load currents such that a composite efficiency 2523 achieves a threshold condition. In some examples, the threshold condition is a maximum composite efficiency. In some examples, the values are determined based on an OS approach. In some examples, the values are determined based on an MEC approach. In some examples, the values are determined based on a combination of the MEC approach and the ES approach. In some examples, the values are determined based on an integral efficiency approach. The power loss information 2540 includes a plurality of load current combinations over a range of system load current values, where each load current combination is associated with a corresponding composite efficiency 2523, and each load current combination provides a separate combination of values for the individual load currents. In some examples, the determining operation includes selecting a load current combination from the plurality of load current combination that provides a highest composite efficiency 2523.

Operation 2808 includes generating control signals to operate the plurality of power converters 2502 at the determined values. In some examples, the operations include detecting a change to the value of the system load current in the operating environment, and determining, using the power loss information 2540, new values for the individual load currents such that the composite efficiency 2523 achieves the threshold condition. In some examples, the operations include updating the power loss information 2540 in response to a triggering event, where the triggering event includes detection of a change in measured input or output condition(s), detection of the composite efficiency 2523 not achieving the threshold condition, detection of the activation (e.g., turn-on) of one or more power converters 2502, and/or detection of an expiration of a timer. In some examples, the updating operation includes iteratively modifying at least one of the values of the individual load currents, computing, at each iteration, the composite efficiency 2523 based on the measured input and output conditions, and storing, at each iteration, the values of the individual load currents and the corresponding composite efficiency 2523 as the power loss information 2540.

Figure 29:
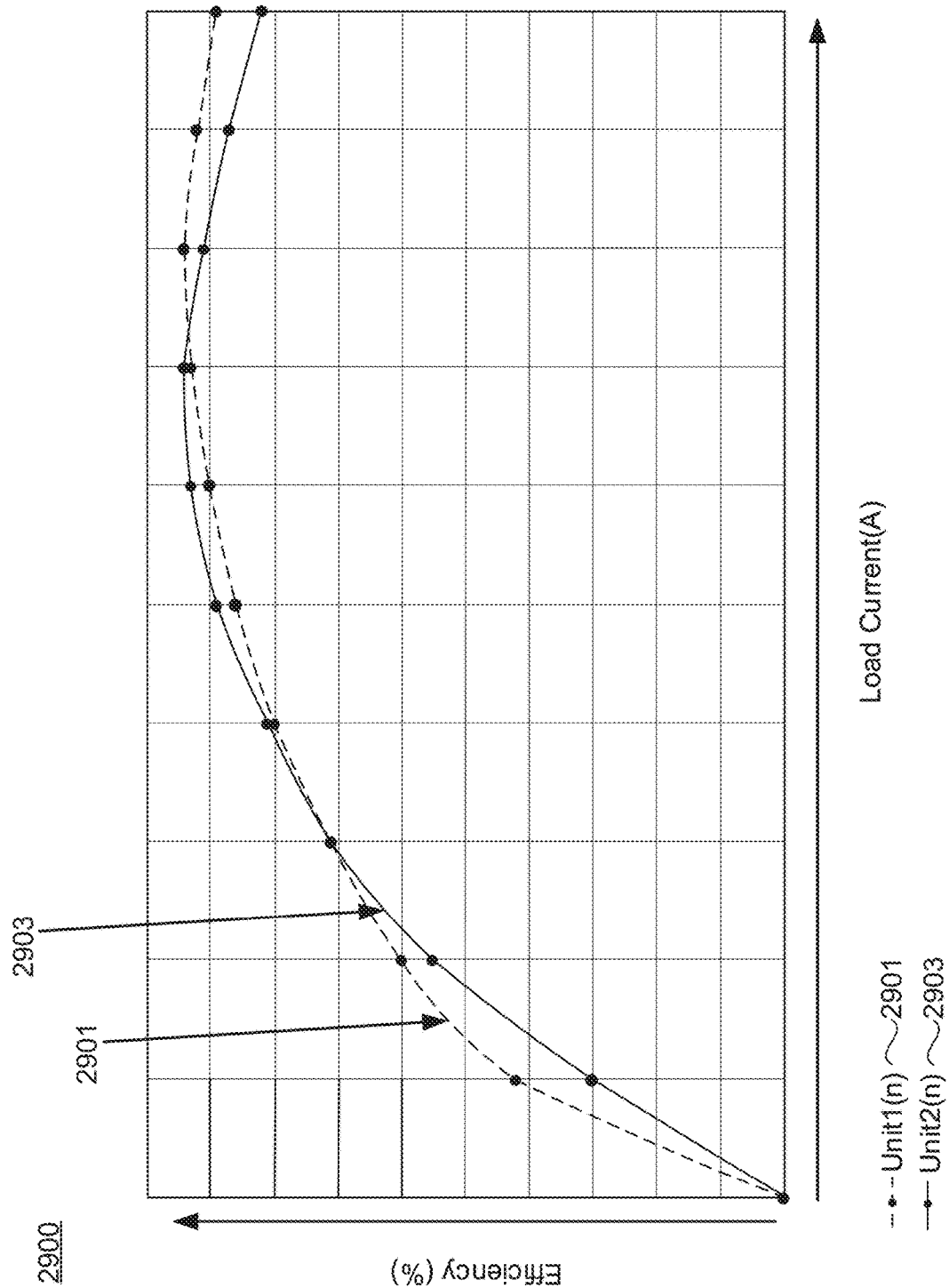
FIG. 29 illustrates a graph depicting individual converter efficiency in terms of percentage as a function of load current according to an aspect.

FIG. 29 illustrates a graph 2900 depicting individual converter efficiency in terms of percentage as a function of load current according to an aspect. Although the description of FIG. 29 is explained with reference to the power supply system 2500 of FIG. 25, the description may be applicable to any of the power supply system discussed herein. The graph 2900 depicts the individual efficiencies for two power converters, e.g., the first power converter 2502-1 and the second power converter 2502-1. The graph 2900 includes a line 2901 depicting an individual power efficiency curve (e.g., in terms of efficiency %) for the first power converter 2502-1 across a load current range (e.g., 0 to 100 A) of the first power converter 2502-1, and a line 2903 depicting an individual power efficiency curve (e.g., in terms of efficiency %) across a load current range (e.g., 0 to 100 A) for the second power converter 2502-2.

In some examples, the system performance controller 2508 may activate the first power converter 2502-1, and the control manipulation module 2530 may step through (or loop through) values of the load current over the current load range of the first power converter 2502-1, and the system performance controller 2508 may compute the individual efficiency $(V_{OUT}*I_{OUT})/(V_{IN}*I_{IN}))$ of the first power converter 2502-1 at each iteration. These results may produce the line 2901. Then, in some examples, the system performance controller 2508 may activate the second power converter 2502-2, and the control manipulation module 2530 may step through (or loop through) values of the load current over the current load range of the second power converter 2502-2, and the system performance controller 2508 may compute the individual efficiency $(V_{OUT}*I_{OUT})/(V_{IN}*I_{IN}))$ of the second power converter 2502-2 at each iteration. These results may produce the line 2903.

Figure 30:
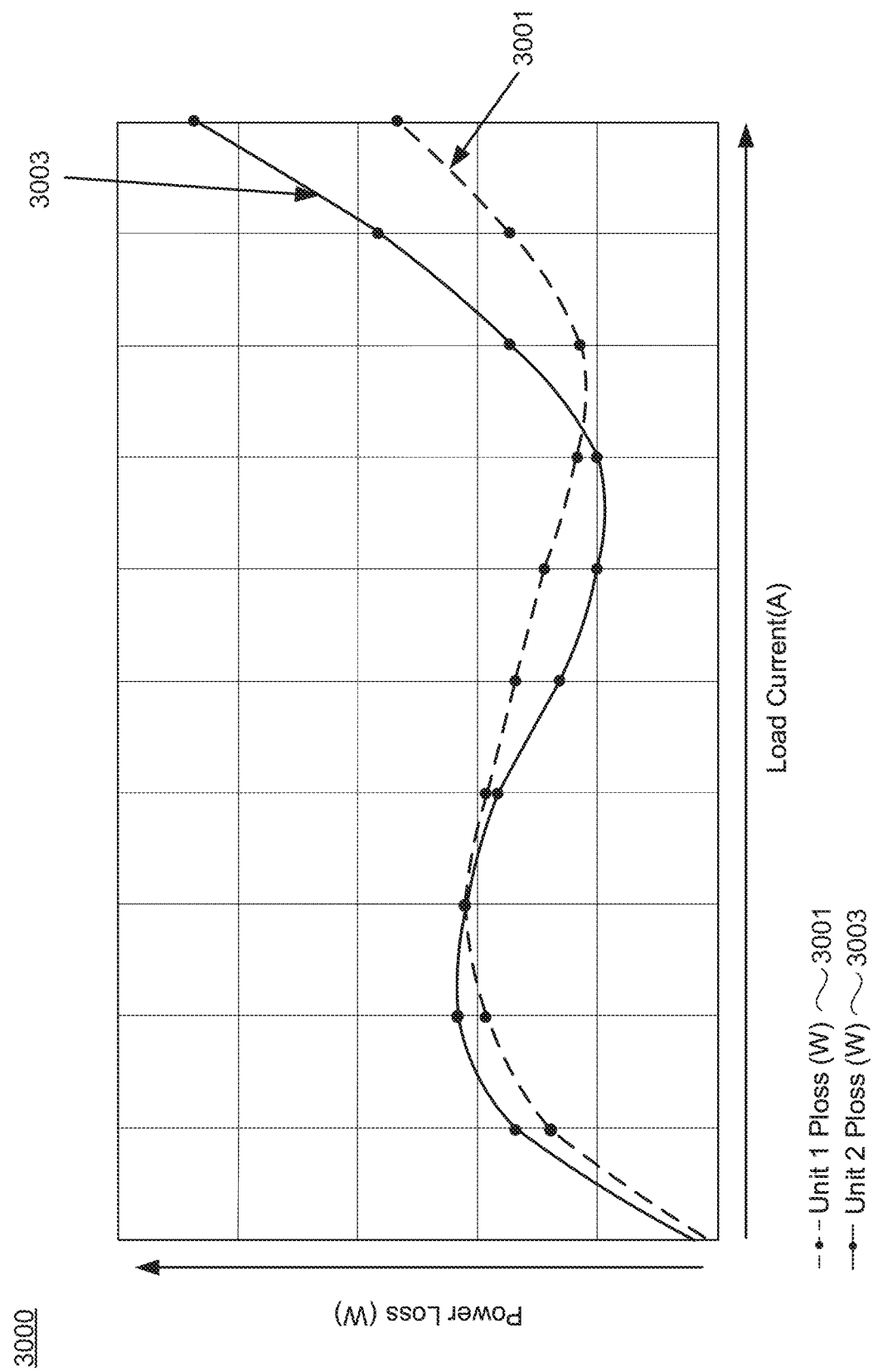
FIG. 30 illustrates a graph depicting individual converter efficiency in terms of power loss as a function of load current according to an aspect.

FIG. 30 illustrates a graph 3000 depicting individual converter efficiency in terms of power loss as a function of load current according to an aspect. Although the description of FIG. 30 is explained with reference to the power supply system 2500 of FIG. 25, the description may be applicable to any of the power supply system discussed herein. Similar to FIG. 29, the graph 3000 of FIG. 30 depicts the individual efficiencies for two power converters, e.g., the first power converter 2502-1 and the second power converter 2502-1. The graph 3000 includes a line 3001 depicting an individual power efficiency curve (e.g., in terms of power loss (W)) for the first power converter 2502-1 across a load current range (e.g., 0 to 100 A) of the first power converter 2502-1, and a line 3003 depicting an individual power efficiency curve (e.g., in terms of power loss (W)) across a load current range (e.g., 0 to 100 A) of the second power converter 2502-2.

In some examples, the system performance controller 2508 may activate the first power converter 2502-1, and the control manipulation module 2530 may step through (or loop through) values of the load current over the current load range of the first power converter 2502-1, and the system performance controller 2508 may compute the individual power loss (e.g., $(V_{IN}*I_{IN})-(V_{OUT}*I_{OUT}))$ of the first power converter 2502-1 at each iteration. These results may produce the line 3001. Then, in some examples, the system performance controller 2508 may activate the second power converter 2502-2, and the control manipulation module 2530 may step through (or loop through) values of the load current over the current load range of the second power converter 2502-2, and the system performance controller 2508 may compute the individual power loss (e.g., $(V_{IN}*I_{IN})-(V_{OUT}*I_{OUT}))$ of the second power converter 2502-2 at each iteration. These results may produce the line 3003.

Figure 31:
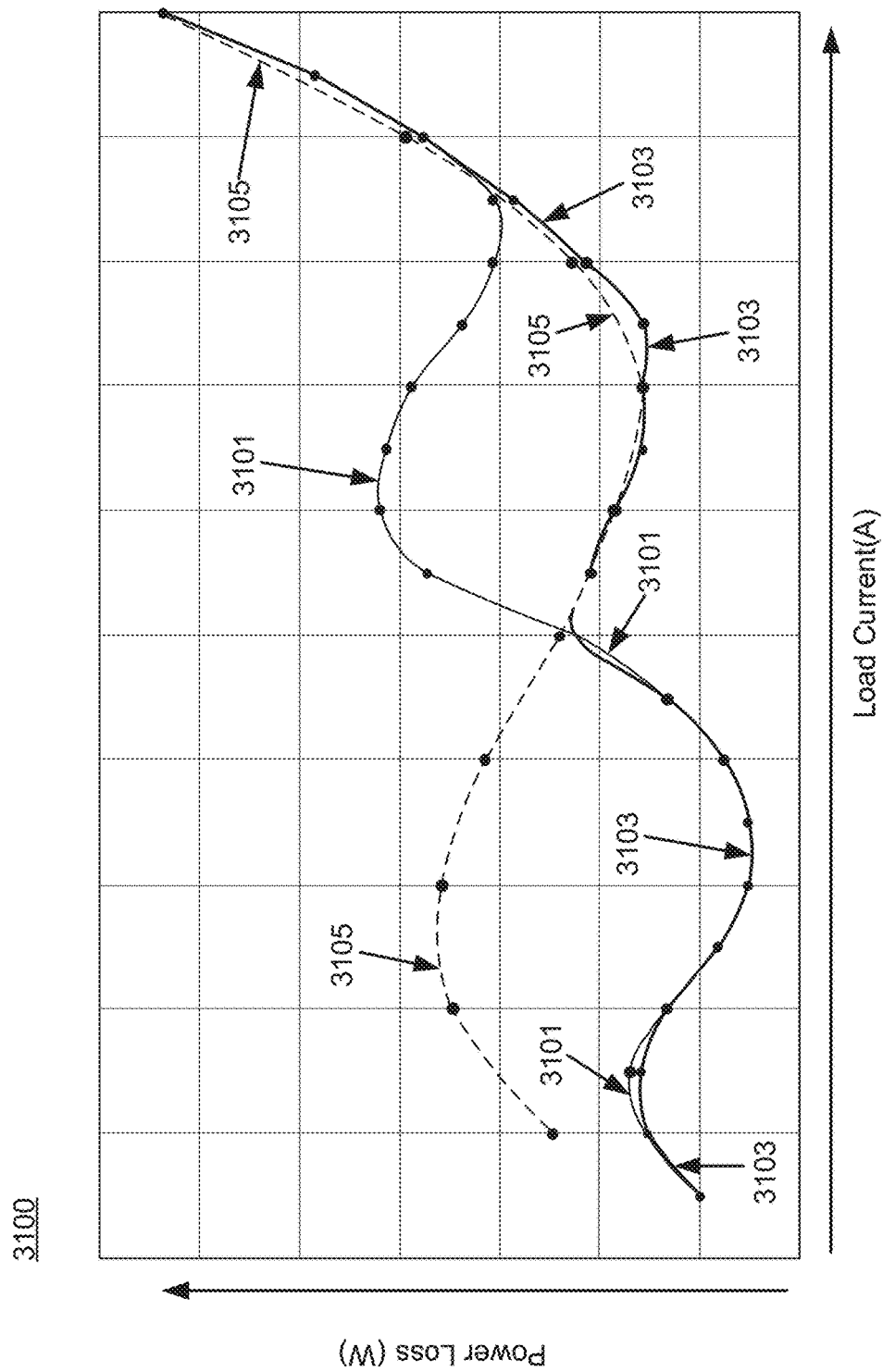
FIG. 31 illustrates a graph depicting composite power loss as a function of load current according to an aspect.

FIG. 31 illustrates a graph 3100 depicting composite power loss as a function of load current according to an aspect. Although the description of FIG. 31 is explained with reference to the power supply system 2500 of FIG. 25, the description may be applicable to any of the power supply system discussed herein. The graph 3100 includes composite power efficiency curves for the MEC approach, the OS approach, and the ES approach. As indicated above, the MEC approach selects the most efficient converter (e.g., least loss) to deliver all power specifically for each required load and deliver remaining power (if needed) using next most efficient (e.g., next lowest loss) converter. The OS approach selects (or applies AI to select) the combination of power sharing that results in the optimal composite efficiency (e.g., lowest loss). The ES approach chooses equal sharing of power among all power converters.

The graph 3100 includes a line 3101 depicting a composite efficiency curve as a function of the load current for the MEC approach. The line 3101 depicts the composite efficiency curve in terms of power loss (W) (e.g., a combination of the power loss from the first power converter 2502-1 and the second power converter 2502-2) across increasing values of the load current when the system performance controller 2508 executes the MEC approach.

The graph 3100 includes a line 3103 depicting a composite efficiency curve as a function of the load current for the OS approach. The line 3103 depicts the composite efficiency curve in terms of power loss (W) across increasing values of the load current when the system performance controller 2508 executes the OS approach. The graph 3100 includes a line 3105 depicting a composite efficiency curve as a function of the load current for the ES approach. The line 3105 depicts the composite efficiency curve in terms of power loss (W) across increasing values of the load current when the system performance controller 2508 executes the ES approach.

In some example, as shown in FIG. 31, the MEC approach may be desirable at lighter loads (e.g., one power converter delivering power) and the ES approach may be desirable at heavier loads (e.g., all power converters delivering power). In some examples, the OS approach is desirable since the OS approach may result in the most optimal composite efficiency for lighter loads and heavier loads. Also, the graph 3100 of FIG. 31 may demonstrate that a composite MEC/ES approach is desirable, where the power supply system may deliver all power starting with the most efficient converter, specifically for each required load, until the first one reaches its maximum power, then delivers power with equal sharing between most efficient converters, specifically for each required load (e.g., line 3101 at lighter loads, followed by line 3105 at higher loads).

Figure 32:
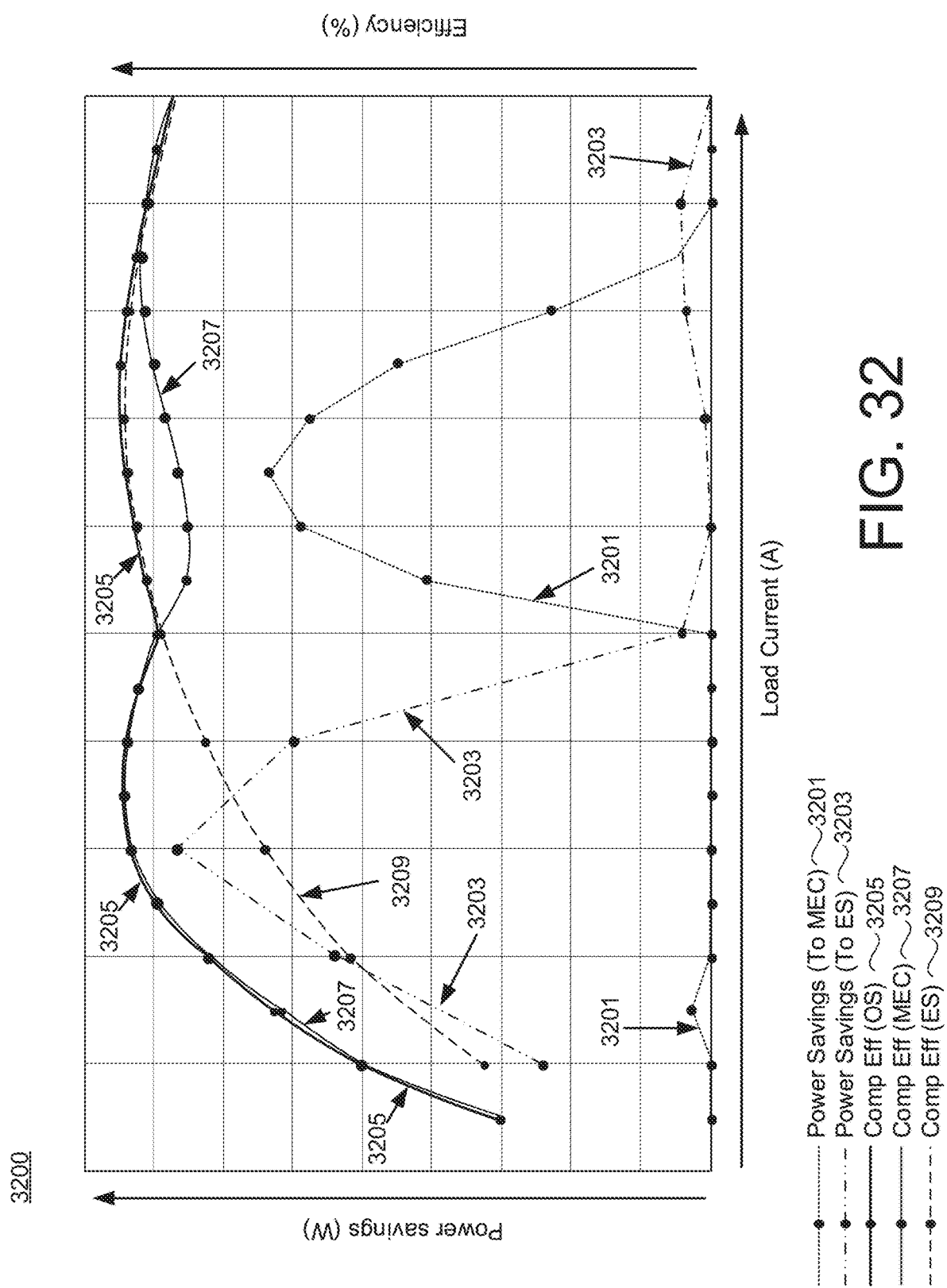
FIG. 32 illustrates a graph depicting composite power savings and efficiency as a function of load current according to an aspect.

FIG. 32 illustrates a graph 3200 depicting composite power savings and efficiency as a function of load current according to an aspect. The graph 3200 includes a line 3201 representing the power savings (in terms of Watts) to the MEC approach across increasing values of the load current. For example, the line 3201 may represent the amount of power savings when the OS approach is used as compared to when the MEC approach is used. As shown by line 3201, the power savings are relatively high at higher loads but relatively low at lower loads. The graph 3200 includes a line 3203 representing the power saving to the ES approach across increasing values of the load current. For example, the line 3203 may represent the amount of power savings when the OS approach is used as compared to when the ES approach is used. As shown by line 3203, the power savings are relatively high at lower loads but relatively low at higher loads. The graph 3200 includes a line 3205 depicting the composite efficiency (in terms of percentage) across increasing values of the load current for the OS approach, a line 3207 depicting the composite efficiency (in terms of percentage) across increasing values of the load current for the MEC approach, and a line 3209 depicting the composite efficiency (in terms of percentage across increasing values of the load current for the ES approach.

Figure 33:
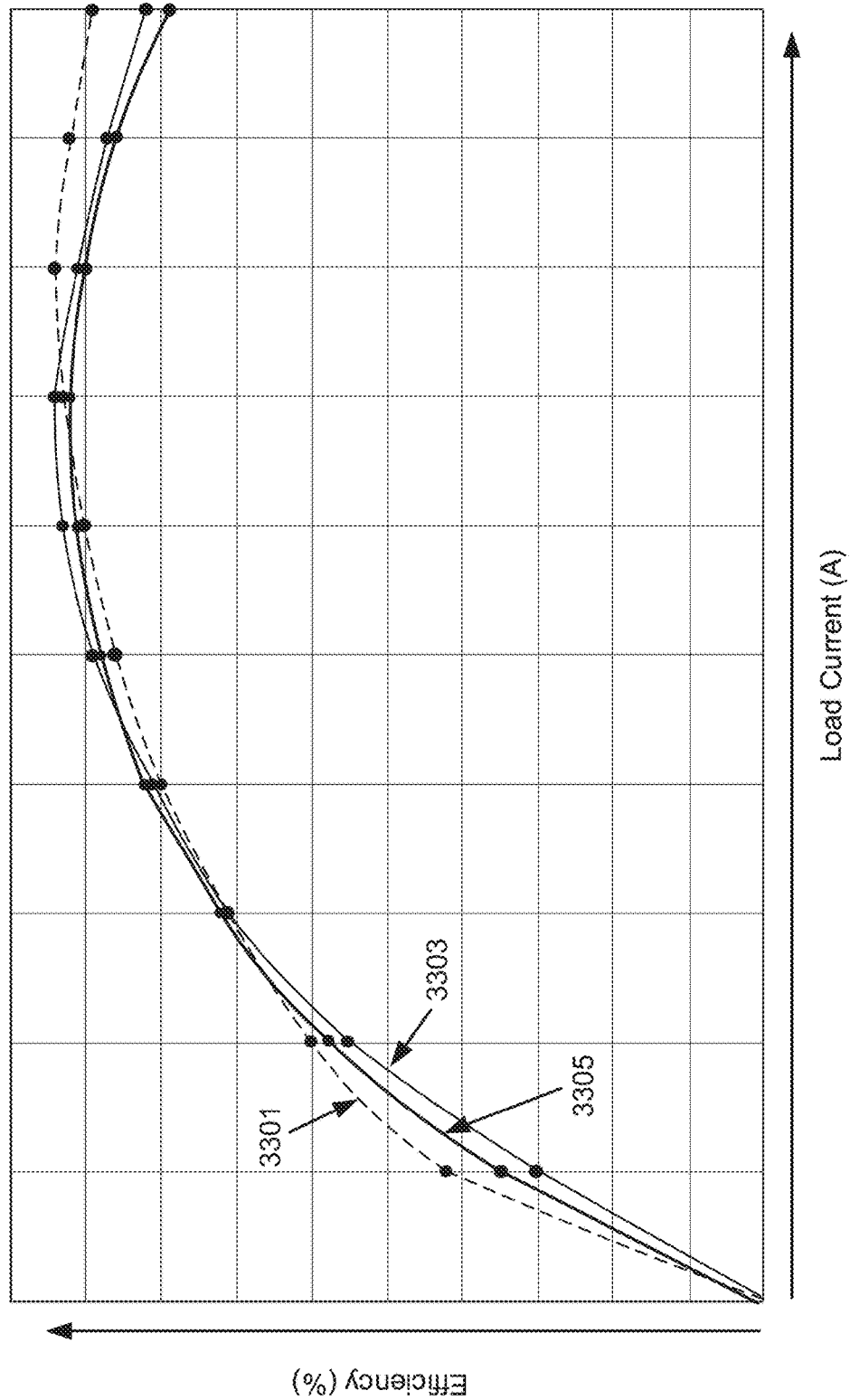
FIG. 33 illustrates a graph depicting individual converter efficiency in terms of percentage as a function of load current according to an aspect.

FIG. 33 illustrates a graph 3300 depicting individual converter efficiency in terms of percentage as a function of load current according to an aspect. For example, the graph 3300 depicts individual converter efficiencies for more than two power converters, e.g., a first power converter, a second power converter, and a third power converter. Although some parts of the description of FIG. 33 is explained with reference to the power supply system 2500 of FIG. 25, the description of FIG. 33 may be applicable to any of the power supply system discussed herein. The graph 3300 includes a line 3301 depicting an individual power efficiency curve (e.g., in terms of efficiency %) for the first power converter across a load current range (e.g., 0 to 100 A), a line 3303 depicting an individual power efficiency curve (e.g., in terms of efficiency %) for the second power converter across a load current range (e.g., 0 to 100 A), and a line 3305 depicting an individual power efficiency curve (e.g., in terms of efficiency %) for the third power converter across a load current range (e.g., 0 to 100 A).

Similar to the graph 2900 of FIG. 29, in some examples, the system performance controller 2508 may activate the first power converter, and the control manipulation module 2530 may step through (or loop through) values of the load current over the current load range of the first power converter, and the system performance controller 2508 may compute the individual efficiency $(V_{OUT}*I_{OUT})/(V_{IN}*I_{IN})$ of the first power converter at each iteration. These results may produce the line 3301. Then, in some examples, the system performance controller 2508 may activate the second power converter, and the control manipulation module 2530 may step through (or loop through) values of the load current over the current load range of the second power converter, and the system performance controller 2508 may compute the individual efficiency $(V_{OUT}*I_{OUT})/(V_{IN}*I_{IN})$ of the second power converter at each iteration. These results may produce the line 3303. Then, in some examples, the system performance controller 2508 may activate the third power converter, and the control manipulation module 2530 may step through (or loop through) values of the load current over the current load range of the third power converter, and the system performance controller 2508 may compute the individual efficiency $(V_{OUT}*I_{OUT})/(V_{IN}*I_{IN})$ of the third power converter at each iteration. These results may produce the line 3305.

Figure 34:
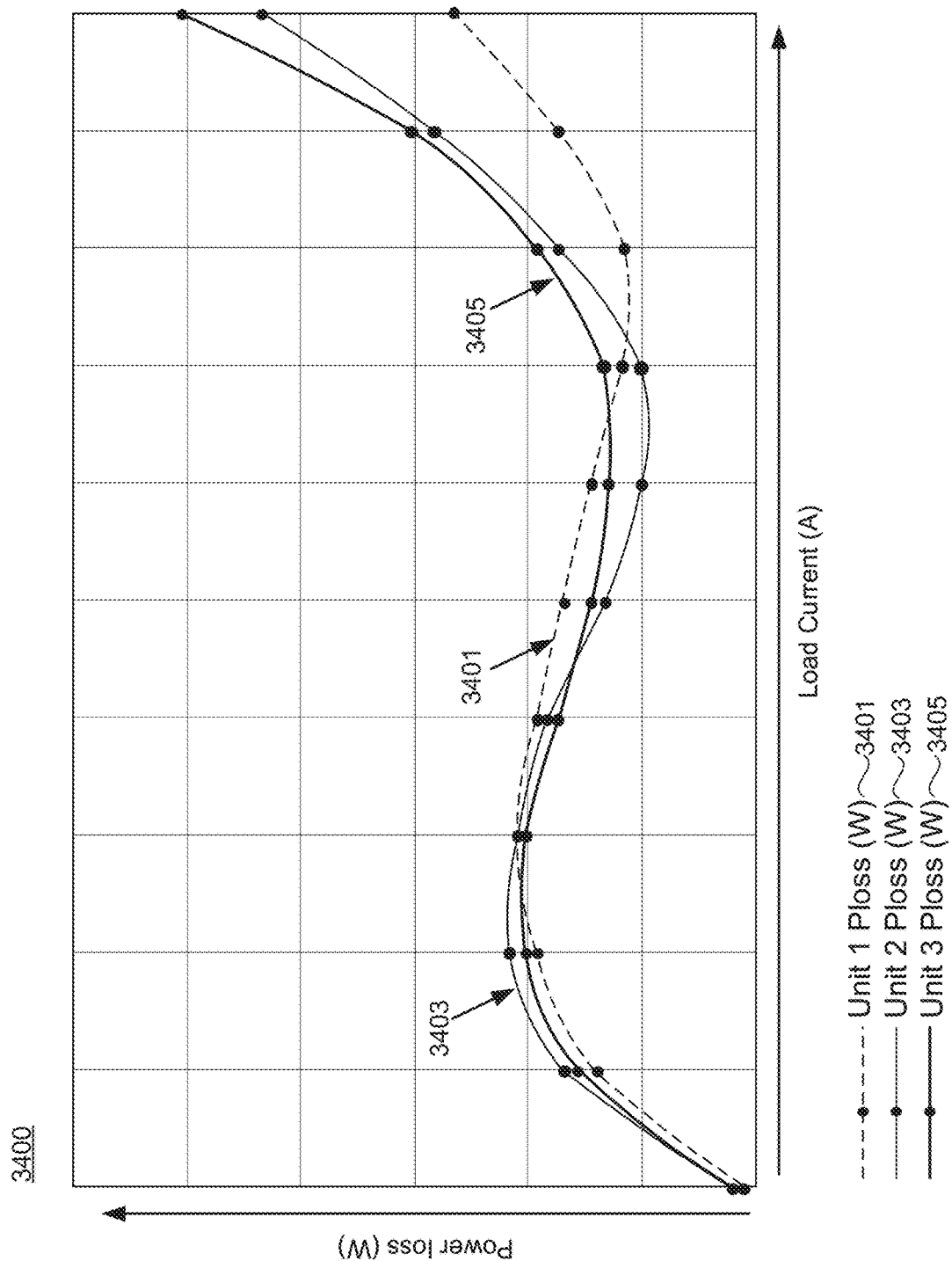
FIG. 34 illustrates a graph depicting individual converter efficiency in terms of power loss as a function of load current according to an aspect.

FIG. 34 illustrates a graph 3400 depicting individual converter efficiency in terms of power loss as a function of load current according to an aspect. For example, the graph 3400 depicts individual converter efficiencies for more than two power converters, e.g., a first power converter, a second power converter, and a third power converter. Although some parts of the description of FIG. 34 is explained with reference to the power supply system 2500 of FIG. 25, the description of FIG. 34 may be applicable to any of the power supply system discussed herein. The graph 3400 includes a line 3401 depicting an individual power efficiency curve (e.g., in terms of power loss (W)) for the first power converter across a load current range (e.g., 0 to 100 A), a line 3403 depicting an individual power efficiency curve (e.g., in terms of power loss (W)) for the second power converter across a load current range (e.g., 0 to 100 A), and a line 3405 depicting an individual power efficiency curve (e.g., in terms of power loss (W)) for the third power converter across a load current range (e.g., 0 to 100 A).

In some examples, the system performance controller 2508 may activate the first power converter, and the control manipulation module 2530 may step through (or loop through) values of the load current over the current load range of the first power converter, and the system performance controller 2508 may compute the individual power loss (e.g., $(V_{IN}*I_{IN})-(V_{OUT}*I_{OUT})$) of the first power converter at each iteration. These results may produce the line 3401. Then, in some examples, the system performance controller 2508 may activate the second power converter, and the control manipulation module 2530 may step through (or loop through) values of the load current over the current load range of the second power converter, and the system performance controller 2508 may compute the individual power loss (e.g., $(V_{IN}*I_{IN})-(V_{OUT}*I_{OUT})$) of the second power converter at each iteration. These results may produce the line 3403. Then, in some examples, the system performance controller 2508 may activate the third power converter, and the control manipulation module 2530 may step through (or loop through) values of the load current over the current load range of the third power converter, and the system performance controller 2508 may compute the individual power loss (e.g., $(V_{IN}*I_{IN})-(V_{OUT}*I_{OUT})$) of the third power converter at each iteration. These results may produce the line 3405.

Figure 35:
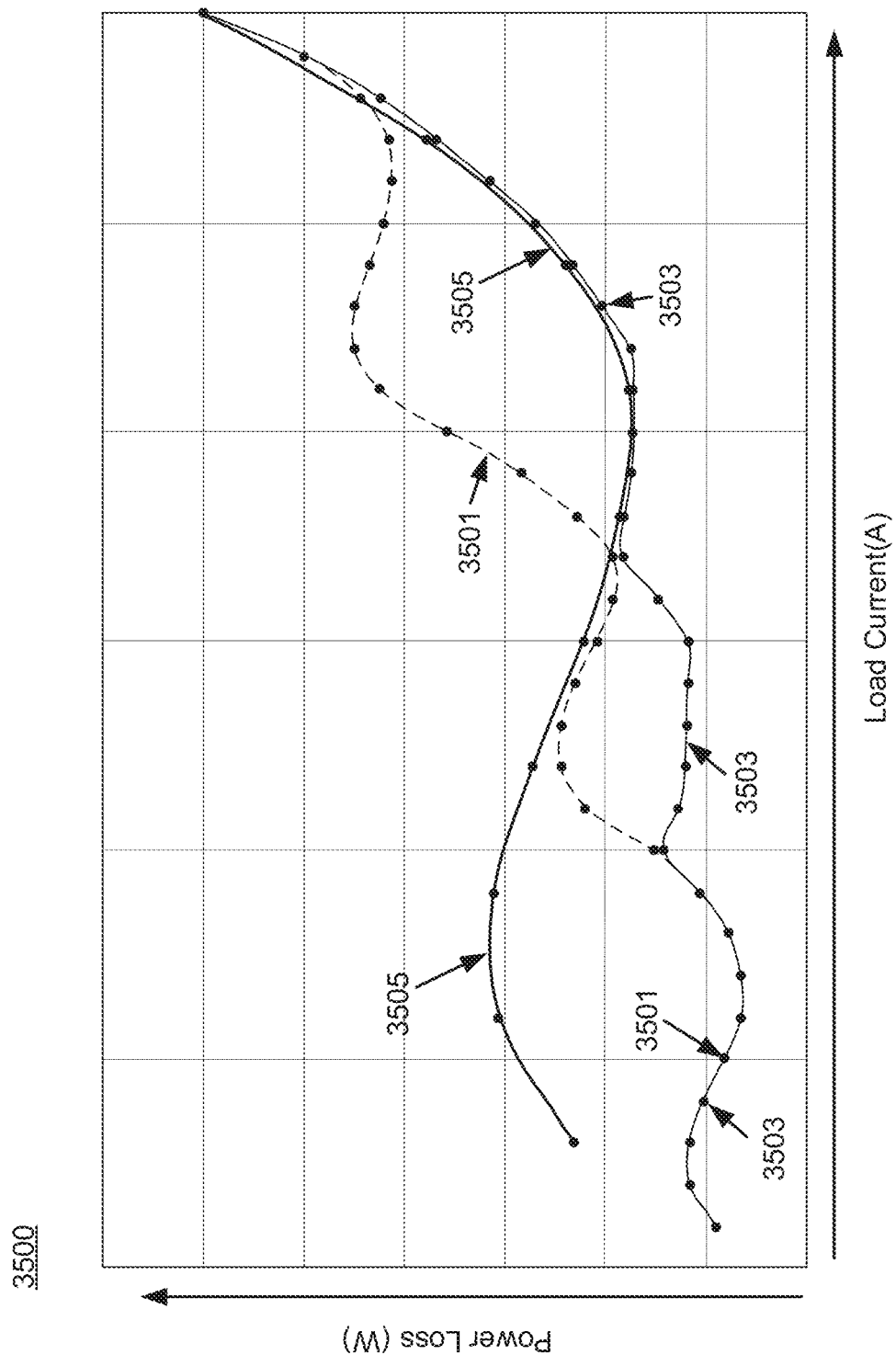
FIG. 35 illustrates a graph depicting composite power loss as a function of load current according to an aspect.

FIG. 35 illustrates a graph 3500 depicting composite power loss as a function of load current according to an aspect. Although some parts of the description of FIG. 35 is explained with reference to the power supply system 2500 of FIG. 25, the description may be applicable to any of the power supply system discussed herein. The graph 3500 includes composite power efficiency curves for the MEC approach, the OS approach, and the ES approach.

The graph 3500 includes a line 3501 depicting a composite efficiency curve as a function of the load current for the MEC approach. The line 3501 depicts the composite efficiency curve in terms of power loss (W) (e.g., a combination of the power loss from the three power converters) across increasing values of the load current when the system performance controller 2508 executes the MEC approach. The graph 3500 includes a line 3503 depicting a composite efficiency curve as a function of the load current for the OS approach. The line 3503 depicts the composite efficiency curve in terms of power loss (W) across increasing values of the load current when the system performance controller 2508 executes the OS approach. The graph 3500 includes a line 3505 depicting a composite efficiency curve as a function of the load current for the ES approach. The line 3505 depicts the composite efficiency curve in terms of power loss (W) across increasing values of the load current when the system performance controller 2508 executes the ES approach.

In some example, as shown in FIG. 35, the MEC approach may be desirable at lighter loads (e.g., one power converter delivering power) and the ES approach may be desirable at heavier loads (e.g., all power converters delivering power). In some examples, the OS approach is desirable since the OS approach may result in the most optimal composite efficiency for lighter loads and heavier loads. Also, the graph 3500 of FIG. 35 may demonstrate that a composite MEC/ES approach is desirable, where the power supply system may deliver all power starting with the most efficient converter, specifically for each required load, until the first one reaches its maximum power, then delivers power with equal sharing between most efficient converters, specifically for each required load (e.g., line 3501 at lighter loads, followed by line 3505 at higher loads).

Figure 36:
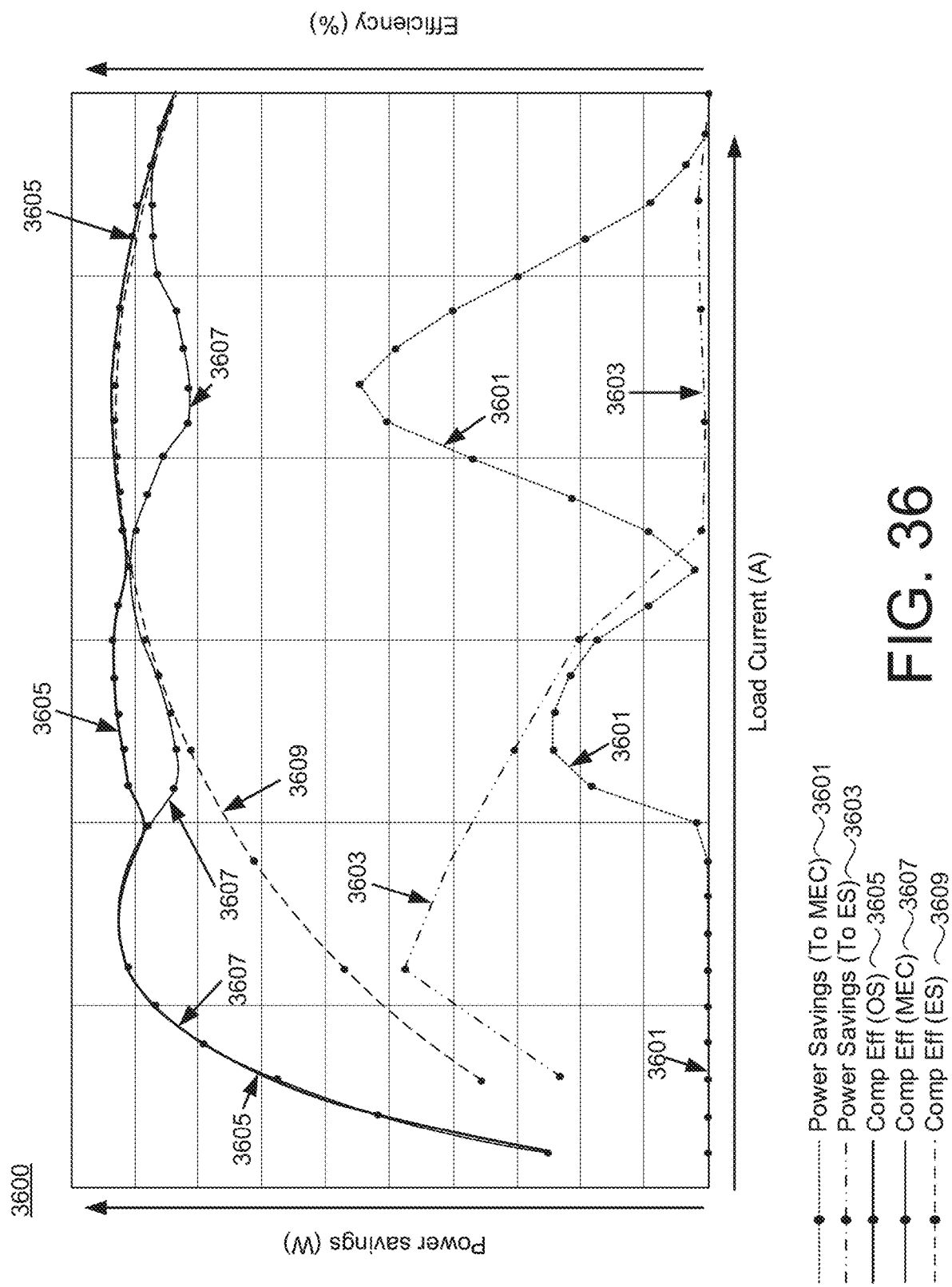
FIG. 36 illustrates a graph depicting composite power savings and efficiency as a function of load current according to an aspect.

FIG. 36 illustrates a graph 3600 depicting composite power savings and efficiency as a function of load current according to an aspect. For example, the graph 3600 depicts the composite power saving and efficiency for three power converters. The graph 3600 includes a line 3601 representing the power savings (in terms of Watts) to the MEC approach across increasing values of the load current. For example, the line 3601 may represent the amount of power savings when the OS approach is used as compared to when the MEC approach is used. As shown by line 3601, the power savings are relatively high at higher loads but relatively low at lower loads. The graph 3600 includes a line 3603 representing the power saving to the ES approach across increasing values of the load current. For example, the line 3603 may represent the amount of power savings when the OS approach is used as compared to when the ES approach is used. As shown by line 3603, the power savings are relatively high at lower loads but relatively low at higher loads. The graph 3600 includes a line 3605 depicting the composite efficiency (in terms of percentage) across increasing values of the load current for the OS approach, a line 3607 depicting the composite efficiency (in terms of percentage) across increasing values of the load current for the MEC approach, and a line 3609 depicting the composite efficiency (in terms of percentage across increasing values of the load current for the ES approach.

Figure 37:
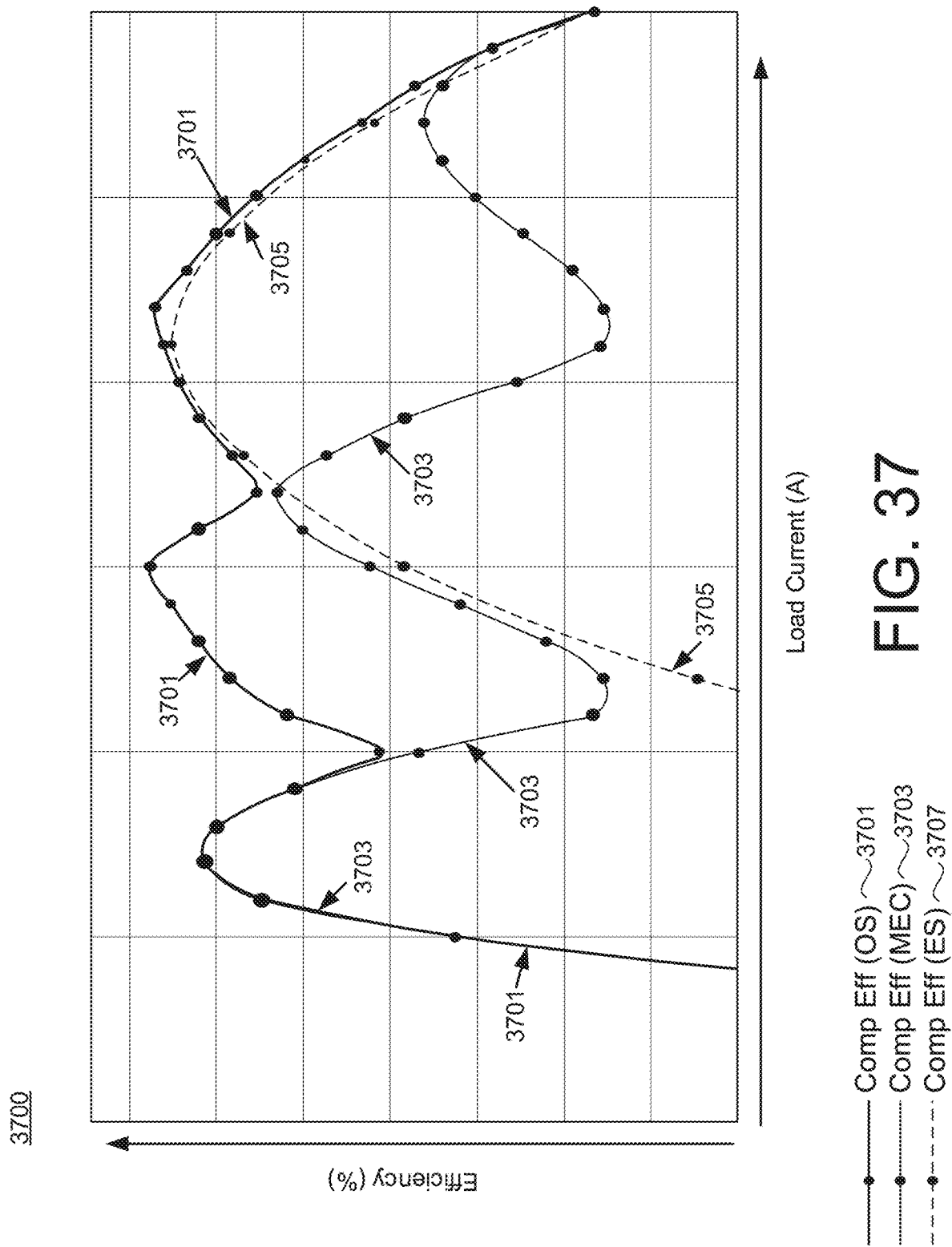
FIG. 37 illustrates a graph depicting composite power loss as a function of load current according to an aspect.

FIG. 37 illustrates a graph 3700 depicting composite power loss as a function of load current according to an aspect. For example, the graph 3700 depicts a more detailed view of the composite power loss in terms of efficiency percentage over increasing values of the load current. Although some parts of the description of FIG. 37 is explained with reference to the power supply system 2500 of FIG. 25, the description may be applicable to any of the power supply system discussed herein. The graph 3700 includes composite power efficiency curves for the MEC approach, the OS approach, and the ES approach. The graph 3700 includes a line 3701 depicting a composite efficiency curve as a function of the load current for the MEC approach. The line 3701 depicts the composite efficiency curve in terms of efficiency percentage across increasing values of the load current when the system performance controller 2508 executes the MEC approach. The graph 3700 includes a line 3703 depicting a composite efficiency curve as a function of the load current for the OS approach. The line 3703 depicts the composite efficiency curve in terms of efficiency percentage across increasing values of the load current when the system performance controller 2508 executes the OS approach. The graph 3700 includes a line 3705 depicting a composite efficiency curve as a function of the load current for the ES approach. The line 3705 depicts the composite efficiency curve in terms of efficiency percentage across increasing values of the load current when the system performance controller 2508 executes the ES approach.

Figure 38:
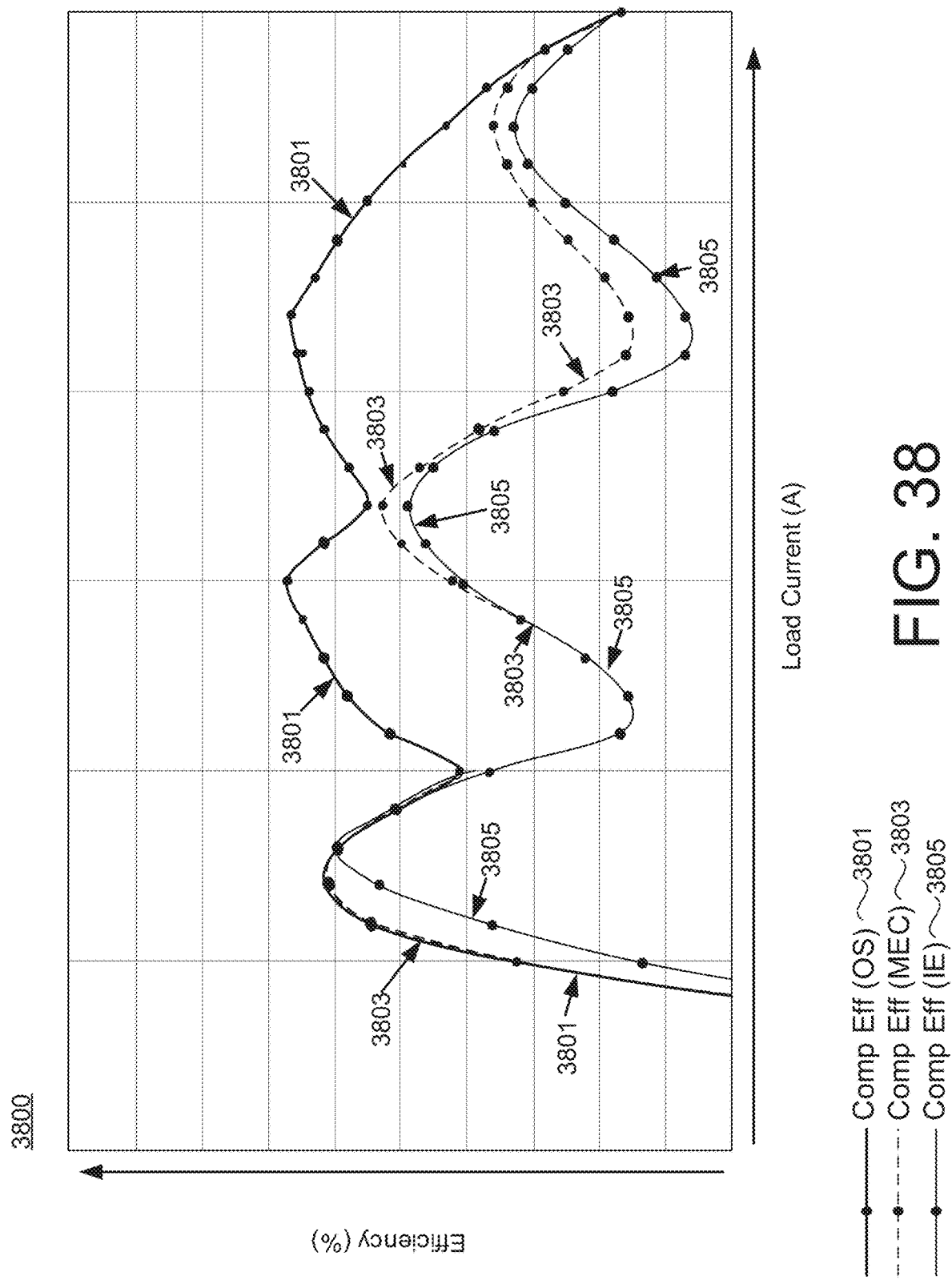
FIG. 38 illustrates a graph depicting composite power loss as a function of load current according to an aspect.

FIG. 38 illustrates a graph 3800 depicting composite power loss as a function of load current according to an aspect. For example, the graph 3800 depicts the composite power loss in terms of efficiency percentage over increasing values of the load current for the OS approach, the MEC approach, and the integral efficiency (IE) approach. Although some parts of the description of FIG. 38 is explained with reference to the power supply system 2500 of FIG. 25, the description may be applicable to any of the power supply system discussed herein. The graph 3800 includes a line 3801 depicting a composite efficiency curve as a function of the load current for the OS approach. The line 3801 depicts the composite efficiency curve in terms of efficiency percentage across increasing values of the load current when the system performance controller 2508 executes the OS approach. The graph 3800 includes a line 3803 depicting a composite efficiency curve as a function of the load current for the MEC approach. The line 3803 depicts the composite efficiency curve in terms of efficiency percentage across increasing values of the load current when the system performance controller 2508 executes the MEC approach. The graph 3800 includes a line 3805 depicting a composite efficiency curve as a function of the load current for the IE approach. The line 3805 depicts the composite efficiency curve in terms of efficiency percentage across increasing values of the load current when the system performance controller 2508 executes the IE approach.

In some examples, the IE approach is similar (e.g., substantially the same) as the MEC approach, but may decrease (or eliminate) the amount of transitions into and out of standby mode. For example, MEC approach may indicate that the power converter intended to deliver no power to the load would be placed in a standby mode (e.g., connected to the input and consuming only enough power to be ready to respond to commands to deliver power). In some examples, the load requirement is dynamic (e.g., not static) and the power converters would need to respond accordingly.

In some examples, according to the IE approach, the system performance controller 2508 may calculate the total efficiency over the full load range (e.g., integral efficiency) for each separate power converter and to use the least integrally efficient power stage "last" (i.e., delivering power "last" or only when use would not cause standby transitions with the next least integrally efficient stage over the last 2 full range load steps. In some examples, to consider the dynamic nature of loads, the system performance controller 2508 may allocate power among the power converters in discrete ranges (e.g., as opposed to continuously over the load range) in combination with reallocation after load stabilization within these ranges.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. Various implementations of the systems and techniques described here can be realized as and/or generally be referred to herein as a circuit, a module, a block, or a system that can combine software and hardware aspects. For example, a module may include the functions/acts/computer program instructions executing on a processor (e.g., a processor formed on a silicon substrate, a GaAs substrate, and the like) or some other programmable data processing apparatus.

Some of the above example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed above, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term and/or includes any and all combinations of one or more of the associated listed items.

The terminology used herein is for the purpose of describing particular embodiments only and is not intended to be limiting of example embodiments. As used herein, the singular forms a, an, and the are intended to include the plural forms as well, unless the context clearly indicates otherwise. It will be further understood that the terms comprises, comprising, includes and/or including, when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the above example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as processing or computing or calculating or determining of displaying or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the example embodiments are typically encoded on some form of non-transitory program storage medium or implemented over some type of transmission medium. The program storage medium may be magnetic (e.g., a floppy disk or a hard drive) or optical (e.g., a compact disk read only memory, or CD ROM), and may be read only or random access. Similarly, the transmission medium may be twisted wire pairs, coaxial cable, optical fiber, or some other suitable transmission medium known to the art. The example embodiments not limited by these aspects of any given implementation.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. A power supply system comprising:
  a plurality of power converters configured to deliver a system load current to a load, the system load current being a combination of individual load currents provided by the plurality of power converters; and
  a system performance controller configured to detect a value of the system load current, the system performance controller configured to determine, using power loss information, values for the individual load currents such that a composite efficiency achieves a threshold condition, the system performance controller configured to generate control signals to operate the plurality of power converters at the determined values, the composite efficiency including a combination of power losses from the plurality of power converters, the power loss information including a plurality of load current combinations over a range of system load current values.

2. The power supply system of claim 1, wherein the system performance controller is configured to periodically update the power loss information by monitoring input and output conditions of the plurality of power converters and computing the composite efficiency based on the input and output conditions.

3. The power supply system of claim 1, wherein each load current combination is associated with a corresponding composite efficiency, each load current combination providing a separate combination of values for the individual load currents.

4. The power supply system of claim 1, wherein the system performance controller is configured to select a load current combination from the plurality of load current combinations that provides a highest composite efficiency.

5. The power supply system of claim 1, wherein, in response to a triggering event, the system performance controller is configured to determine, using the power loss information, new values for the individual load currents such that the composite efficiency achieves the threshold condition.

6. The power supply system of claim 1, wherein the system performance controller is configured to determine a most efficient power converter among the plurality of power converters based on the power loss information, the system performance controller configured to set a value for an individual load current of the most efficient power converter up to a maximum individual value provided by the most efficient power converter and allocate any remaining amount to a next most efficient converter.

7. The power supply system of claim 1, wherein the system performance controller is configured to generate or update the power loss information in response to a triggering event, the system performance controller including:
a control manipulation module configured to iteratively modify at least one of the values of the individual load currents; and
an efficiency computation circuit configured to compute, at each iteration, the composite efficiency based on measured input and output conditions,
the control manipulation module configured to store, at each iteration, the values of the individual load currents and a corresponding composite efficiency.

8. The power supply system of claim 7, wherein the control manipulation module is configured to execute an artificial intelligence (AI) algorithm using a neural network, the control manipulation module configured to apply the power loss information to the neural network to predict at least one of the values of the individual load currents for a next iteration.

9. The power supply system of claim 1, wherein the system performance controller is configured to set a value for an individual load current of a first power converter of the plurality of power converters at the detected value of the system load current and control a second power converter of the plurality of power converters to operate in a standby mode.

10. The power supply system of claim 1, wherein the system performance controller is configured to determine the values for the individual load currents according to a most efficient converter (MEC) approach in response to the system load current being detected as equal to or less than a maximum load current of at least one of the plurality of power converters.

11. The power supply system of claim 10, wherein the system performance controller is configured to determine the values for the individual load currents according to an equal sharing approach in response to the system load current being detected as greater than the maximum load current of at least one of the plurality of power converters.

12. The power supply system of claim 1, wherein the system performance controller is configured to re-compute or update the power loss information in response to a triggering event, the triggering event including activation of one or more of the plurality of power converters, detection of a change in one or more measured conditions, detection of the composite efficiency not being maximized, or expiration of a timer.

13. The power supply system of claim 1, further comprising:
a power supply device including the plurality of power converters, the system performance controller, and a metering circuit.

14. The power supply system of claim 1, wherein the plurality of power converters include a first power converter configured to deliver a first load current, and a second power converter configured to deliver a second load current.

15. The power supply system of claim 14, wherein the system performance controller is configured to:
calculate a first integral value of a composite efficiency curve over a load range for the first power converter;
calculate a second integral value of a composite efficiency curve over a load range for the second power converter; and
determine values for the first load current and the second load current based on the first integral value and the second integral value.

16. The power supply system of claim 15, wherein the system performance controller is configured to:
determine that the first integral value provides a value for the composite efficiency greater than the second integral value; and
selecting the first power converter to provide power up to a maximum current threshold provided by the first power converter.

17. The power supply system of claim 16, wherein the system performance controller is configured to:
determine that the system load current is greater than the maximum current threshold provided by the first power converter; and
select the second power converter to provide power up to a maximum current threshold provided by the second power converter.

18. A method of controlling a plurality of power converters using composite efficiency, the method comprising:
delivering, by a power supply system, a system load current to a load, the system load current being a combination of individual load currents provided by a plurality of power converters; and
detecting, by a system performance controller, a value of the system load current;
determining, using power loss information, values for the individual load currents such that a composite efficiency achieves a threshold condition, the composite efficiency including a combination of power losses from the plurality of power converters, the power loss information including a plurality of load current combinations over a range of system load current values; and
generating control signals to operate the plurality of power converters at the determined values.

19. The method of claim 18, each load current combination is associated with a corresponding composite efficiency, each load current combination providing a separate combination of values for the individual load currents, the method further comprising:
  selecting a load current combination from the plurality of load current combinations that provides a highest composite efficiency.

20. The method of claim 18, further comprising:
  detecting a change to the value of the system load current; and
  determining, using the power loss information, new values for the individual load currents such that the composite efficiency achieves the threshold condition.

21. The method of claim 18, further comprising:
  updating the power loss information in response to a triggering event, the triggering event including activation of one or more of the plurality of power converters, detection of a change in one or more measured input or output conditions, detection of the composite efficiency not achieving the threshold condition, or expiration of a timer, the updating including:
    iteratively modifying at least one of the values of the individual load currents;
    computing, at each iteration, the composite efficiency based on the one or more measured input or output conditions; and
    storing, at each iteration, the values of the individual load currents and a corresponding composite efficiency.

* * * * *